US012622120B2

(12) United States Patent
     Kim et al.

(10) Patent No.: US 12,622,120 B2
(45) Date of Patent: May 5, 2026

(54) DISPLAY DEVICE

(71) Applicant: Samsung Display Co., LTD., Yongin-si (KR)

(72) Inventors: Hyun Kim, Yongin-si (KR); Jeong Su Park, Yongin-si (KR); Jong Chan Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 561 days.

(21) Appl. No.: 17/696,051

(22) Filed: Mar. 16, 2022

(65) Prior Publication Data

US 2022/0399398 A1     Dec. 15, 2022

(30) Foreign Application Priority Data

Jun. 9, 2021     (KR) ........................ 10-2021-0074954
Aug. 9, 2021     (KR) ........................ 10-2021-0104716

(51) Int. Cl.
     *H10H 29/14* (2025.01)
     *H10H 20/01* (2025.01)
     (Continued)

(52) U.S. Cl.
     CPC .......... *H10H 29/142* (2025.01); *H10H 20/01* (2025.01); *H10H 20/821* (2025.01);
     (Continued)

(58) Field of Classification Search
     USPC ....................................................... 257/89
     See application file for complete search history.

(56) References Cited

U.S. PATENT DOCUMENTS 10,943,947 B2     3/2021     Im et al.
11,552,063 B2     1/2023     Kim et al.
                  (Continued)

FOREIGN PATENT DOCUMENTS

KR     10-2019-0121894     10/2019
KR     10-2020-0006209     1/2020
                  (Continued)

OTHER PUBLICATIONS

International Search Report corresponding to International Application No. PCT/KR2022/008025 dated Sep. 15, 2022.

*Primary Examiner* — Duy T Nguyen
*Assistant Examiner* — Jiyoung Oh
(74) *Attorney, Agent, or Firm* — Womble Bond Dickinson (US) LLP

(57)     ABSTRACT

A display device may include pixels disposed on a substrate, each of the pixels including a via layer disposed on the substrate and formed of an organic layer; first and second alignment electrodes disposed on the via layer; a first insulating layer disposed on the first and second alignment electrodes; a first bank pattern disposed on the first insulating layer on the first alignment electrode, and a second bank pattern disposed on the first insulating layer on the second alignment electrode; a second insulating layer disposed on the first and second bank patterns and the first insulating layer; at least one light emitting element disposed on the second insulating layer; a first electrode electrically connected to the light emitting element and the first alignment electrode; and a second electrode electrically connected to the light emitting element and the second alignment electrode. The first insulating layer may include an organic layer.

21 Claims, 29 Drawing Sheets

(51) Int. Cl.

| | | |
|---|---|---|
| *H10H 20/821* | (2025.01) | |
| *H10H 20/831* | (2025.01) | |
| *H10H 20/84* | (2025.01) | |
| *H10H 20/851* | (2025.01) | |
| *H10H 20/855* | (2025.01) | |

(52) U.S. Cl.
CPC .......... *H10H 20/831* (2025.01); *H10H 20/84* (2025.01); *H10H 20/851* (2025.01); *H10H 20/855* (2025.01); *H10H 20/032* (2025.01)

(56) References Cited

U.S. PATENT DOCUMENTS

| | | | |
|---|---|---|---|
| 2018/0233536 A1 | 8/2018 | Chang | |
| 2019/0326348 A1* | 10/2019 | Im | G09G 3/32 |
| 2021/0305222 A1 | 9/2021 | Min et al. | |
| 2021/0391380 A1* | 12/2021 | Li | H10H 20/8506 |
| 2022/0069003 A1 | 3/2022 | Lee et al. | |
| 2022/0077356 A1* | 3/2022 | Do | H10H 29/8512 |
| 2022/0115470 A1* | 4/2022 | Kim | H10K 71/00 |
| 2022/0262984 A1 | 8/2022 | Choi et al. | |

FOREIGN PATENT DOCUMENTS

| | | |
|---|---|---|
| KR | 10-2020-0021966 | 3/2020 |
| KR | 10-2020-0034896 | 4/2020 |
| KR | 10-2020-0041429 | 4/2020 |
| KR | 10-2020-0085977 | 7/2020 |
| KR | 10-2020-0130606 | 11/2020 |
| KR | 10-2021-0057891 A | 5/2021 |

* cited by examiner

DR3

ORS { VIA, INS1, BNKP1, BNKP2 }    T2(T) { DE, GE, ACT, SE }

FIG. 14

COMPARATIVE EXAMPLE 1

COMPARATIVE EXAMPLE 2

COMPARATIVE EXAMPLE 3

EMBODIMENT

DISPLAY DEVICE

CROSS-REFERENCE TO RELATED APPLICATION(S)

The application claims priority to and the benefit of Korean Patent Application No. 10-2021-0074954 filed on Jun. 9, 2021, and Korean Patent Application No. 10-2021-0104716 filed on Aug. 9, 2021, in the Korean Intellectual Property Office, the entire contents of which are incorporated herein by reference.

BACKGROUND

1. Technical Field

Various embodiments of the disclosure relate to a display device and a method of fabricating or manufacturing the display device.

2. Description of Related Art

Recently, as interest in information display increases, research and development on display devices have been continuously conducted.

SUMMARY

Various embodiments of the disclosure are directed to a display device having improved reliability, and a method of fabricating the display device.

Furthermore, various embodiments of the disclosure are directed to a display device and a method of fabricating the display device, in which an insulating layer formed of an organic layer is disposed on alignment electrodes so that failure may be mitigated from occurring due to a step difference between the alignment electrodes.

An embodiment of the disclosure may provide a display device including a plurality of pixels disposed on a substrate. Each of the plurality of pixels may include a via layer disposed on the substrate and formed of an organic layer; first and second alignment electrodes disposed on the via layer and spaced apart from each other; a first insulating layer disposed on the first and the second alignment electrodes, overlapping the first and the second alignment electrodes in a plan view, and having a planar surface; a first bank pattern disposed on the first insulating layer on the first alignment electrode; a second bank pattern disposed on the first insulating layer on the second alignment electrode; a second insulating layer disposed on the first and the second bank patterns and the first insulating layer between the first and the second bank patterns; at least one light emitting element disposed on the second insulating layer between the first bank pattern and the second bank pattern; a first electrode disposed on the first bank pattern, and electrically connected to a first end of the at least one light emitting element and the first alignment electrode; and a second electrode disposed on the second bank pattern, and electrically connected to a second end of the at least one light emitting element and the second alignment electrode.

In an embodiment, the first insulating layer may include an organic layer.

In an embodiment, the first insulating layer and the second insulating layer may be formed of different materials.

The second insulating layer may include an inorganic layer.

In an embodiment, each of the plurality of pixels may include an emission area in which the at least one light emitting element is disposed, a non-emission area disposed adjacent to the emission area; and a bank disposed on the first insulating layer in the non-emission area, and including a first opening corresponding to the emission area; a second opening spaced apart from the first opening; and comprising an organic layer.

In an embodiment, each of the first and the second bank patterns may include an organic layer. The via layer, the first insulating layer, the first and the second bank patterns, and the bank may be connected to each other.

In an embodiment, the second insulating layer may partially overlap the bank in a plan view.

In an embodiment, in the non-emission area, the bank may be disposed directly on the first insulating layer.

In an embodiment, the second insulating layer may correspond to the first opening of the bank.

In an embodiment, an end of the second insulating layer may contact a sidewall of the bank.

In an embodiment, in a cross-sectional view, a first end of the second insulating layer may be disposed between a first sidewall of the bank and the first bank pattern, and a second end of the second insulating layer may be disposed between a second sidewall of the bank and the second bank pattern.

In an embodiment, the second insulating layer may not completely overlap the bank in a plan view.

In an embodiment, the first electrode and the second electrode may be disposed on different layers.

In an embodiment, each of the plurality of pixels may include a third insulating layer disposed on the at least one light emitting element and exposing the first end and the second end of the at least one light emitting element; a fourth insulating layer disposed on the first electrode and comprising an inorganic layer; and a fifth insulating layer disposed on overall surfaces of the fourth insulating layer and the second electrode, and comprising an inorganic layer.

In an embodiment, the first electrode and the second electrode may be disposed on a same layer.

In an embodiment, the first insulating layer may include a first contact hole through which a portion of the first alignment electrode is exposed, and a second contact hole through which a portion of the second alignment electrode is exposed. The first electrode may be electrically connected with the first alignment electrode through the first contact hole. The second electrode may be electrically connected with the second alignment electrode through the second contact hole.

In an embodiment, the first and the second contact holes may be located in the non-emission area.

In an embodiment, each of the plurality of pixels may include a light conversion pattern disposed on the fifth insulating layer and corresponding to the emission area; and a light block pattern disposed on the fifth insulating layer and corresponding to the non-emission area.

In an embodiment, each of the plurality of pixels may include at least one transistor disposed between the substrate and the via layer and electrically connected to the at least one light emitting element.

In an embodiment, a ratio of a thickness of the first and the second alignment electrodes and a thickness of the first insulating layer may be 1:3 or greater.

An embodiment of the disclosure may provide a display device including a plurality of pixels disposed on a substrate, and each including an emission area and a non-emission area. Each of the plurality of pixels may include a via layer disposed on the substrate and formed of an organic layer;

first and second alignment electrodes disposed on the via layer and spaced apart from each other, and each having a first thickness; a first insulating layer disposed on the first and the second alignment electrodes, overlapping the first and the second alignment electrodes in a plan view, formed of an organic layer, and having a second thickness different from the first thickness; a first bank pattern disposed on the first insulating layer on the first alignment electrode; a second bank pattern disposed on the first insulating layer on the second alignment electrode; a bank disposed on the first insulating layer in the non-emission area; a second insulating layer disposed on the first and the second bank patterns and the first insulating layer between the first and the second bank patterns, and formed of an inorganic layer; and at least one light emitting element disposed on the second insulating layer in the emission area.

In an embodiment, a ratio of the first thickness and the second thickness is 1:3 or greater.

An embodiment of the disclosure may provide a method of fabricating a display device, including forming, on a substrate, at least one pixel including an emission area and a non-emission area.

In an embodiment, the forming of the at least one pixel may include forming at least one transistor on the substrate; forming a via layer on the at least one transistor; forming, on the via layer, a first alignment electrode and a second alignment electrode spaced apart from each other; forming a first insulating layer having a planar surface on the first and the second alignment electrodes; forming, on the first insulating layer, a first bank pattern and a second bank pattern spaced apart from each other and corresponding to the emission area; forming, on the first insulating layer, a bank corresponding to the non-emission area; forming a second insulating layer on the first and the second bank patterns and the first insulating layer between the first and the second bank patterns; aligning at least one light emitting element on the second insulating layer between the first bank pattern and the second bank pattern; forming, on the first bank pattern, a first electrode electrically connected to each of a first end of the light emitting element and the first alignment electrode; and forming, on the second bank pattern, a second electrode electrically connected to each of a second end of the light emitting element and the second alignment electrode.

In an embodiment, the via layer, the first insulating layer, the first and the second bank patterns, and the bank each comprise an organic layer, and the second insulating layer may include an inorganic layer.

In an embodiment, the second insulating layer may not completely overlap the bank in a plan view. The via layer, the first insulating layer, the first and the second bank patterns, and the bank may be connected to each other.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 14 and 15 are views illustrating results of a simulation of comparing electric field flow rates of comparative example 1, comparative example 2, comparative example 3, and an embodiment.

FIG. 19 is a schematic cross-sectional view taken along line I-I' of FIG. 4.

DETAILED DESCRIPTION OF THE EMBODIMENTS

Figure 1:
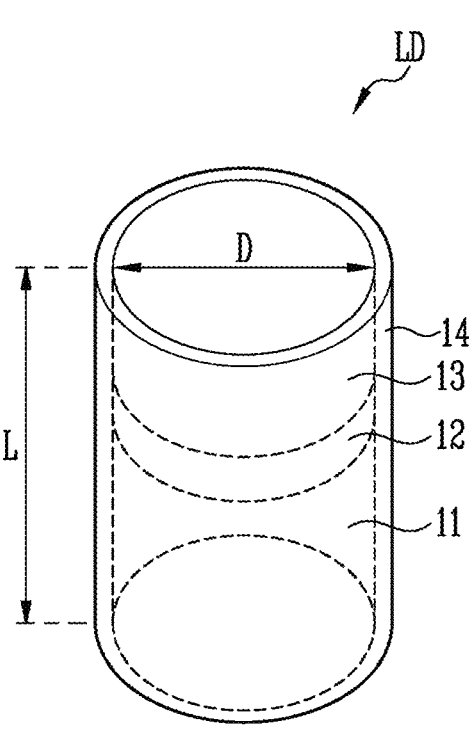
FIGS. 1 and 2 are perspective views schematically illustrating a light emitting element in accordance with an embodiment.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). Furthermore, the term "coupling" or "connection" may comprehensively refer to physical and/or electrical coupling or connection.

Embodiments and required details of the disclosure are described with reference to the accompanying drawings in order to describe the disclosure in detail so that those having ordinary knowledge in the technical field to which the disclosure pertains can easily practice the disclosure. Furthermore, a singular form may include a plural form as long as it is not specifically mentioned in a sentence.

The terms "about" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
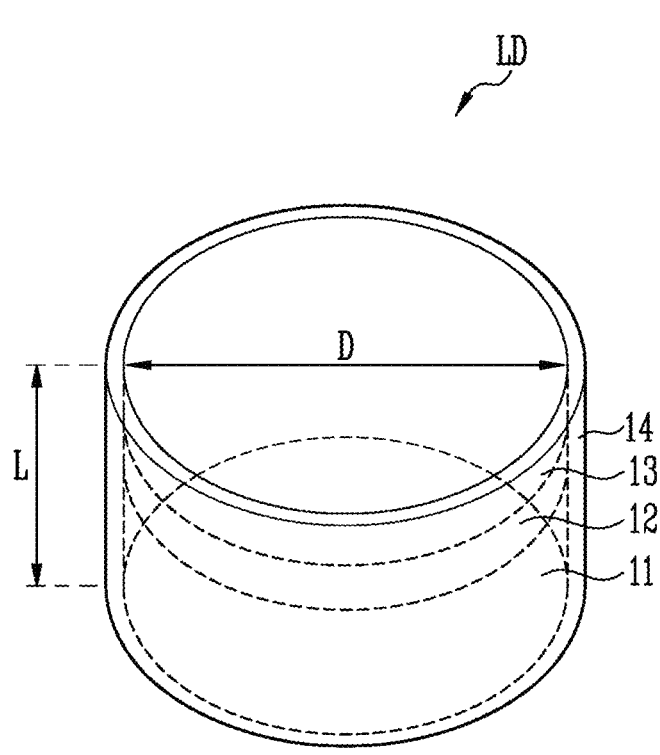
Figure 3:
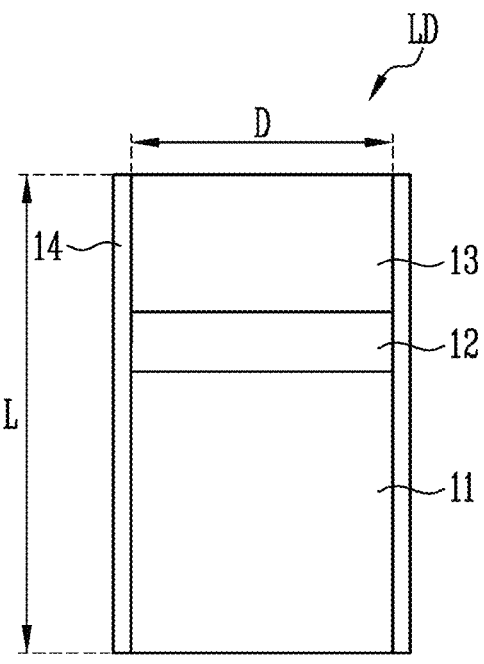
FIG. 3 is a cross-sectional view schematically illustrating the light emitting element of FIG. 1.

FIGS. 1 and 2 are perspective views schematically illustrating a light emitting element LD in accordance with an embodiment. FIG. 3 is a schematic cross-sectional view illustrating the light emitting element LD of FIG. 1.

In an embodiment, the type and/or shape of the light emitting element LD is not limited to the embodiments illustrated in FIGS. 1 to 3.

Referring to FIGS. 1 to 3, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stacked pattern") formed by successively stacking the first semiconductor layer 11, the active layer 12, and the second semiconductor layer 13.

The light emitting element LD may be formed to extend in a direction. If the direction in which the light emitting element LD extends is defined as a longitudinal direction, the light emitting element LD may have one end (or a lower end or first end) and a remaining end (or an upper end or second end) in the longitudinal direction. One of the first and second semiconductor layers 11 and 13 may be disposed on the first end of the light emitting element LD, and the other of the first and second semiconductor layers 11 and 13 may be disposed on the second end of the light emitting element LD. For example, the first semiconductor layer 11 may be disposed on the first end of the light emitting element LD, and the second semiconductor layer 13 may be disposed on the second end of the light emitting element LD.

The light emitting element LD may have various shapes. For example, as illustrated in FIG. 1, the light emitting element LD may have a rod-like shape, a bar-like shape, or a pillar-like shape (e.g., a cylindrical shape) which is long (for example, to have an aspect ratio greater than 1) in the longitudinal direction (or an extension direction). In an embodiment, a length L of the light emitting element LD in the longitudinal direction may be greater than a diameter D (or a width of a cross-section) thereof. However, the disclosure is not limited thereto. In an embodiment, as illustrated in FIG. 2, the light emitting element LD may have a rod-like shape, a bar-like shape, or a pillar-like shape which is short in the longitudinal direction (for example, to have an aspect ratio less than 1). In an embodiment, the light emitting element LD may have a rod-like shape, a bar-like shape, or a pillar-like shape in which the length L and the diameter D thereof are the same as each other.

The light emitting element LD may include a light-emitting diode (LED) fabricated to have a subminiature size, e.g., with a diameter D and/or a length L corresponding to the micrometer scale or the nanometer scale.

In case that the light emitting element LD is long (for example, to have an aspect ratio greater than 1) in the longitudinal direction, the diameter D of the light emitting element LD may range from about 0.5 µm to about 6 µm, and the length L thereof may range from about 1 µm to about 10 µm. However, the diameter D and length L of the light emitting element LD are not limited thereto. The size of the light emitting element LD may be changed to meet conditions (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes at least one semiconductor material of InAlGaN, GaN, AlGaN, InGaN, AlN, and InN and is doped with a first conductive dopant (or an n-type dopant) such as Si, Ge, or Sn. However, the material of the first semiconductor layer 11 is not limited thereto, and the first semiconductor layer 11 may be formed of various other materials. The first semiconductor layer 11 may include, in the longitudinal direction of the light emitting element LD, an upper surface that contacts the active layer 12, and a lower surface exposed to the outside. The lower surface of the first semiconductor layer 11 may correspond to the first end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer (not shown), a stain reinforcing layer, and a well layer which are provided as a part. The stain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from about 400 nm to about 900 nm and use a double heterostructure. In an embodiment, a clad layer (not illustrated) doped with a conductive dopant may be formed over or under the active layer 12 in the longitudinal direction of the light emitting element LD. For example, the cladding layer may be formed of an AlGaN layer or an InAlGaN layer. In an embodiment, material such as AlGaN or InAl-GaN may be used to form the active layer 12, and various other materials may be used to form the active layer 12. The active layer 12 may include a first surface which contacts the first semiconductor layer 11, and a second surface which contacts the second semiconductor layer 13.

If an electric field having a predetermined voltage or more is applied to the opposite ends of the light emitting element LD, the light emitting element LD may emit light by coupling or combining of electron-hole pairs in the active layer 12. Since light emission of the light emitting element LD can be controlled based on the foregoing principle, the light emitting element LD may be used as a light source (a light emitting source) of various light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes at least one semiconductor material of InAlGaN, GaN, AlGaN, InGaN, AlN, and InN and is doped with a second conductive dopant (or a p-type dopant) such as Mg, Zn, Ca, Sr, or Ba. However, the material for forming the second semiconductor layer 13 is not limited thereto, and the second semiconductor layer 13 may be formed of various other materials. The second semiconductor layer 13 may include, in the longitudinal direction of the light emitting element LD, a lower surface that contacts the second surface of the active layer 12, and an upper surface exposed to the outside. The upper surface of the second semiconductor layer 13 may correspond to the second end (or the upper end) of the light emitting element LD.

In an embodiment, the first semiconductor layer 11 and the second semiconductor layer 13 may have different thicknesses in the longitudinal direction of the light emitting element LD. For example, the first semiconductor layer 11 may have a thickness greater than that of the second semiconductor layer 13 in the longitudinal direction of the light emitting element LD. Hence, the active layer 12 of the light emitting element LD may be disposed to be closer to the upper surface of the second semiconductor layer 13 than to the lower surface of the first semiconductor layer 11.

Although the first semiconductor layer 11 and the second semiconductor layer 13 each is formed of a single layer, the disclosure is not limited thereto. In an embodiment, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer, a lattice structure of which is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the disclosure is not limited thereto.

In an embodiment, the light emitting element LD may further include a contact electrode (not illustrated and here-inafter referred to as "first contact electrode") disposed on the second semiconductor layer 13, as well as including the first semiconductor layer 11, the active layer 12, and the second semiconductor layer 13. Furthermore, in an embodiment, the light emitting element LD may further include another contact electrode (not illustrated and hereinafter referred to as "second contact electrode") disposed on a first end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chromium (Cr), titanium (Ti), aluminum (Al), gold (Au), nickel (Ni), and oxides or alloys thereof, which are used alone or in combination, but the disclosure is not limited thereto. In an embodiment, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). The zinc oxide ($ZnO_x$) may be zinc oxide (ZnO) and/or zinc peroxide ($ZnO_2$).

Materials included in the first and second contact electrodes may be equal to or different from each other. The first and second contact electrodes may be substantially transparent or translucent. Therefore, light generated from the light emitting element LD may pass through the first and second contact electrodes and then be emitted outside the light emitting element LD. In some embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In an embodiment, the light emitting element LD may further include an insulating layer 14 (or an insulating film). However, in some embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with conductive material except the first and second semiconductor layers 13. Furthermore, the insulating layer 14 may minimize a surface defect of the light emitting element LD, thus enhancing the lifespan and emission efficiency of the light emitting element LD. In case that light emitting elements LD are disposed in close contact with each other, the insulating layer 14 may prevent undesired short circuit between the light emitting elements LD. It is not limited whether the insulating layer 14 is provided or not, so long as the active layer 12 can be prevented from short-circuiting with external conductive material.

The insulating layer 14 may be provided to enclose an overall outer circumferential surface of the emission stack including the first semiconductor layer 11, the active layer 12, and the second semiconductor layer 13.

Although in the foregoing embodiment the insulating layer 14 has been described as enclosing the entirety of the respective outer circumferential surfaces of the first semiconductor layer 11, the active layer 12, and the second semiconductor layer 13, the disclosure is not limited thereto. In an embodiment, in case that the light emitting element LD includes the first contact electrode, the insulating layer 14 may enclose the entirety of the respective outer circumferential surfaces of the first semiconductor layer 11, the active layer 12, the second semiconductor layer 13, and the first contact electrode. In an embodiment, the insulating layer 14 may not enclose the entirety of the outer circumferential surface of the first contact electrode, or may enclose only a portion of the outer circumferential surface of the first contact electrode but not enclose another portion of the outer circumferential surface of the first contact electrode. Furthermore, in an embodiment, in case that the first contact electrode is disposed on the second end (or the upper end) of the light emitting element LD and the second contact electrode is disposed on the first end (or the lower end) of the light emitting element LD, the insulating layer 14 may allow at least one area of each of the first and second contact electrodes to be exposed.

The insulating layer 14 may include transparent insulating material. For example, the insulating layer 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating layer 14.

The insulating layer 14 may be provided in the form of a single layer or in the form of multiple layers including a double layer. For example, in case that the insulating layer 14 is formed as a double layer structure including a first insulating layer and a second insulating layer that are successively stacked, the first insulating layer and the second insulating layer may be made of different materials (or substances) and be formed by different processes. In an embodiment, the first insulating layer and the second insulating layer may include the same material and be formed by a successive process.

In an embodiment, the light emitting element LD may be implemented as a light emitting pattern having a core-shell structure. In this case, the first semiconductor layer 11 may be disposed in a core of the light emitting element LD, for example, a central portion of the light emitting element LD. The active layer 12 may be provided and/or formed to enclose the outer circumferential surface of the first semiconductor layer 11. The second semiconductor layer 13 may be provided and/or formed to enclose the active layer 12. Furthermore, the light emitting element LD may further include a contact electrode (not illustrated) formed to enclose at least one side of the second semiconductor layer 13. In an embodiment, the light emitting element LD may further include an insulating layer 14 which is provided on the outer circumferential surface of the light emitting pattern having a core-shell structure and includes a transparent insulating material. The light emitting element LD implemented as the light emitting pattern having the core-shell structure may be manufactured in a growth manner.

The light emitting element LD may be employed as a light emitting source (or referred to as "light source") for various display devices. The light emitting element LD may be fabricated by a surface treatment process. For example, the light emitting element LD may be surface-treated so that, in case that light emitting elements LD are mixed with a fluidic solution (or solvent) and supplied to each pixel area (e.g., an emission area of each pixel or an emission area of each sub-pixel), the light emitting elements LD can be evenly dispersed rather than unevenly aggregating in the solution.

A light emitting part (or a light emitting device) including the light emitting element LD described above may be used in various types of devices including a display device which includes a light source. For instance, in case that light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which includes a light source.

Figure 4:
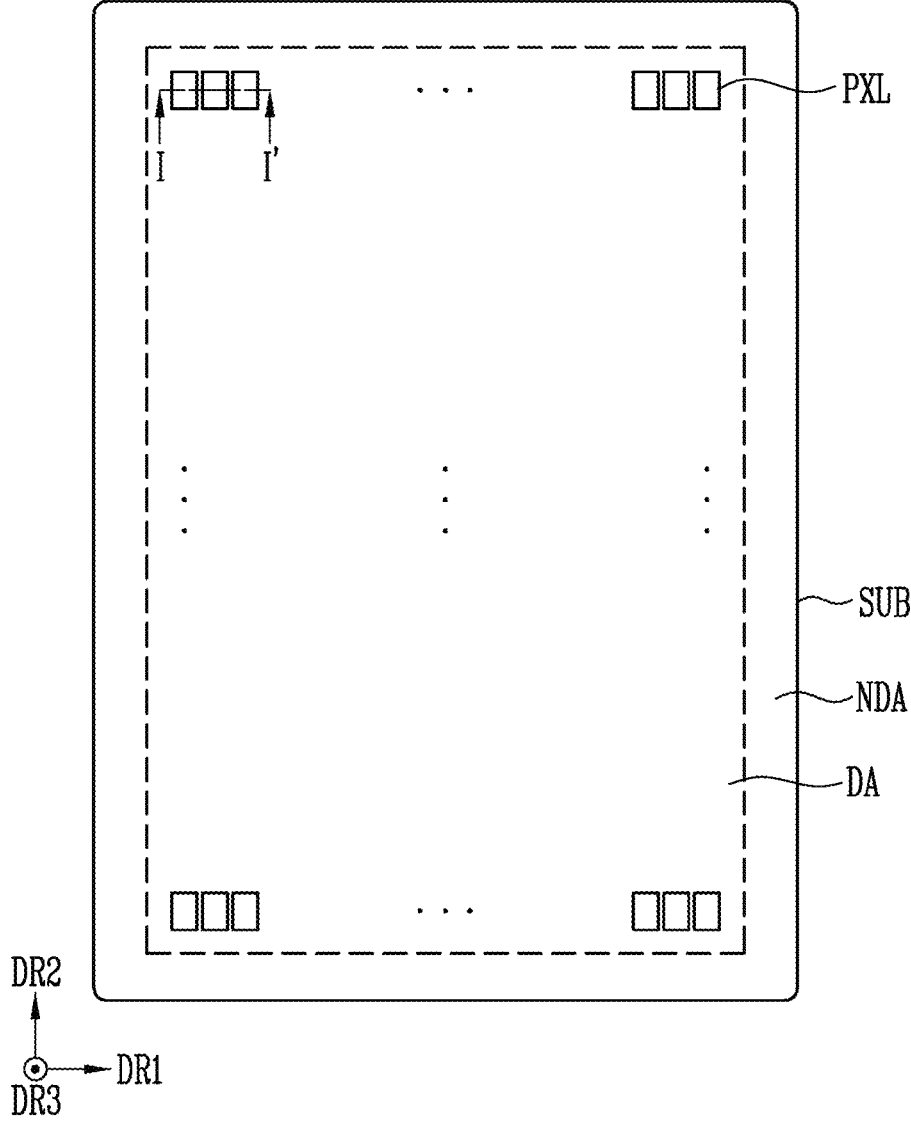
FIG. 4 is a plan view schematically illustrating a display device in accordance with an embodiment.

FIG. 4 is a plan view schematically illustrating a display device in accordance with an embodiment.

For the sake of explanation, FIG. 4 schematically illustrates the structure of the display device, focusing on a display area DA on which an image is displayed.

If the display device is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a personal digital assistant (PDA), a portable multimedia player (PMP), an MP3 player, a medical appliance, a camera, or a wearable device, the disclosure may be applied to the display device.

Referring to FIGS. 1 to 4, the display device may include a substrate SUB, pixels PXL provided on the substrate SUB and each including at least one light emitting element LD, a driver provided on the substrate SUB and configured to drive the pixels PXL, and a line component provided to electrically connect the pixels PXL with the driver.

The display device may be classified into a passive matrix type display device and an active matrix type display device according to a method of driving the light emitting element LD. For example, in case that the display device is implemented as an active matrix type display device, each of the pixels PXL may include a driving transistor configured to control the amount of current to be supplied to the light emitting element LD, and a switching transistor configured to transmit a data signal to the driving transistor.

The display device may be provided in various forms, for example, in the form of a rectangular plate having two pairs of parallel sides, but the disclosure is not limited thereto. In case that the display device is provided in the form of a rectangular plate, one of the two pairs of sides may be longer than the other. For the sake of explanation, there is illustrated the case where the display device has a rectangular shape with a pair of long sides and a pair of short sides. A direction in which the long sides extend is indicated by a second direction DR2, a direction in which the short sides extend is indicated by a first direction DR1, and a thickness-wise direction of the substrate SUB is indicated by a third direction DR3. In the display device provided in a rectangular planar shape, each corner on which a long side and a short side contact (or meet) each other may have a round shape.

The substrate SUB may include a display area DA and a non-display area NDA.

The display area DA may be an area in which the pixels PXL for displaying an image are provided. The non-display area NDA may be an area in which the driver for driving the pixels PXL and some of the line component for coupling the pixels PXL to the driver are provided.

The non-display area NDA may be disposed adjacent to the display area DA. The non-display area NDA may be provided on at least one side of the display area DA. For example, the non-display area NDA may enclose the perimeter (or edges) of the display area DA. The line component electrically connected to the pixels PXL, and the driver electrically connected to the line component to drive the pixels PXL may be provided in the non-display area NDA.

The line component may electrically connect the driver with the pixels PXL. The line component may include a fanout line electrically connected with signal lines, e.g., a scan line, a data line, and an emission control line, which are electrically connected to each pixel PXL to provide signals to the pixel PXL. Furthermore, in an embodiment, the line component may include a fanout line electrically connected to signal lines, e.g., a control line and a sensing line, which are electrically connected to each pixel PXL to compensate in real time for variation in electrical characteristics of the pixel PXL. The line component may include a fanout line electrically connected with power lines which are configured to provide predetermined voltages to the respective pixels PXL and are electrically connected to the respective pixels PXL.

The substrate SUB may include transparent insulating material to allow light transmission. The substrate SUB may be a rigid substrate or a flexible substrate.

An area of the substrate SUB may be provided as the display area DA in which the pixels PXL are disposed, and another area thereof may be provided as the non-display area NDA. For example, the substrate SUB may include a display area DA including pixel areas in which the respective pixels PXL are disposed, and a non-display area NDA disposed around the perimeter of the display area DA (or adjacent to the display area DA).

The pixels PXL may be provided in the display area DA of the substrate SUB. In an embodiment, the pixels PXL may be arranged in the display area DA in a stripe arrangement manner, but the disclosure is not limited thereto.

Each of the pixels PXL may include at least one light emitting element LD configured to be driven in response to a corresponding scan signal and a corresponding data signal. The light emitting element LD may have a small size corresponding to the nanometer scale or the micrometer scale and be electrically connected in parallel to light emitting elements LD disposed adjacent thereto, but the disclosure is not limited thereto. The light emitting element LD may form a light source of each pixel PXL.

Each of the pixels PXL may include at least one light source, e.g., the light emitting element LD illustrated in FIGS. 1 to 3, which is driven by a predetermined signal (e.g., a scan signal and a data signal) and/or a predetermined power supply (e.g., a first driving power supply and a second driving power supply). However, in embodiments of the disclosure, the type of the light emitting element LD which may be used as a light source of each of the pixels PXL is not limited thereto.

The driver may supply a predetermined signal and a predetermined power voltage to each of the pixels PXL through the line component and thus control the operation of the pixel PXL.

12

Figure 5:
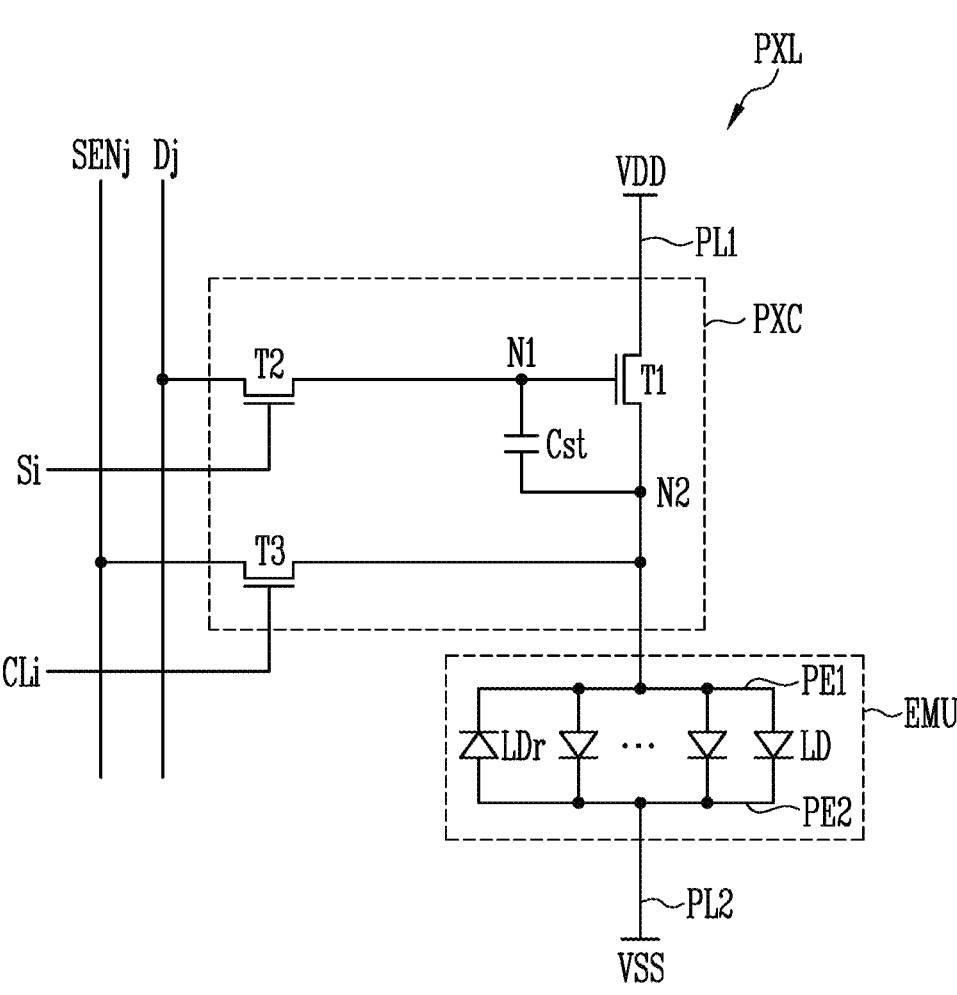
FIGS. 5 and 6 are schematic diagrams of equivalent circuits illustrating various embodiments of electrical connection relationship of components included in each pixel illustrated in FIG. 4.
Figure 6:
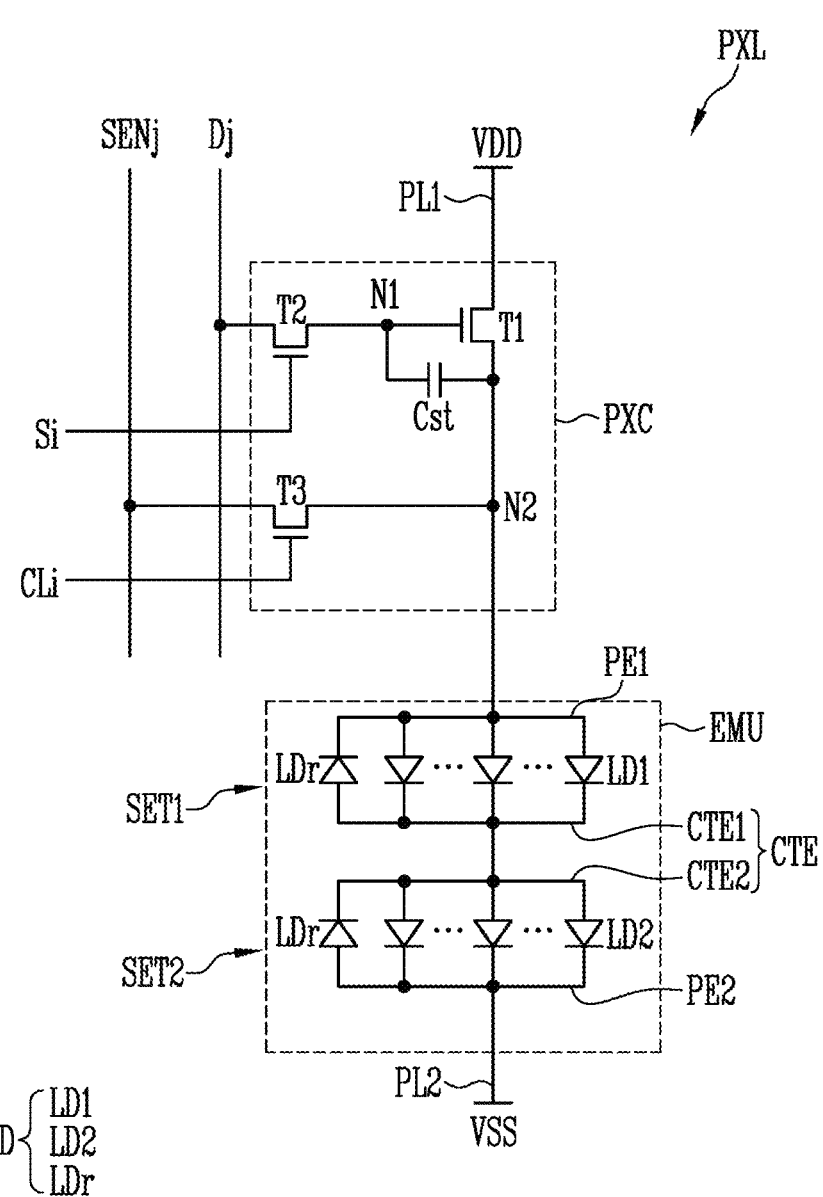

FIGS. 5 and 6 are schematic diagrams of equivalent circuits illustrating various embodiments of electrical connection relationship of components included in the pixel PXL illustrated in FIG. 4.

For example, FIGS. 5 and 6 illustrate various embodiments of the electrical connection relationship of components included in the pixel PXL that may be employed in an active matrix type display device. However, the types of the components included in the pixel PXL to which embodiments of the disclosure may be applied are not limited thereto.

As illustrated in FIGS. 5 and 6, not only the components included in the pixel PXL illustrated in FIG. 4 but also an area in which the components are provided (or disposed) may be referred to as "pixel PXL".

Referring to FIGS. 1 to 6, the pixel PXL may include an emission unit (or emission part) EMU (or an emitter) configured to generate light having a luminance corresponding to a data signal. Furthermore, the pixel PXL may selectively further include a pixel circuit PXC configured to drive the emission part EMU.

In an embodiment, the emission part EMU may include light emitting elements LD electrically connected between a first power line PL1 which is electrically connected to a first driving power supply VDD and to which a voltage of the first driving power supply VDD is applied, and a second power line PL2 which is electrically connected to a second driving power supply VSS and to which a voltage of the second driving power supply VSS is applied. For example, the emission part EMU may include a first pixel electrode PE1 electrically connected to the first driving power supply VDD via the pixel circuit PXC and the first power line PL1, a second pixel electrode PE2 electrically connected to the second driving power supply VSS through the second power line PL2, and light emitting elements LD electrically connected in parallel to each other in a same direction between the first and second pixel electrodes PE1 and PE2. In an embodiment, the first pixel electrode PE1 may be an anode, and the second pixel electrode PE2 may be a cathode.

Each of the light emitting elements LD included in the emission part EMU may include a first end electrically connected to the first driving power supply VDD through the first pixel electrode PE1, and a second end electrically connected to the second driving power supply VSS through the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. A difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first pixel electrode PE1 and the second pixel electrode PE2 to which the voltages of the different power supplies are supplied may form respective valid light sources.

The light emitting elements LD of the emission part EMU may emit light having a luminance corresponding to driving current supplied thereto through the pixel circuit PXC. For example, during each frame period, the pixel circuit PXC may supply driving current corresponding to a grayscale value of corresponding frame data to the emission part EMU. The driving current supplied to the emission part EMU may be divided and flow into the respective light emitting elements LD. Hence, each of the light emitting elements LD may emit light having a luminance corresponding to current applied thereto, so that the emission part EMU may emit light having a luminance corresponding to the driving current.

Although there has been described the embodiment in which the opposite ends of the light emitting elements LD are electrically connected in the same direction between the first and second driving power supplies VDD and VSS, the disclosure is not limited thereto. In an embodiment, the emission part EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be connected in parallel to each other between the first and second pixel electrodes PE1 and PE2. The reverse light emitting element LDr may be electrically connected between the first and second pixel electrodes PE1 and PE2 in a direction opposite to that of the light emitting elements LD. Even if a predetermined driving voltage (e.g., a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be electrically connected to a scan line Si and a data line Dj of the pixel PXL, where i and j are natural numbers. The pixel circuit PXC may be electrically connected to a control line CLi and a sensing line SENj of the pixel PXL. For example, in case that the pixel PXL is disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3 and a storage capacitor Cst.

The first transistor T1 may be a driving transistor configured to control driving current to be applied to the emission part EMU, and may be electrically connected between the first driving power supply VDD and the emission part EMU. In detail, a first terminal of the first transistor T1 may be electrically connected (or coupled) to the first driving power supply VDD through the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission part EMU through the second node N2. In an embodiment, the first terminal of the first transistor T1 may be a drain electrode, and the second terminal of the first transistor T1 may be a source electrode, and the disclosure is not limited thereto. In an embodiment, the first terminal may be a source electrode, and the second terminal may be a drain electrode.

The second transistor T2 may be a switching transistor which selects a pixel PXL in response to a scan signal and activates the pixel PXL, and may be electrically connected between the data line Dj and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si. The first terminal and the second terminal of the second transistor T2 are different from each other, and, for example, if the first terminal is a drain electrode, and the second terminal is a source electrode.

In case that a scan signal having a gate-on voltage (e.g., a high-level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by electrically connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the third transistor T3 may be electrically connected to the second terminal of the first transistor T1. A first terminal of the third transistor T3 may be electrically connected to the sensing line SENj. A gate electrode of the third transistor T3 may be electrically connected to the control line CLi. Furthermore, the first terminal of the third transistor T3 may be electrically connected to an initialization power supply. The third transistor T3 may be an initialization transistor configured to initialize the second node N2, and may be turned on in case that a sensing control signal is supplied thereto from the control line CLi, so that a voltage of the initialization power supply can be transmitted to the second node N2. Hence, a second storage electrode of the storage capacitor Cst electrically connected to the second node N2 may be initialized.

A first storage electrode of the storage capacitor Cst may be electrically connected to the first node N1. A second storage electrode of the storage capacitor Cst may be electrically connected to the second node N2. The storage capacitor Cst may be charged with a data voltage corresponding to a data signal to be supplied to the first node N1 during a frame period. Hence, the storage capacitor Cst may store a voltage corresponding to a difference between a voltage of the gate electrode of the first transistor T1 and a voltage of the second node N2.

Although FIG. 5 illustrates an embodiment in which all of the light emitting elements LD that form the emission part EMU are electrically connected in parallel to each other, the disclosure is not limited thereto. In an embodiment, the emission part EMU may include at least one serial set (or stage) including light emitting elements LD electrically connected in parallel to each other. In other words, as illustrated in FIG. 6, the emission part EMU may have a serial-parallel combination structure.

Referring to FIG. 6, the emission part EMU may include first and second serial sets SET1 and SET2 which are successively electrically connected between the first and second driving power supplies VDD and VSS. Each of the first and second serial sets SET1 and SET2 may include two electrodes PE1 and CTE1, CTE2 and PE2 that form an electrode pair of the corresponding serial set, and light emitting elements LD electrically connected in parallel to each other in the same direction between the two electrodes PE1 and CTE1, CTE2 and PE2.

The first serial set (or the first stage) SET1 may include a first pixel electrode PE1, a first intermediate electrode CTE1, and at least one first light emitting element LD1 electrically connected between the first pixel electrode PE1 and the first intermediate electrode CTE1. Furthermore, the first serial set SET1 may include a reverse light emitting element LDr electrically connected between the first pixel electrode PE1 and the first intermediate electrode CTE1 in a direction opposite to that of the first light emitting element LD1.

The second serial set (or the second stage) SET2 may include a second intermediate electrode CTE2, a second pixel electrode PE2, and at least one second light emitting element LD2 electrically connected between the second intermediate electrode CTE2 and the second pixel electrode PE2. Furthermore, the second serial set SET2 may include a reverse light emitting element LDr electrically connected between the second intermediate electrode CTE2 and the second pixel electrode PE2 in a direction opposite to that of the second light emitting element LD2.

The first intermediate electrode CTE1 and the second intermediate electrode CTE2 may be electrically and/or physically connected with each other. The first intermediate electrode CTE1 and the second intermediate electrode CTE2 may form an intermediate electrode CTE that electrically connect the first serial set SET1 and the second serial set SET2 that are successively provided.

In the foregoing embodiment, the first pixel electrode PE1 of the first serial set SET1 may be an anode of each pixel PXL, and the second pixel electrode PE2 of the second serial set SET2 may be a cathode of the corresponding pixel PXL.

As described above, the emission part EMU of the pixel PXL including the serial sets SET1 and SET2 (or the light emitting elements LD) electrically connected to each other in the serial-parallel combination structure may easily adjust driving current/voltage conditions in response to specifications of a product to which the emission part EMU is to be applied.

The emission part EMU of the pixel PXL including the serial sets SET1 and SET2 (or the light emitting elements LD) electrically connected to each other in the serial-parallel combination structure may reduce driving current, compared to the emission part EMU having a structure such that the light emitting elements LD are electrically connected only in parallel to each other. Furthermore, the emission part EMU of the pixel PXL including the serial sets SET1 and SET2 electrically connected to each other in the serial-parallel combination structure may reduce driving current to be applied to the opposite ends of the emission part EMU, compared to the emission part having a structure such that all of the light emitting elements LD, the number of which is the same as that of the emission part EMU, are electrically connected in series to each other. The emission part EMU of the pixel PXL including the serial sets SET1 and SET2 (or the light emitting elements LD) electrically connected to each other in the serial-parallel combination structure may include a greater number of light emitting elements LD between same numbers of electrodes PE1, CTE1, CTE2, and PE2, compared to the emission part EMU having a structure such that all of the serial sets (or stages) SET1 and SET2 are electrically connected in series to each other. In this case, the light output efficiency of the light emitting elements LD may be enhanced. Even if a defect occurs in a specific serial set (or stage), the ratio of light emitting elements LD that cannot emit light because of the defect may be reduced, so that a reduction in the light output efficiency of the light emitting elements LD can be mitigated.

Although FIGS. 5 and 6 illustrate an embodiment where all of the first, second, and third transistors T1, T2, and T3 included in the pixel circuit PXC are formed of N-type transistors, the disclosure is not limited thereto. For example, at least one of the first, second, and third transistors T1, T2, and T3 may be changed to a P-type transistor. Furthermore, although FIGS. 5 and 6 illustrate an embodiment where the emission part EMU is electrically connected between the pixel circuit PXC and the second driving power supply VSS, the emission part EMU may be electrically connected between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

The structure of the pixel PXL which may be applied to the disclosure is not limited to the embodiments illustrated in FIGS. 5 and 6, and the pixel PXL may have various structures. For example, the pixel PXL may be configured in a passive light emitting display device, or the like. In this case, the pixel circuit PXC may be omitted, and the opposite ends of the light emitting elements LD included in the emission part EMU may be directly electrically connected to the scan lines Si, the data line Dj, the first power line PL1 to which a voltage of the first driving power supply VDD is to be applied, the second power line PL2 to which a voltage of the second driving power supply VSS is to be applied, and/or a control line.

Figure 7:
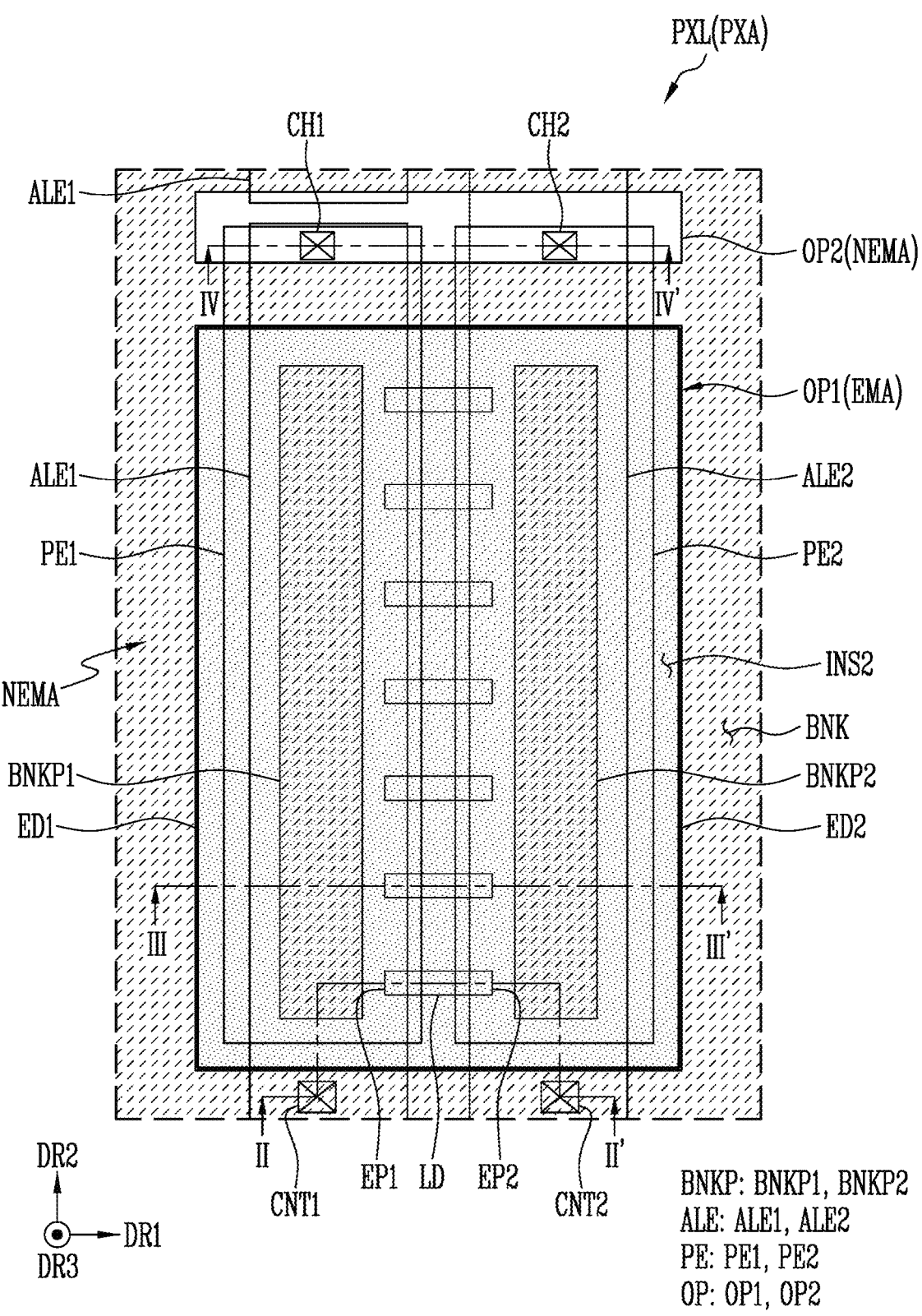
FIG. 7 is a plan view schematically illustrating each pixel illustrated in FIG. 4.

FIG. 7 is a plan view schematically illustrating each pixel PXL illustrated in FIG. 4.

In FIG. 7, for the sake of explanation, illustration of the transistors T electrically connected to the light emitting elements LD and the signal lines electrically connected to the transistors T is omitted.

In FIG. 7, for the sake of explanation, a transverse direction (or a horizontal direction) in a plan view is indicated by a first direction DR1, a longitudinal direction (or a vertical direction) in a plan view is indicated by a second direction DR2, and a thickness-wise direction of the substrate SUB is indicated by a third direction DR3. The first, second, and third directions DR1, DR2, and DR3 may refer to the directions indicated by the first, second, third directions DR1, DR2, and DR3, respectively.

Referring to FIGS. 1 to 7, the pixel PXL may be disposed in a pixel area PXA provided (or defined) on the substrate SUB. The pixel area PXA may include an emission area EMA and a non-emission area NEMA.

The pixel PXL may include a bank BNK disposed in the non-emission area NEMA, and light emitting elements LD disposed in the emission area EMA.

The bank BNK may be a structure for defining (or partitioning) the respective pixel areas PXA (or the respective emission areas EMA) of the pixel PXL and pixels PXL adjacent thereto and, for example, may be a pixel defining layer.

In an embodiment, the bank BNK may be a pixel defining layer or a dam structure for defining each emission area EMA to which the light emitting elements LD are to be supplied, during a process of supplying (or inputting) the light emitting elements LD to the pixel PXL. For example, since the emission area EMA of the pixel PXL is defined by the bank BNK, a mixed solution (e.g., ink) including a target amount and/or type of light emitting elements LD may be supplied (or input) to the emission area EMA. Furthermore, during a process of supplying a color conversion layer (not illustrated) to the pixel PXL, the bank BNK may be a pixel defining layer which ultimately defines each emission area EMA to which the color conversion layer is to be supplied.

In an embodiment, the bank BNK may include at least one light shielding material and/or reflective material (or scattering material), thus preventing a light leakage defect in which light (or rays) leaks between the pixel PXL and pixels PXL adjacent thereto. In an embodiment, the bank BNK may include transparent material (or substance). The transparent material may include, for example, polyamides resin, polyimides resin, etc., but the disclosure is not limited thereto. In an embodiment, in order to enhance the efficiency of light emitted from the pixel PXL, a separate reflective material layer may be provided and/or formed on the bank BNK.

In an embodiment, the bank BNK may include an organic layer (or an organic insulating layer). The bank BNK may be included in the pixel PXL and connected with (or "contact," "brought into contact with," or "abut on") other insulating layers formed of organic layers and thus function as an outlet for discharging (or releasing) outgas that occurs from the insulating layers.

The bank BNK may include, in the pixel area PXA, at least one opening OP which exposes components disposed thereunder. For example, the bank BNK may include a first opening OP1 and a second opening OP2 which expose components disposed under the bank BNK in the pixel area PXA. In an embodiment, the emission area EMA of the pixel PXL and the first opening OP1 of the bank BNK may correspond to each other.

In the pixel area PXA, the second opening OP2 may be disposed to be spaced apart from the first opening OP1, and may be disposed adjacent to a side of the pixel area PXA, e.g., an upper side of the pixel area PXA. In an embodiment, the second opening OP2 may be an electrode separation area where at least one alignment electrode ALE is separated from at least one alignment electrode ALE provided in pixels PXL adjacent thereto in the second direction DR2.

A second insulating layer INS2 may be disposed over the alignment electrodes ALE. The second insulating layer INS2 may correspond to the first opening OP1 of the bank BNK. In this case, ends of the second insulating layer INS2 may abut or contact sidewalls of the bank BNK. However, the disclosure is not limited thereto. In an embodiment, the ends of the second insulating layer INS2 may be spaced apart from the sidewalls of the bank BNK in the emission area EMA rather than contacting the sidewalls of the bank BNK. Furthermore, in an embodiment, the second insulating layer INS2 may partially overlap the bank BNK. In an embodiment, the second insulating layer INS2 may be disposed in the pixel area PXA of the pixel PXL so that the second insulating layer INS2 may not completely overlap the bank BNK. For example, the second insulating layer INS2 may be designed not to completely overlap the bank BNK in the pixel area PXA, so that an upper surface of the bank BNK is not completely covered with the second insulating layer INS2 to allow the bank BNK to function as an outlet for discharging outgas.

The second insulating layer INS2 may be formed of an inorganic layer (or an inorganic insulating layer) including inorganic material. For example, the second insulating layer INS2 may include at least one of metal oxides such as silicon nitride ($SiN_x$), silicon oxide ($SiO_x$), silicon oxynitride ($SiO_xN_y$), and aluminum oxide ($AlO_x$). In an embodiment, the second insulating layer INS2 may be provided in a single layer structure or a multi-layer structure having at least two or more layers. For example, in case that the insulating layer INS2 is formed of a double layer structure including a first layer and a second layer that are successively stacked, the first layer and the second layer may be made of (or include) different types of inorganic layers and be formed by different processes. In an embodiment, the first layer and the second layer may be made of the same type of inorganic layer and be formed by a successive process.

The pixel PXL may include pixel electrodes PE provided in at least the emission area EMA, light emitting elements LD electrically connected to the pixel electrodes PE, and bank patterns BNKP and alignment electrodes ALE which are provided to correspond to the pixel electrodes PE. For example, the pixel PXL may include first and second pixel electrodes PE1 and PE2, light emitting elements LD, first and second bank patterns BNKP1 and BNKP2, and first and second alignment electrodes ALE1 and ALE2, which are provided in at least the emission area EMA. The number, shape, size, and arrangement structure of the pixel electrodes PE and/or the alignment electrodes ALE each may be changed in various ways depending on the structure of the pixel PXL (particularly, the emission part EMU).

In an embodiment, based on a surface of the substrate SUB on which the pixel PXL is provided, the alignment electrodes ALE, the bank patterns BNKP, the light emitting elements LD, the pixel electrodes PE may be provided in the order listed, but the disclosure is not limited thereto. In an embodiment, the positions and formation sequence of electrode patterns that form the pixel PXL (or the emission part EMU (or the emitter)) may be changed in various ways. A stacked structure of the pixel PXL will be described below with reference to FIGS. 8 to 13B.

The alignment electrodes ALE may include the first alignment electrode ALE1 and the second alignment electrode ALE2 which are spaced apart from each other in the first direction DR1.

At least one of the first and second alignment electrodes ALE1 and ALE2 may be separated from other electrodes (e.g., an alignment electrode ALE provided in each of pixels PXL adjacent thereto in the second direction DR2) in the second opening OP2 (or the electrode separation area) after the light emitting elements LD are supplied and aligned in the pixel area PXA during a process of fabricating the display device. For example, a first end of the first alignment electrode ALE1 may be separated, in the second opening OP2, from the first alignment electrode ALE1 of the pixel PXL that is disposed on an upper side of the corresponding pixel PXL in the second direction DR2.

The first alignment electrode ALE1 may be electrically connected with the first transistor T1 described with reference to FIGS. 5 and 6 through a first contact portion CNT1. The second alignment electrode ALE2 may be electrically connected with the second driving power supply VSS (or the second power line PL2) described with reference to FIGS. 5 and 6 through a second contact portion CNT2.

The first contact portion CNT1 may be formed by removing a portion of at least one insulating layer disposed between the first alignment electrode ALE1 and the first transistor T1. The second contact portion CNT2 may be formed by removing a portion of at least one insulating layer disposed between the second alignment electrode ALE2 and the second power line PL2. In an embodiment, the first contact portion CNT1 and the second contact portion CNT2 may be disposed in the non-emission area NEMA and overlap the bank BNK. However, the disclosure is not limited thereto. In an embodiment, the first and second contact portions CNT1 and CNT2 may be disposed in the second opening OP2 that is the electrode separation area, and may also be disposed in the emission area EMA.

Each of the first alignment electrode ALE1 and the second alignment electrode ALE2 may be supplied with a signal (or an alignment signal) from an alignment pad (not illustrated) disposed in the non-display area NDA at the step of aligning the light emitting elements LD. For example, the first alignment electrode ALE1 may be supplied with a first alignment signal (or a first alignment voltage) from a first alignment pad. The second alignment electrode ALE2 may be supplied with a second alignment signal (or a second alignment voltage) from a second alignment pad. The above-mentioned first and second alignment signals may be signals having a voltage difference and/or a phase difference by which the light emitting elements LD may be aligned between the first and second alignment electrodes ALE1 and ALE2. At least one of the first and second alignment signals may be an AC signal, but the disclosure is not limited thereto.

Each alignment electrode ALE may have a bar-like shape having a uniform width in the second direction DR2, but the disclosure is not limited thereto. In an embodiment, each alignment electrode ALE may or may not have a bent portion in the non-emission area NEMA and/or the second opening OP2 that is the electrode separation area, and the shape and/or size thereof in areas other than the emission area EMA may be changed in various ways rather than being particularly limited.

The bank pattern BNKP may be provided in at least the emission area EMA of the pixel PXL and extend in the second direction DR2 in the emission area EMA. The bank pattern BNKP (referred also to as "wall pattern", "protrusion pattern", "support patter", "wall", or "pattern") may have a bar-like shape having a uniform width in an extension direction in the emission area EMA.

The bank pattern BNKP may include a first bank pattern BNKP1 and a second bank pattern BNKP2 which are arranged to be spaced apart from each other in the first direction DR1.

The first bank pattern BNKP1 may be provided on the first alignment electrode ALE1 and overlap the first alignment electrode ALE1. The second bank pattern BNKP2 may be provided on the second alignment electrode ALE2 and overlap the second alignment electrode ALE2. The light emitting elements LD may be aligned (or disposed) between the first bank pattern BNKP1 and the second bank pattern BNKP2. In an embodiment, the bank pattern BNKP may be a structure for accurately defining an alignment position of the light emitting elements LD in the emission area EMA of the pixel PXL.

Although at least two to several tens of light emitting elements LD may be aligned and/or provided in the emission area EMA (or the pixel area PXA), the number of light emitting elements LD is not limited thereto. In an embodiment, the number of light emitting elements LD aligned and/or provided in the emission area EMA (or the pixel area PXA) may be changed in various ways.

The light emitting elements LD may be disposed between the first alignment electrode ALE1 and the second alignment electrode ALE2. Each of the light emitting elements LD may be the light emitting element LD described with reference to FIGS. 1 and 3. Each of the light emitting elements LD may include a first end EP1 (or an end) and a second end EP2 (or another end) which are disposed on opposite ends thereof in the longitudinal direction. In an embodiment, the second semiconductor layer 13 including a p-type semiconductor layer may be disposed on the first end EP1, and the first semiconductor layer 11 including an n-type semiconductor layer may be disposed on the second end EP2. The light emitting elements LD may be electrically connected in parallel to each other between the first alignment electrode ALE1 and the second alignment electrode ALE2.

Each of the light emitting elements LD may emit any of color light and/or white light. Each of the light emitting elements LD may be aligned between the first alignment electrode ALE1 and the second alignment electrode ALE2 such that the longitudinal direction (L) is parallel with the first direction DR1. In an embodiment, the light emitting elements LD may be aligned between the first alignment electrode ALE1 and the second alignment electrode ALE2 such that at least some of the light emitting elements LD is not completely parallel with the first direction DR1. For example, some light emitting elements LD may be aligned to be inclined with respect to the first direction DR1 between the first alignment electrode ALE1 and the second alignment electrode ALE2. The light emitting elements LD may be provided in a diffused form in a solution (or ink) and then input (or supplied) to the pixel area PXA (or the emission area EMA).

The light emitting elements LD may be input (or supplied) to the pixel area PXA (or the emission area EMA) by an inkjet printing method, a slit coating method, or other various methods. For example, the light emitting elements LD may be mixed with a volatile solvent and then input (or supplied) to the pixel area PXA by an inkjet printing method or a slit coating method. If the first alignment electrode ALE1 and the second alignment electrode ALE2 are respectively supplied with corresponding alignment signals, an electric field may be formed between the first alignment electrode ALE1 and the second alignment electrode ALE2. Consequently, the light emitting elements LD may be aligned between the first alignment electrode ALE1 and the second alignment electrode ALE2. After the light emitting elements LD are aligned, the solvent may be removed by a volatilization method or other methods. In this way, the light emitting elements LD may be reliably aligned between the first alignment electrode ALE1 and the second alignment electrode ALE2.

The pixel electrodes (or the electrodes) PE may be provided in at least the emission area EMA, and each may be provided at a position corresponding to at least one alignment electrode ALE and the light emitting element LD. For example, each pixel electrode PE may be formed on the corresponding alignment electrode ALE and the corresponding light emitting elements LD to overlap the corresponding alignment electrode ALE and the corresponding light emitting elements LD, and thus electrically connected at least to the light emitting elements LD.

The first pixel electrode (or the first electrode) PE1 may be formed on the first alignment electrode ALE1 and the respective first ends EP1 of the light emitting elements LD, and thus electrically connected to the respective first ends EP1 of the light emitting elements LD. Furthermore, the first pixel electrode PE1 may directly contact the first alignment electrode ALE1 through a first contact hole CH1 in at least the non-emission area NEMA, e.g., the second opening OP2 that is the electrode separation area, and be electrically and/or physically connected with the first alignment electrode ALE1. The first contact hole CH1 may be formed by removing a portion of at least one insulating layer disposed between the first pixel electrode PE1 and the first alignment electrode ALE1, and may expose a portion of the first alignment electrode ALE1.

Although the first contact hole CH1 that is a connection point (or a contact portion) between the first pixel electrode PE1 and the first alignment electrode ALE1, has been described as being located in the second opening OP2 that is the electrode separation area, the disclosure is not limited thereto. In an embodiment, the connection point (or the contact point) between the first pixel electrode PE1 and the first alignment electrode ALE1 may be located in at least the emission area EMA.

The first pixel electrode PE1 may have a bar-like shape extending in the second direction DR2, but the disclosure is not limited thereto. In an embodiment, the shape of the first pixel electrode PE1 may be changed in various ways so long as the first pixel electrode PE1 may be electrically and/or physically reliably connected with the first ends EP1 of the light emitting elements LD. Furthermore, the shape of the first pixel electrode PE1 may be changed in various ways, taking into account the connection relationship with the first alignment electrode ALE1 disposed thereunder.

The second pixel electrode (or the second electrode) PE1 may be formed on the second alignment electrode ALE2 and the respective second ends EP of the light emitting elements LD, and thus electrically connected to the respective second ends EP2 of the light emitting elements LD. Furthermore, the second pixel electrode PE2 may directly contact the second alignment electrode ALE2 through a second contact hole CH2 and be electrically and/or physically connected with the second alignment electrode ALE2. The second contact hole CH2 may be formed by removing a portion of at least one insulating layer disposed between the second pixel electrode PE2 and the second alignment electrode ALE2, and may expose a portion of the second alignment electrode ALE2.

In an embodiment, the second contact hole CH2 that is a connection point (or a contact point) between the second pixel electrode PE2 and the second alignment electrode ALE2 may be located in the emission area EMA.

The second pixel electrode PE2 may have a bar-like shape extending in the second direction DR2, but the disclosure is not limited thereto. In an embodiment, the shape of the second pixel electrode PE2 may be changed in various ways so long as the second pixel electrode PE2 may be electrically and/or physically reliably connected with the second ends EP2 of the light emitting elements LD. Furthermore, the shape of the second pixel electrode PE2 may be changed in various ways, taking into account the connection relationship with the second alignment electrode ALE2 disposed thereunder.

In the foregoing embodiment, the second insulating layer INS2 may be formed of an inorganic layer and may contact or be spaced apart from a sidewall of the bank BNK formed of an organic layer or be disposed to partially overlap the bank BNK. For example, the second insulating layer INS2 and the bank BNK may not completely overlap each other.

Hereinafter, the stacked structure of the pixel PXL in accordance with the foregoing embodiment will be mainly described with reference to FIGS. 8 to 13B.

Figure 8:
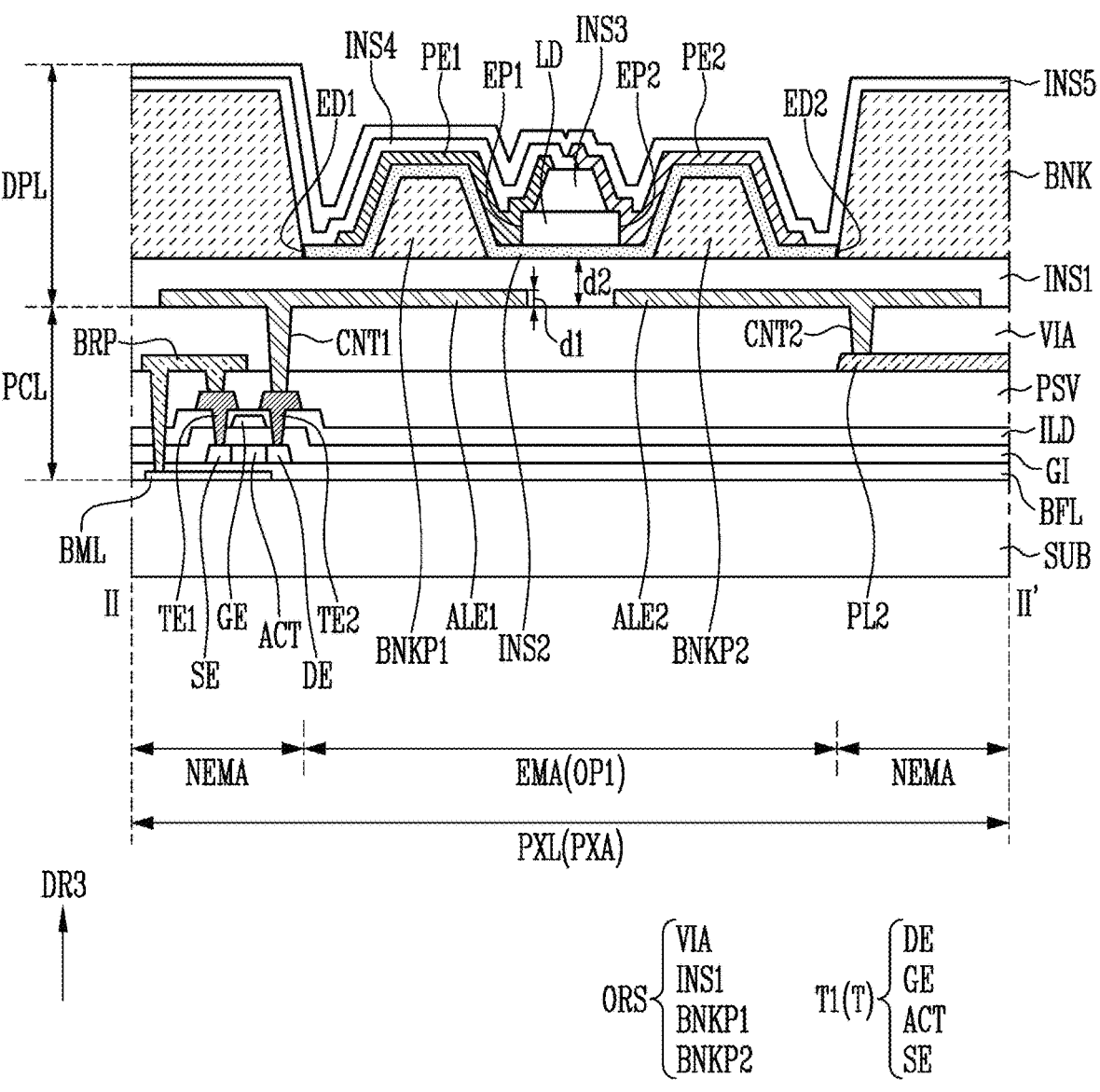
FIG. 8 is a schematic cross-sectional view taken along line II-II' of FIG. 7.

FIG. 8 is a schematic cross-sectional view taken along line II-II' of FIG. 7. FIGS. 9A to 12 are schematic cross-sectional views taken along line III-III' of FIG. 7. FIGS. 13A and 13B are schematic cross-sectional views taken along line IV-IV' of FIG. 7.

In the description of embodiments, "components are provided and/or formed on a same layer" may mean that the components are formed by a same process, and "components are provided and/or formed on different layers may mean that the components are formed by different processes.

Figure 9A:
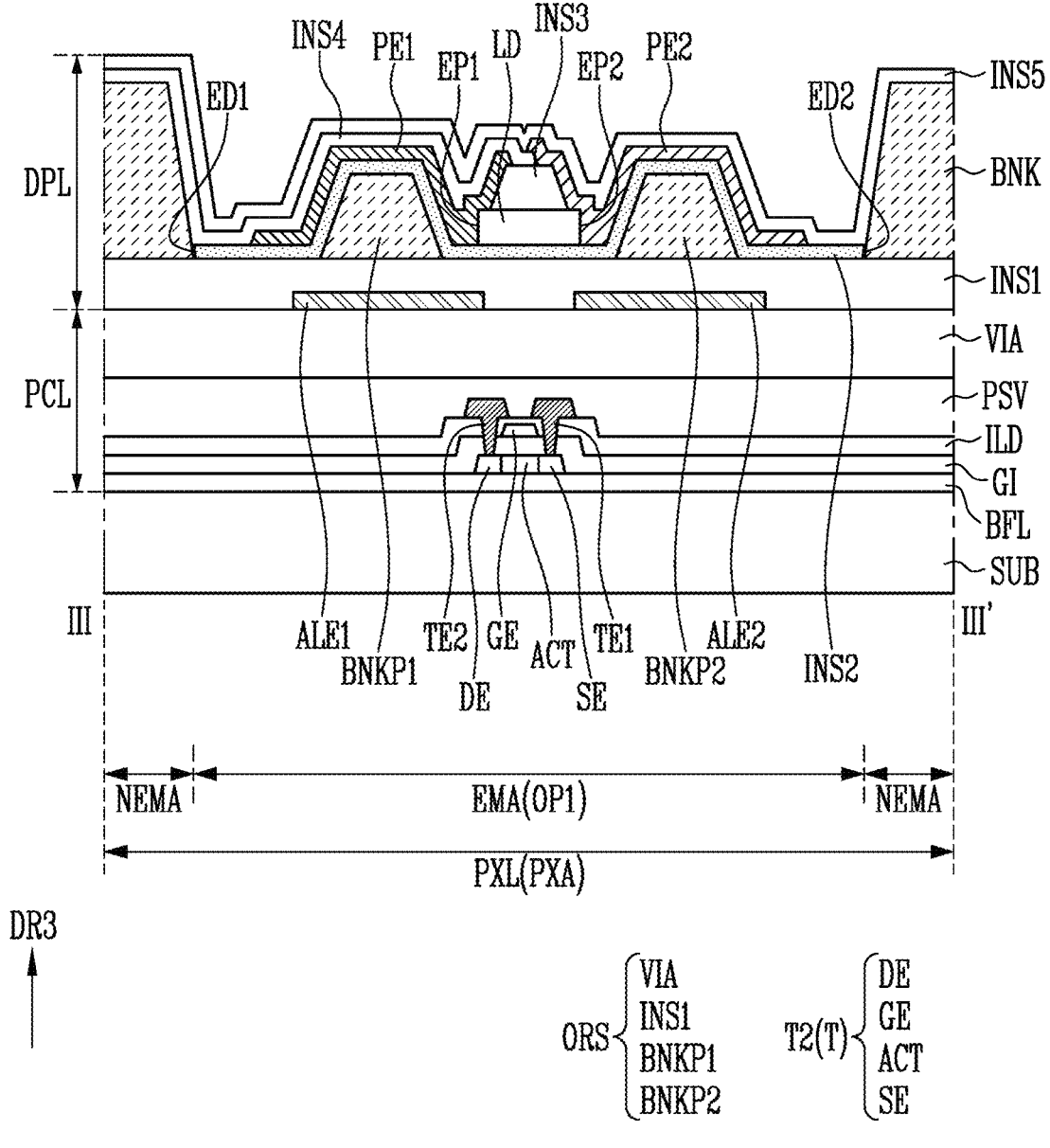
FIGS. 9A to 12 are schematic cross-sectional views taken along line III-III' of FIG. 7.
Figure 9B:
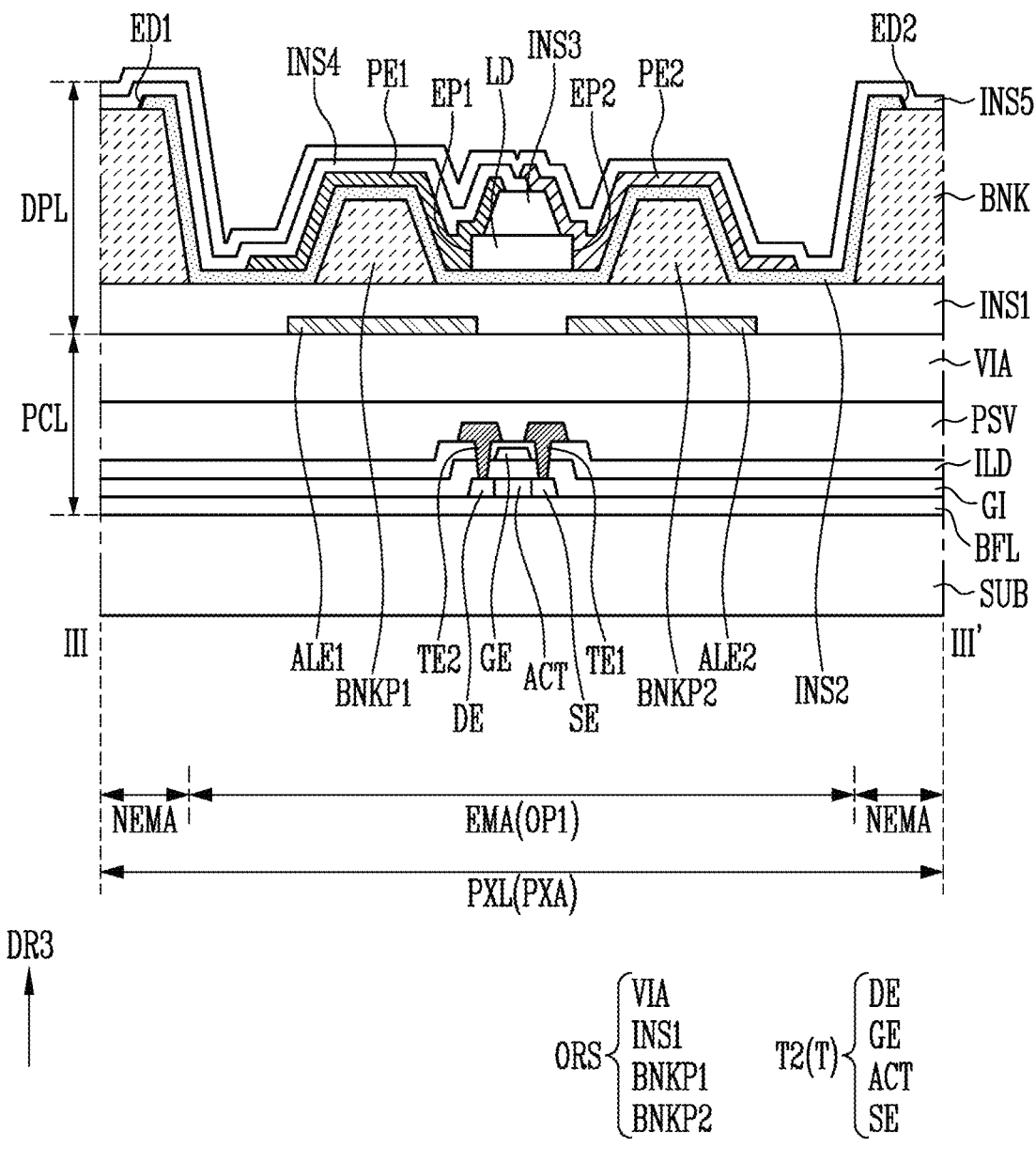
Figure 10:
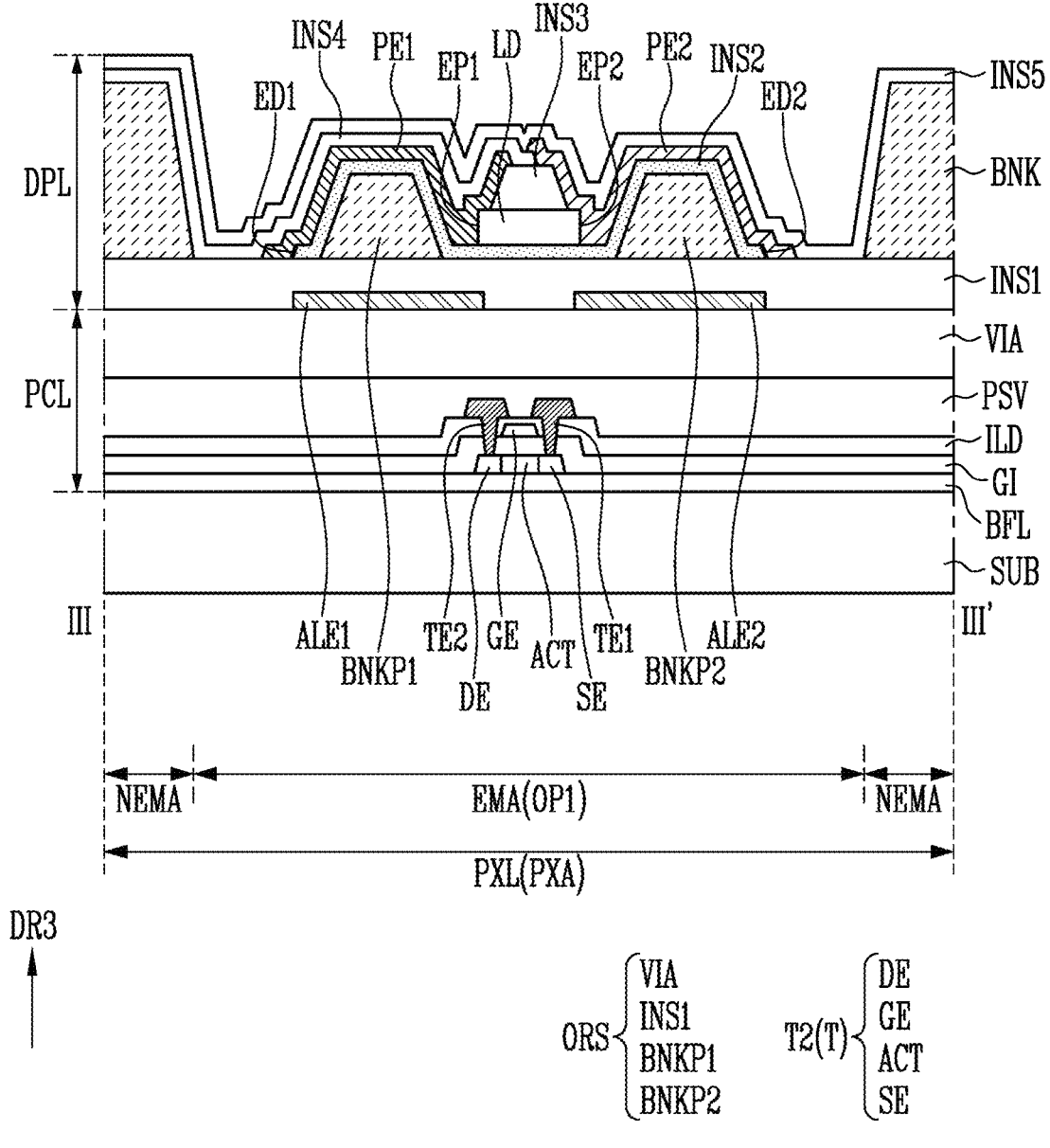

FIGS. 9A, 9B, and 10 illustrate different embodiments pertaining to positions of edges (or ends) ED1 and ED2 of the second insulating layer INS2. For example, FIG. 9A illustrates an embodiment in which each of the edges ED1 and ED2 of the second insulating layer INS2 contacts the sidewall of the bank BNK. FIG. 9B illustrates an embodiment in which each of the edges ED1 and ED2 of the second insulating layer INS2 is disposed on a portion of the bank BNK. FIG. 10 illustrates an embodiment in which each of the edges ED1 and ED2 of the second insulating layer INS2 is spaced apart from the sidewall of the bank BNK.

Figure 11:
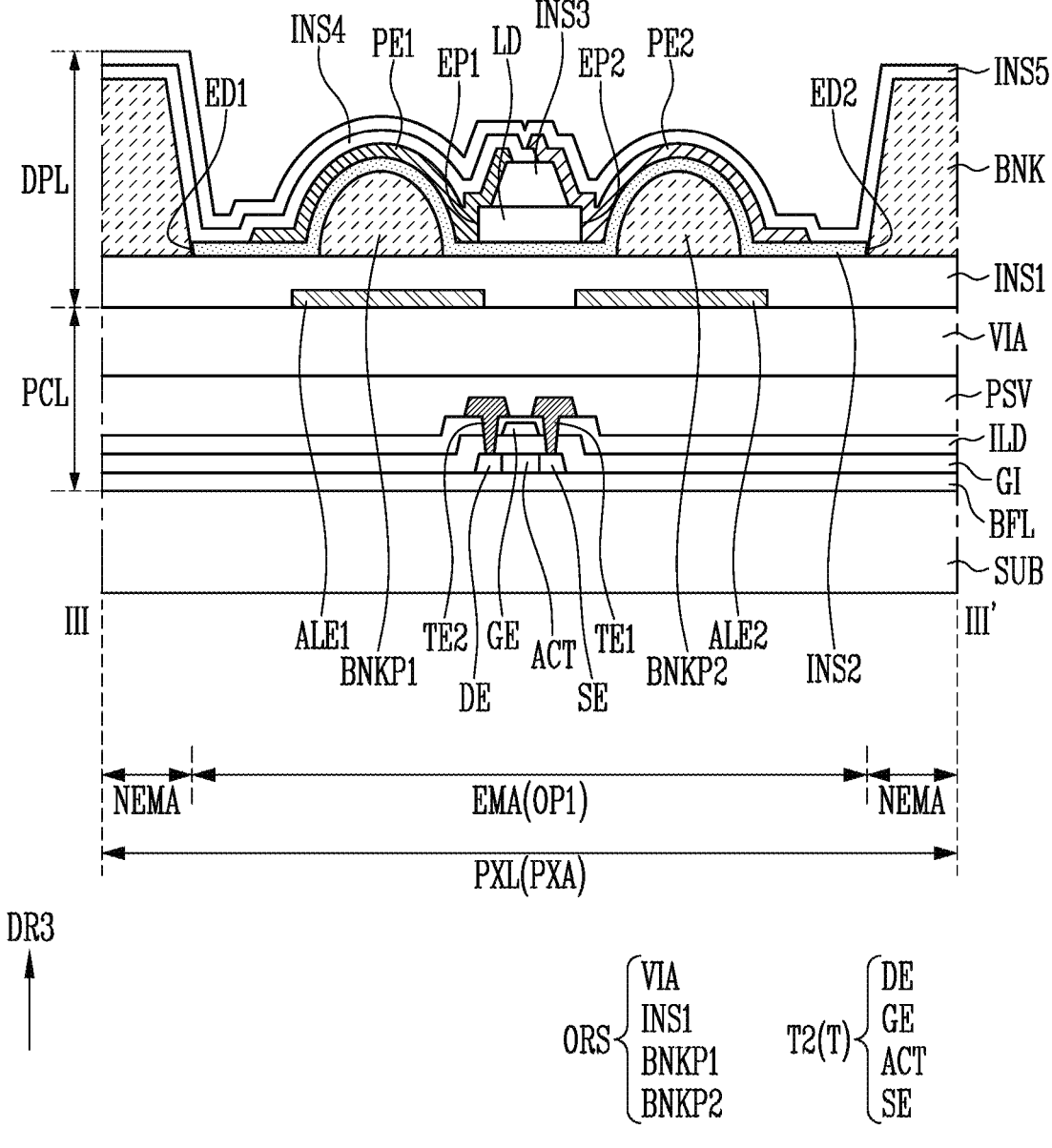

FIGS. 9A and 11 illustrate different embodiments pertaining to the shapes of the first and second bank patterns BNKP1 and BNKP2.

Figure 12:
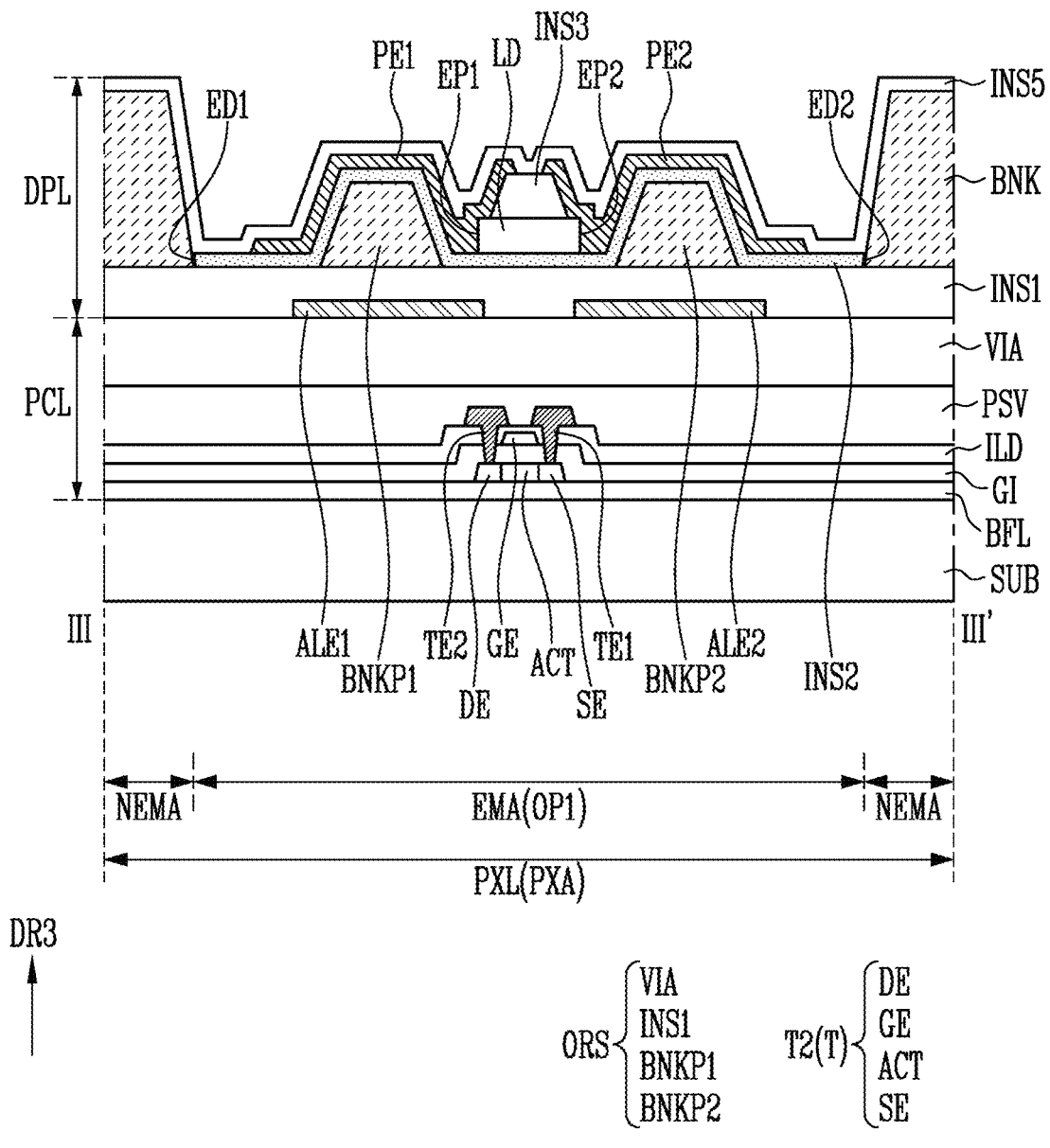
Figure 13A:
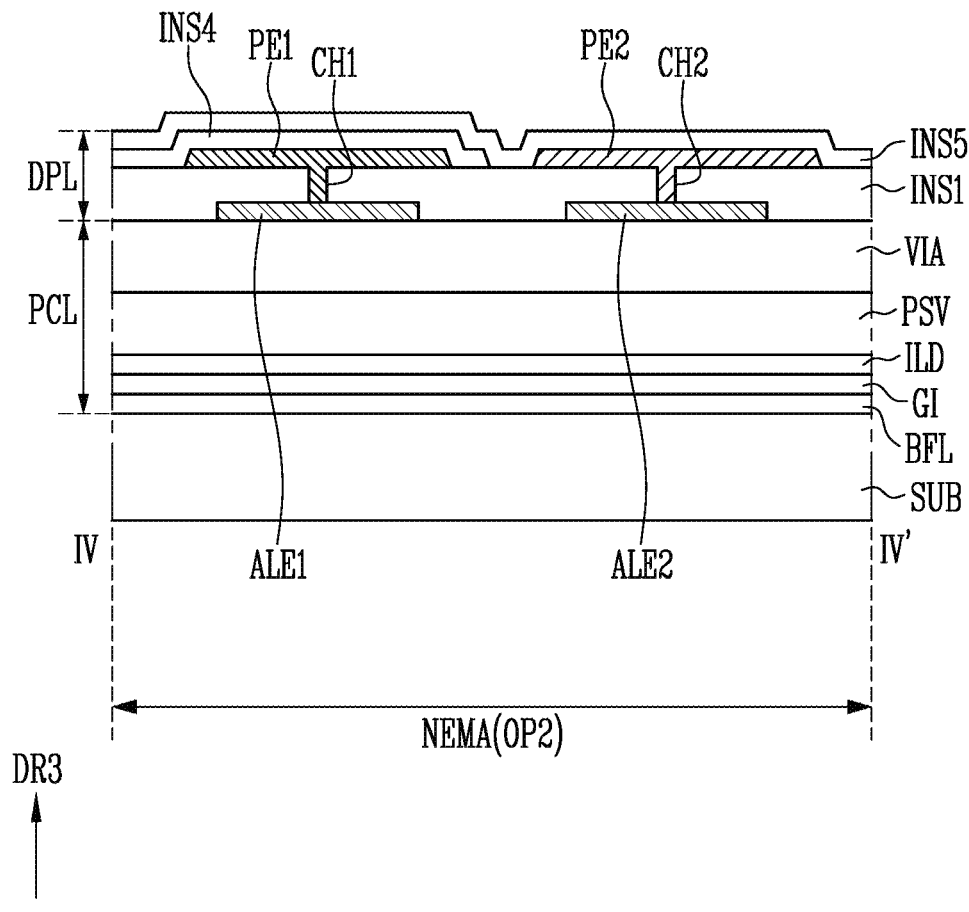
FIGS. 13A and 13B are schematic cross-sectional views taken along line IV-IV' of FIG. 7.
Figure 13B:
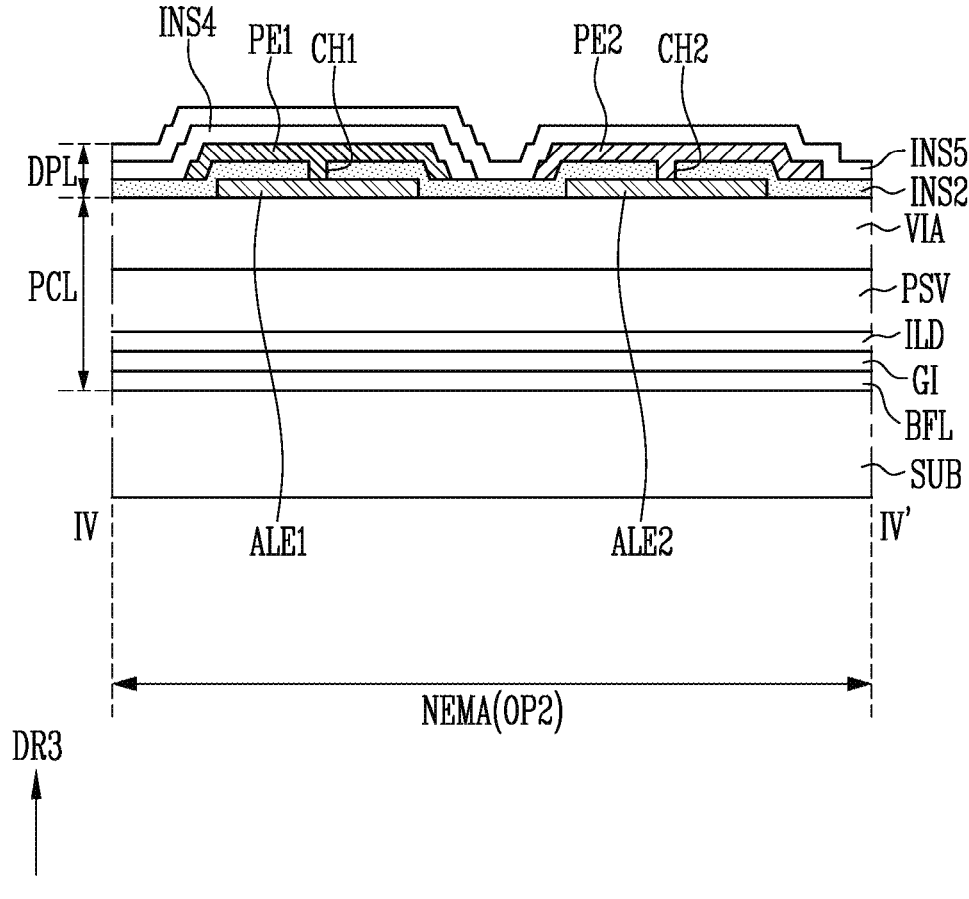
Figure 16A:
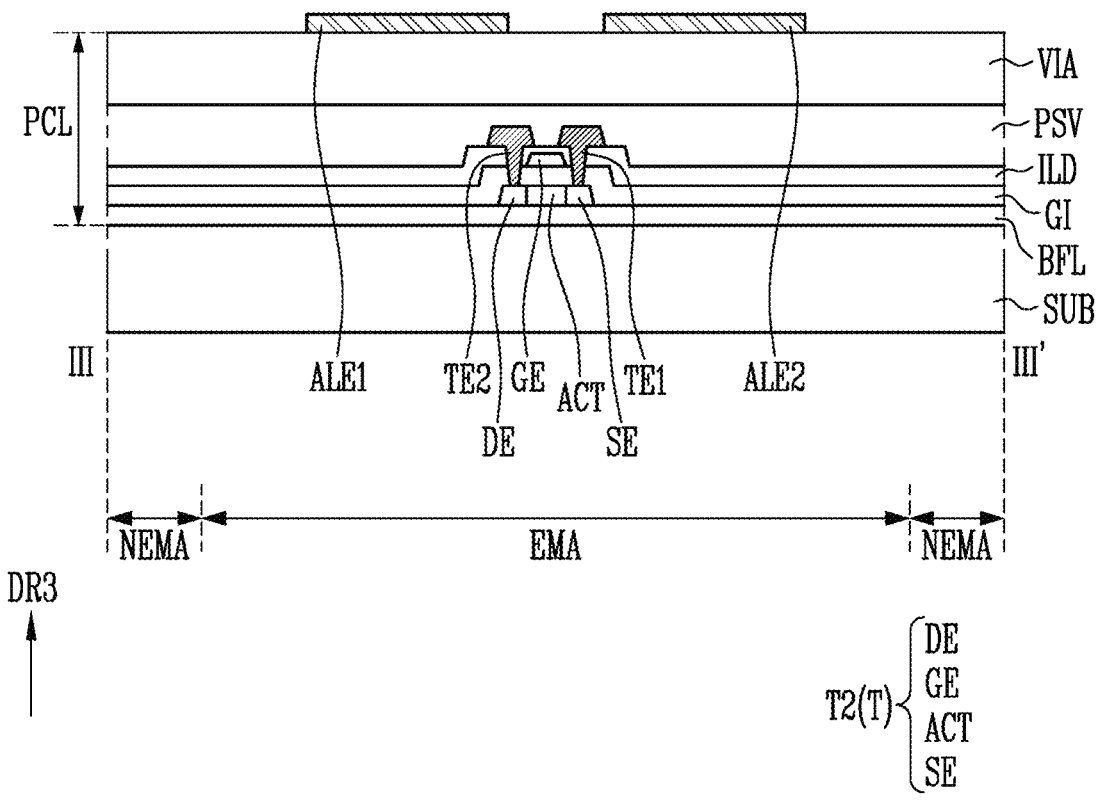
FIGS. 16A to 16I are cross-sectional views schematically illustrating a method of fabricating the pixel illustrated in FIG. 9A.
Figure 16B:
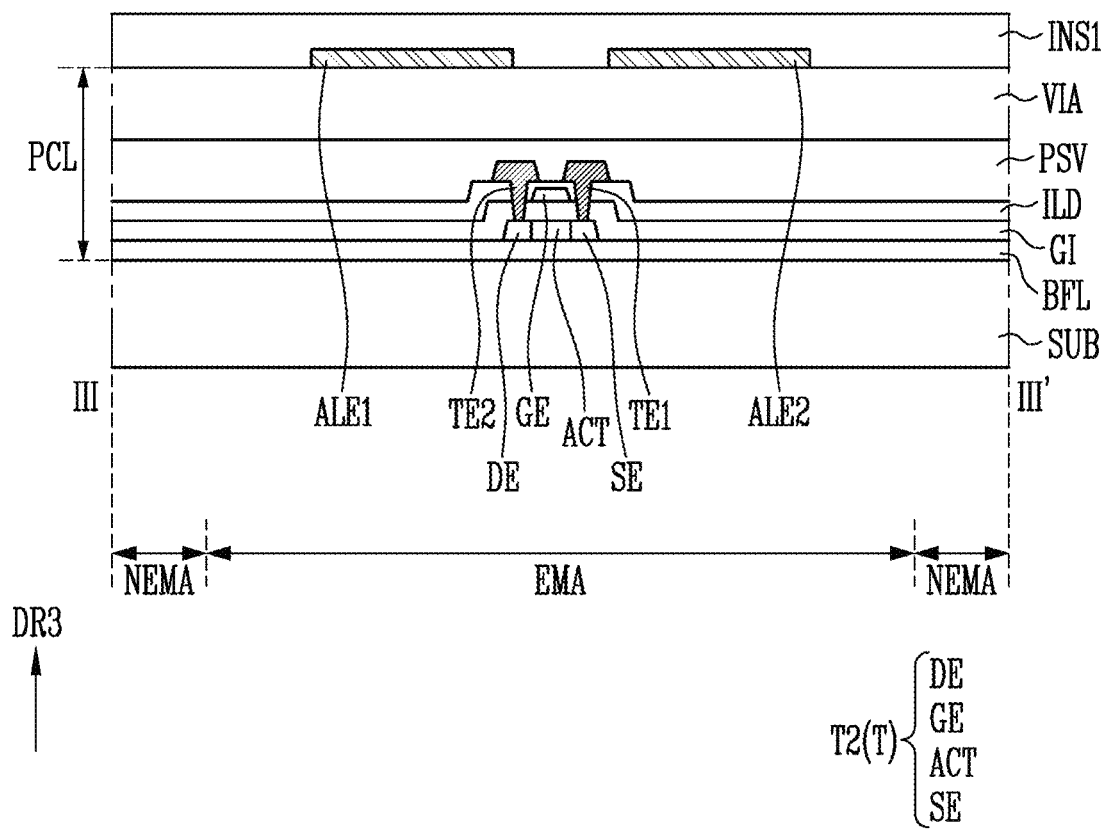
Figure 16C:
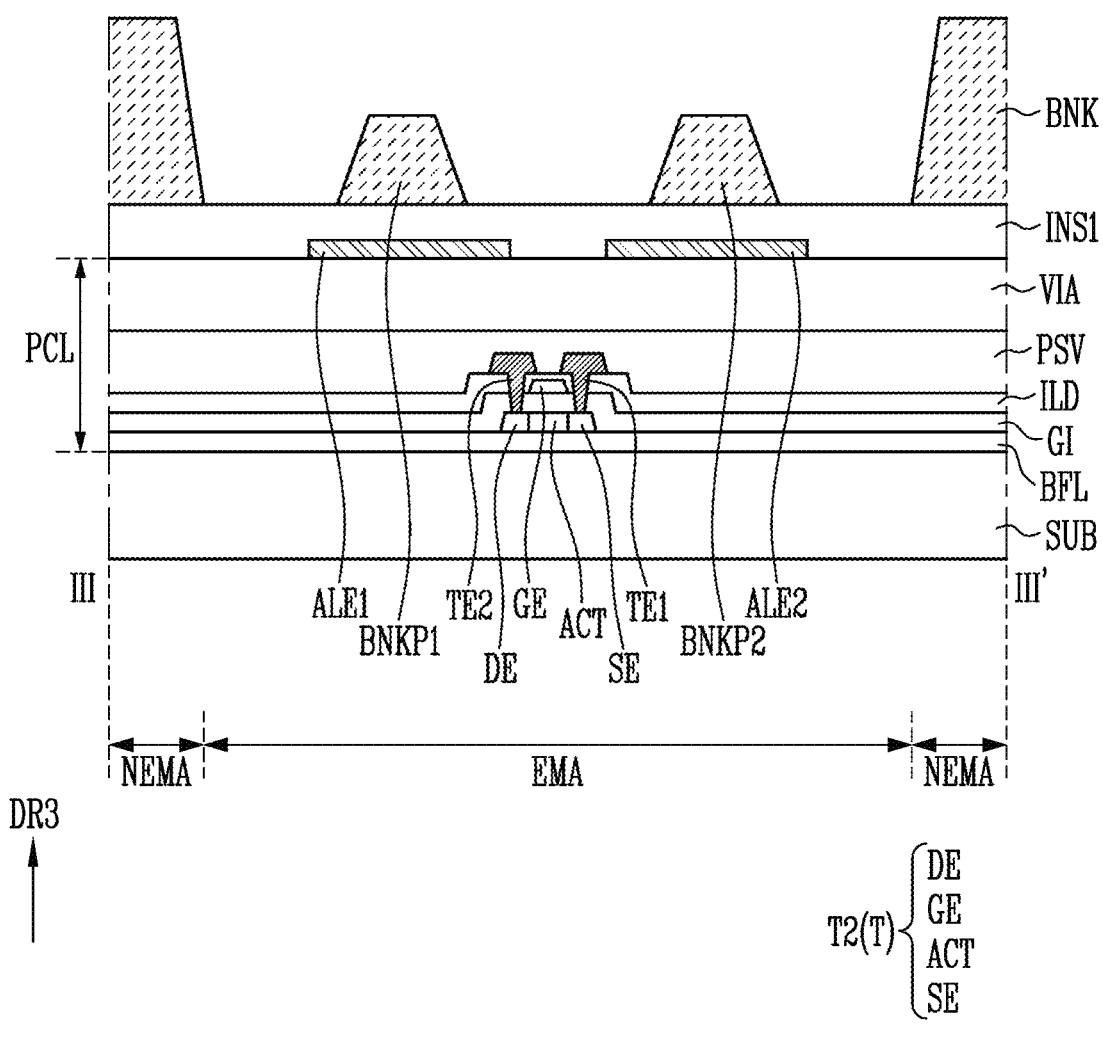
Figure 16D:
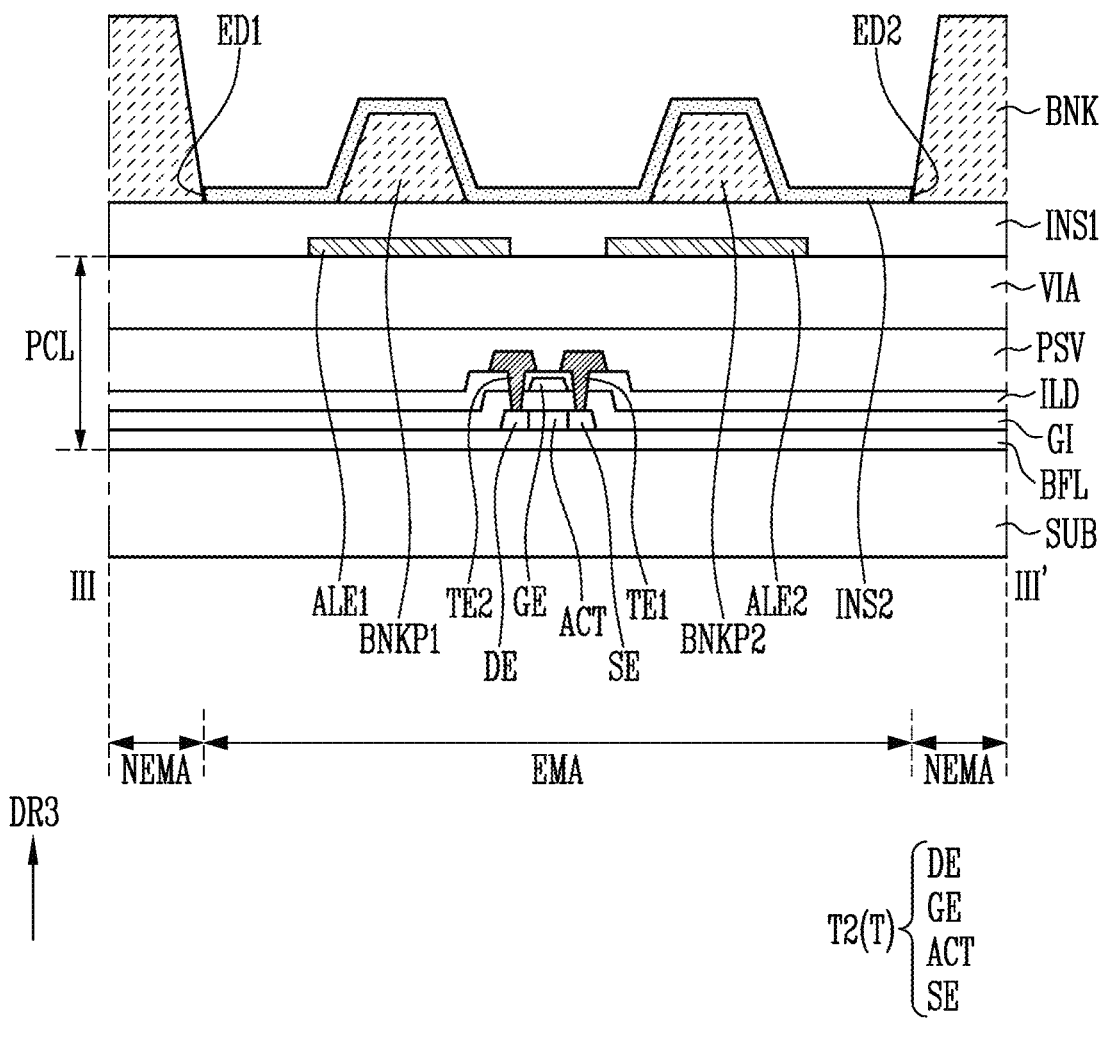
Figure 16E:
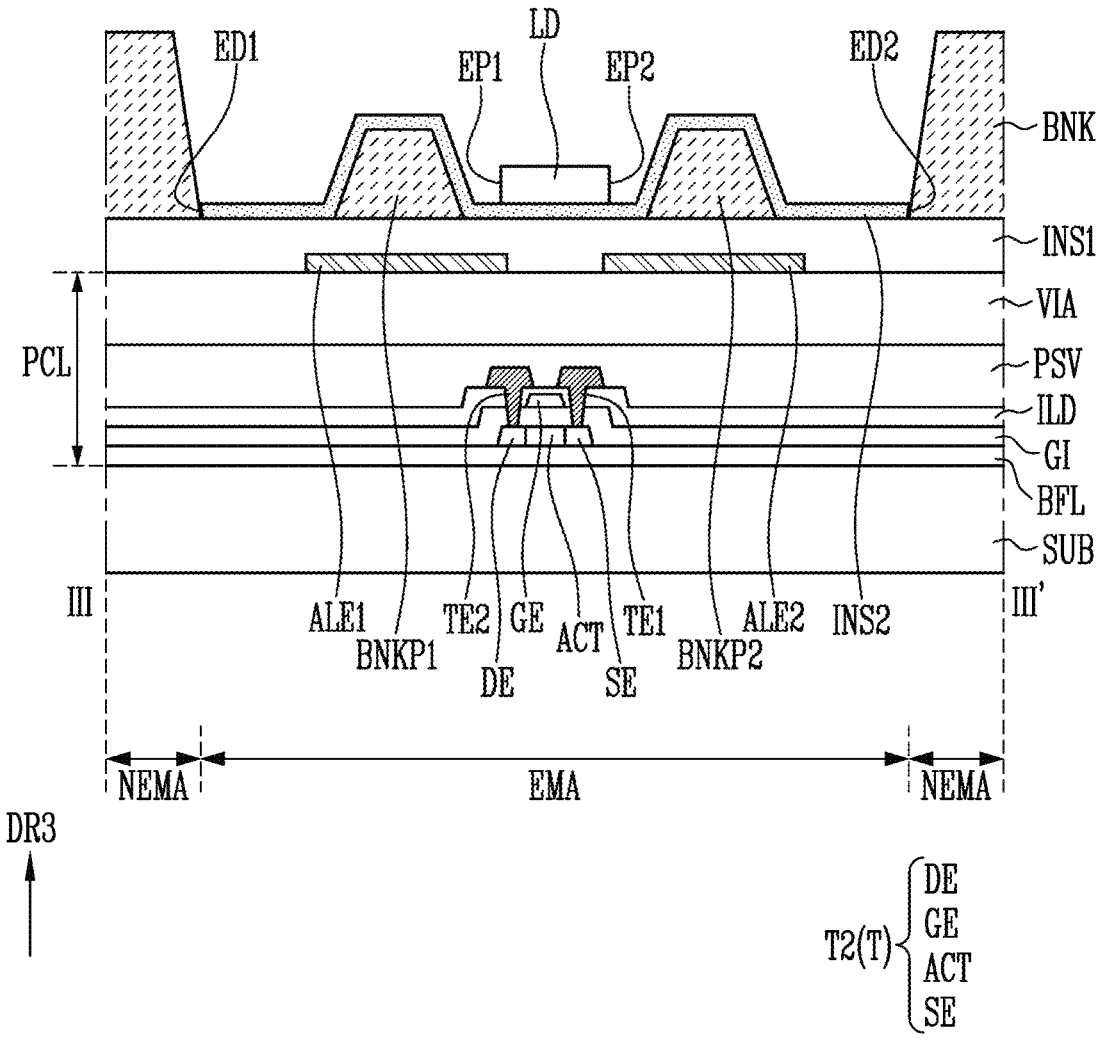
Figure 16F:
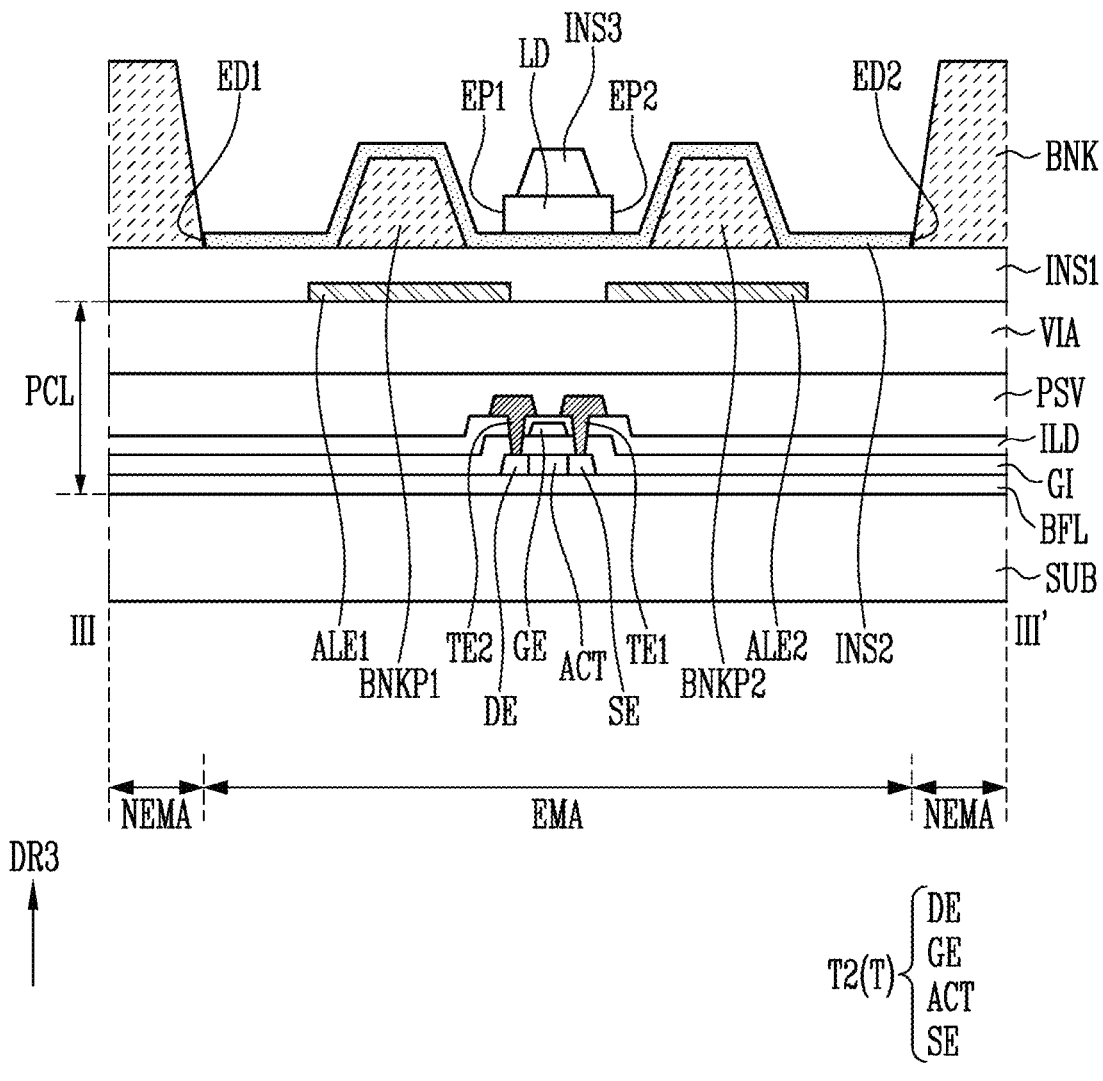
Figure 16G:
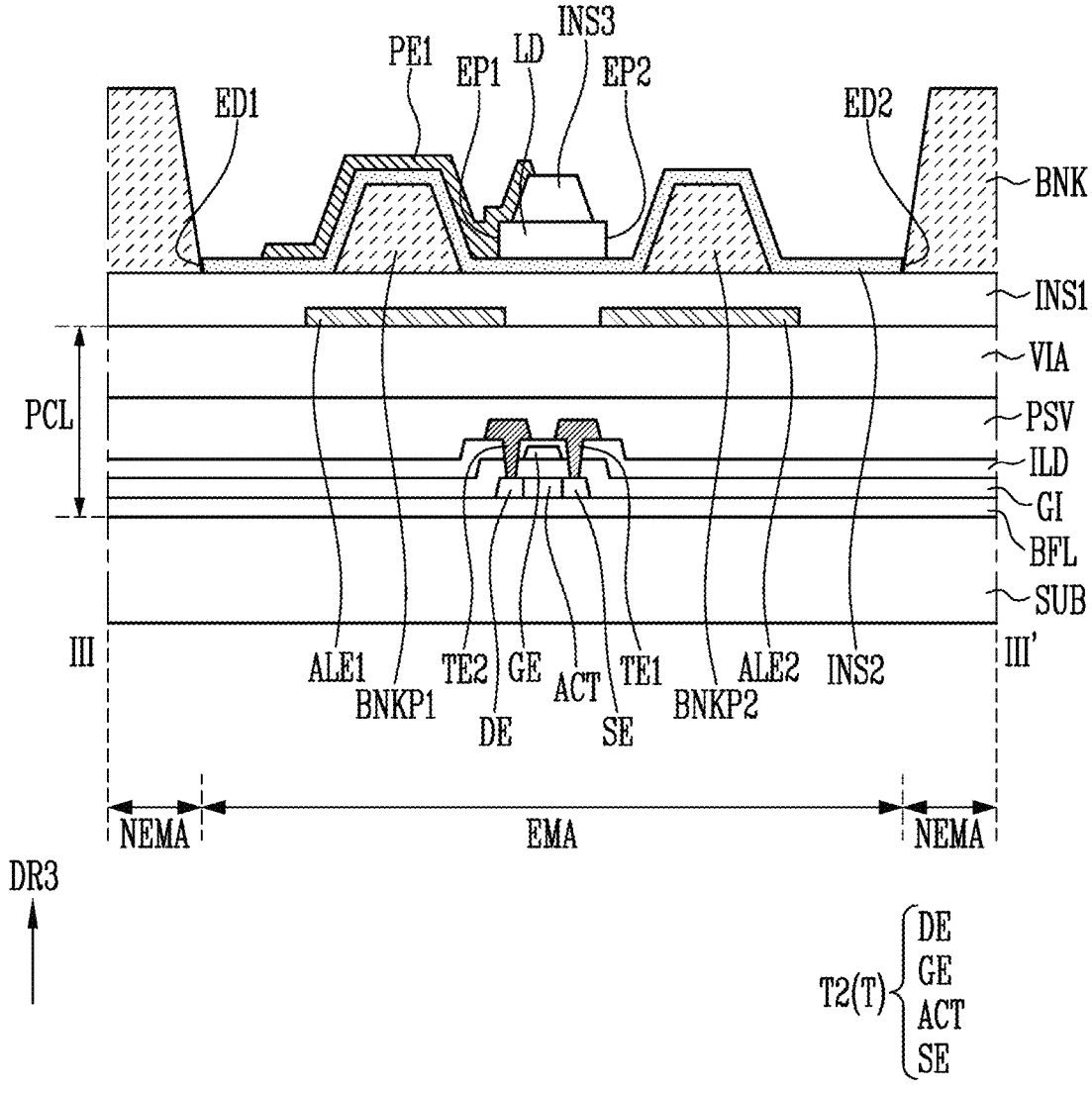
Figure 16H:
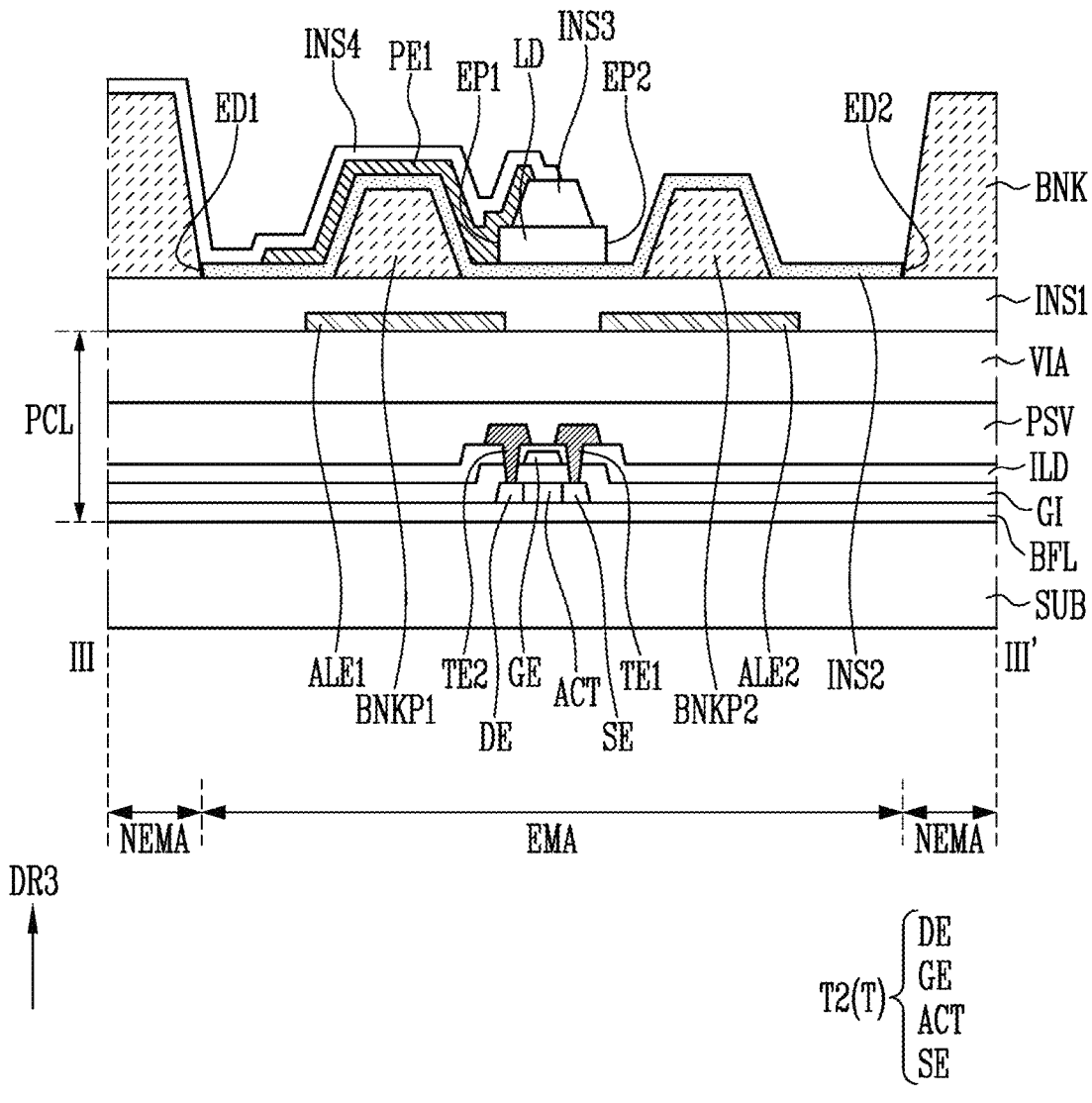
Figure 16I:
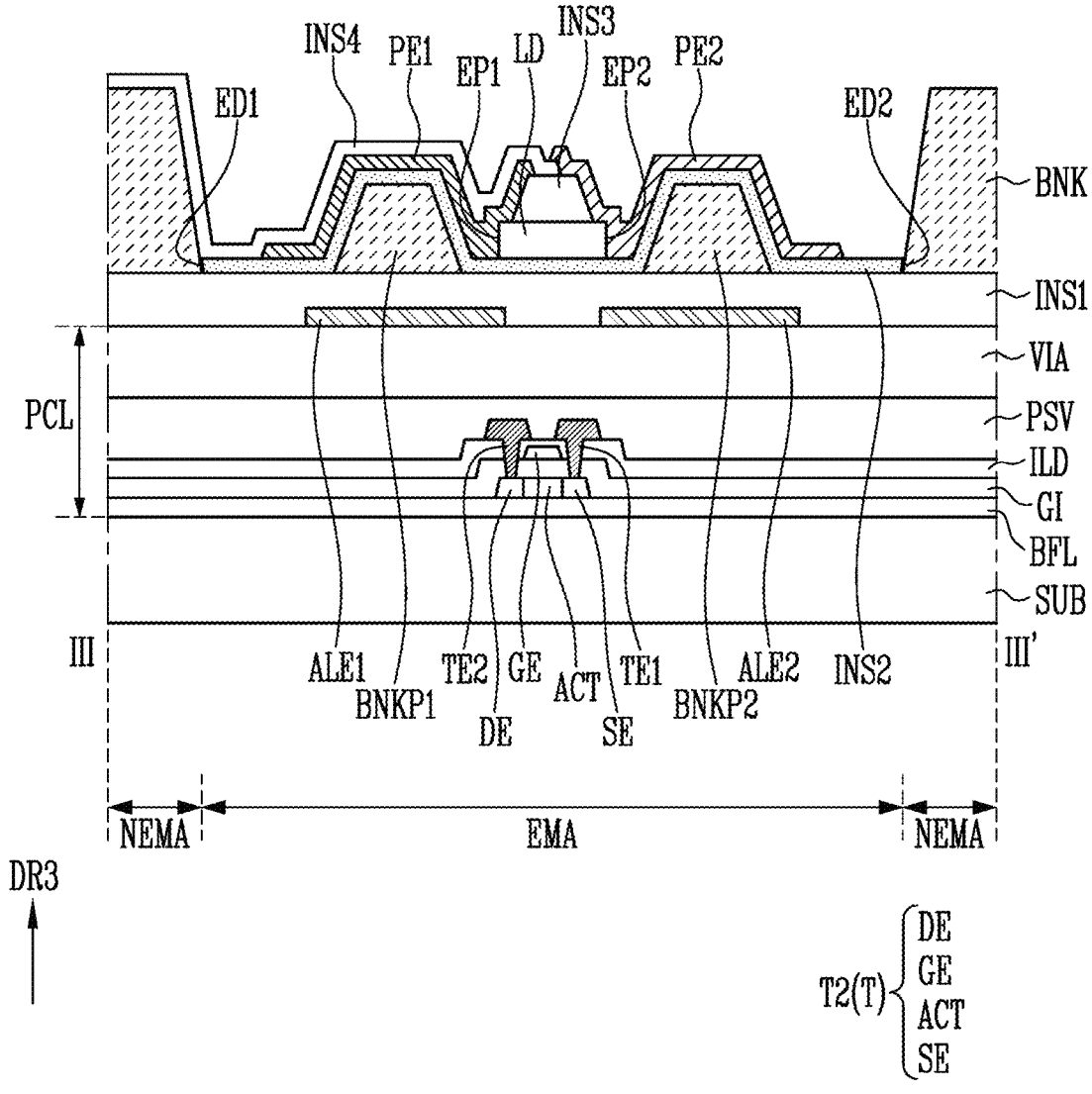

FIGS. 9A and 12 illustrate different embodiments pertaining to the shapes of the first and second pixel electrodes PE1 and PE2. For example, FIG. 9A illustrates an embodiment in which the first pixel electrode PE1 and the second pixel electrode PE2 are respectively provided on different layers. FIG. 12 illustrates an embodiment in which the first pixel electrode PE1 and the second pixel electrode PE2 are provided on an identical layer.

Although FIGS. 8 to 13B simply illustrate a pixel PXL, e.g., illustrating that each electrode is formed of an electrode having a single-layer (or single-film) structure and each insulating layer is formed of an insulating layer having a single-layer (or single-film) structure, the disclosure is not limited thereto.

Furthermore, in FIGS. 8 to 13B, a thickness-wise direction of the substrate SUB in a cross-sectional view is represented by a third direction DR3. The third direction DR3 may mean a direction indicated by the third direction DR3.

Referring to FIGS. 1 to 13B, the pixel PXL may include a substrate SUB, a pixel circuit layer PCL, and a display element layer DPL.

The pixel circuit layer PCL and the display element layer DPL may be disposed on a surface of the substrate SUB and overlap each other. For example, the display area DA of the substrate SUB may include the pixel circuit layer PCL disposed on the surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are designed to form respective separate layers and overlap each other, layout space sufficient to form each of the pixel circuit PXC and the emission part EMU in a plan view may be secured, so that a display device having high resolution and fine pitch can be easily implemented.

The substrate SUB may include transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate which includes polymer organic material. For example, the flexible substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (e.g., transistors T) for forming the pixel circuit PXC of the corresponding pixel PXL and signal lines electrically connected to the circuit elements may be disposed. Furthermore, in each pixel area PXA of the display circuit layer DPL, the alignment electrodes ALE, the light emitting elements LD, and the pixel electrodes PE that form the emission part EMU of the corresponding pixel PXL may be disposed.

The pixel circuit layer PCL may include at least one insulating layer as well as the circuit elements and the signal lines. For example, the pixel circuit layer PCL may include a buffer layer BFL, a gate insulating layer GI, an interlayer insulating layer ILD, a passivation layer PSV, and a via layer VIA which are successively stacked on the substrate SUB in the third direction DR3.

The buffer layer BFL may be provided and/or formed on the overall surface of the substrate SUB. The buffer layer BFL may prevent impurities from diffusing into a transistor T included in the pixel circuit PXC. The buffer layer BFL may be an inorganic insulating layer formed of inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single-layer structure or a multi-layer structure having at least two or more layers. In case that the buffer layer BFL has a multi-layer structure, the respective layers may be formed of a same material or different materials. The buffer layer BFL may be omitted depending on the material of the substrate SUB or processing conditions.

The pixel circuit PXC may include a first transistor T1 (or a driving transistor) configured to control driving current of the light emitting elements LD, and a second transistor T2 (or a switching transistor) electrically connected to the first transistor T1. However, the disclosure is not limited thereto. The pixel circuit PXC may further include circuit elements configured to perform other functions, as well as the first transistor T1 and the second transistor T2. In the following embodiments, the first transistor T1 and the second transistor T2 may be referred to as "transistor T" or "transistors T".

The transistors T may include a semiconductor pattern and a gate electrode GE which overlaps a portion of the semiconductor pattern. Here, the semiconductor pattern may include an active pattern ACT, a first contact area SE, and a second contact area DE. The first contact area SE may be a source area, and the second contact area DE may be a drain area.

The gate electrode GE may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

The gate insulating layer GI may be provided and/or formed on the overall surfaces of the semiconductor pattern and the buffer layer BFL. The gate insulating layer GI may be an inorganic insulating layer including inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In an embodiment, the gate insulating layer GI may be formed of an organic insulating layer including organic material. Although the gate insulating layer GI may be provided in a single-layer structure, the gate insulating layer GI may be provided in a multi-layer structure having at least two or more layers.

The active pattern ACT, the first contact area SE, and the second contact area DE each may be a semiconductor pattern formed of polysilicon, amorphous silicon, an oxide semiconductor, etc. The active pattern ACT, the first contact area SE, and the second contact area DE each may be formed of a semiconductor layer or a semiconductor layer doped or not with an impurity. For example, each of the first contact area SE and the second contact area DE may be formed of a semiconductor layer doped with an impurity. The active pattern ACT may be formed of an undoped semiconductor layer. For example, an n-type impurity may be used as the impurity, but the disclosure is not limited thereto.

The active pattern ACT may be an area which overlaps the gate electrode GE of the corresponding transistor T, and be a channel area. For example, the active pattern ACT of the first transistor T1 may overlap the gate electrode GE of the first transistor T1 and thus form a channel area of the first transistor T1. The active pattern ACT of the second transistor T2 may overlap the gate electrode GE of the second transistor T2 and thus form a channel area of the second transistor T2.

The first contact area SE of the first transistor T1 may be electrically connected to (or contact) a first end of the active pattern ACT of the corresponding transistor T. Furthermore, the first contact area SE of the first transistor T1 may be electrically connected to a bridge pattern BRP through a first connector TE1.

The first connector TE1 may be provided and/or formed on the interlayer insulating layer ILD. A first end of the first connector TE1 may be electrically and/or physically connected with the first contact area SE of the first transistor T1 through a contact hole successively passing through the interlayer insulating layer ILD and the gate insulating layer GI. Furthermore, a second end of the first connector TE1 may be electrically and/or physically connected to the bridge pattern BRP through a contact hole passing through the passivation layer PSV disposed on the interlayer insulating layer ILD. The first connector TE1 and the gate electrode GE may include a same material, or the first connector TE1 may include one or more materials selected from among materials that may be used to form the gate electrode GE as described in the disclosure.

The interlayer insulating layer ILD may be provided and/or formed on the overall surfaces of the gate electrode GE and the gate insulating layer GI. The interlayer insulating layer ILD and the gate insulating layer GI may include a same material, or the interlayer insulating layer ILD may include one or more materials selected from among materials that may be used to form the gate insulating layer GI as described in the disclosure.

The bridge pattern BRP may be provided and/or formed on the passivation layer PSV. A first end of the bridge pattern BRP may be electrically connected to the first contact area SE of the first transistor T1 by the first connector TE1. Furthermore, a second end of the bridge pattern BRP may be electrically and/or physically connected with a bottom metal layer BML through a contact hole that successively passes through the passivation layer PSV, the interlayer insulating layer ILD, the gate insulating layer GI, and the buffer layer BFL. The bottom metal layer BML and the first contact area SE of the first transistor T1 may be electrically connected to each other by the bridge pattern BRP and the first connector TE1.

The bottom metal layer BML may be a first conductive layer of the conductive layers provided on the substrate SUB. For example, the bottom metal layer BML may be a first conductive layer disposed between the substrate SUB and the buffer layer BFL. The bottom metal layer BML may be electrically connected to the first transistor T1 and thus increase a driving range of a predetermined voltage to be supplied to the gate electrode GE of the first transistor T1. For example, the bottom metal layer BML may be electrically connected to the first contact area SE of the first transistor T1 and stabilize the channel area of the first transistor T1. Furthermore, the bottom metal layer BML may be electrically connected to the first contact area SE of the first transistor T1, thus preventing the bottom metal layer BML from floating.

The second contact area DE of the first transistor T1 may be electrically connected to (or contact) a second end of the active pattern ACT of the corresponding transistor T. Furthermore, the second contact area DE of the first transistor T1 may be electrically connected to (or contact) a second connector TE2.

The second connector TE2 may be provided and/or formed on the interlayer insulating layer ILD. A first end of the second connector TE2 may be electrically and/or physically connected to the second contact area DE of the first transistor T1 through a contact hole passing through the interlayer insulating layer ILD and the gate insulating layer GI. A second end of the second connector TE2 may be electrically and/or physically connected with the first alignment electrode ALE1 of the display element layer DPL through the first contact portion CNT1 that successively passes through the via layer VIA and the passivation layer PSV. In an embodiment, the second connector TE2 may be a medium for electrically connecting the first transistor T1 of the pixel circuit layer PCL with the first alignment electrode ALE1 of the display element layer DPL.

The first contact area SE of the second transistor T2 may be electrically connected to (or contact) a first end of the active pattern ACT of the corresponding transistor T. Furthermore, although not directly illustrated in the drawings, the first contact area SE of the second transistor T2 may be electrically connected with the gate electrode GE of the first transistor T1. For example, the first contact area SE of the second transistor T2 may be electrically connected with the gate electrode GE of the first transistor T1 by another first connector TE1. The another first connector TE1 may be provided and/or formed on the interlayer insulating layer ILD.

The second contact area DE of the second transistor T2 may be electrically connected to (or contact) a second end of the active pattern ACT of the corresponding transistor T. Furthermore, although not directly illustrated in the drawings, the second contact area DE of the second transistor T2 may be electrically connected with the data line Dj. For example, the second contact area DE of the second transistor T2 may be electrically connected with the data line Dj through another second connector TE2. The another second connector TE2 may be provided and/or formed on the interlayer insulating layer ILD.

The interlayer insulating layer ILD may be provided and/or formed on the first transistor T1 and the second transistor T2.

Although in the foregoing embodiment there has been illustrated the case where each of the transistors T is a thin-film transistor having a top gate structure, the disclosure is not limited thereto. The structure of the transistors T may be changed in various ways.

The passivation layer PSV may be provided and/or formed on the transistors T and the first and second connectors TE1 and TE2.

The passivation layer (or referred to as "protective layer") PSV may be provided and/or formed on the overall surfaces of the first and second connectors TE1 and TE2 and the interlayer insulating layer ILD. The passivation layer PSV may be an inorganic insulating layer including inorganic material or an organic insulating layer including organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of polyacrylates resin, epoxy resin, phenolic resin, polyamides resin, polyimides rein, unsaturated polyesters resin, polyphenylene ethers resin, polyphenylene sulfides resin, and benzocyclobutene resin.

In an embodiment, the passivation layer PSV and the interlayer insulating layer ILD may have a same material, but the disclosure is not limited thereto. The passivation layer PSV may be provided in a single-layer structure or a multi-layer structure having at least two or more layers.

The pixel circuit layer PCL may include a power line provided and/or formed on the passivation layer PSV. For example, the power line may include the second power line PL2. The second power line PL2 and the bridge pattern BRP may be provided on a same layer. A voltage of the second driving power supply VSS may be applied to the second power line PL2. Although not directly illustrated in FIGS. 8 to 13B, the pixel circuit layer PCL may further include the first power line PL1 described with reference to FIGS. 5 and 6. The first power line PL1 and the second power line PL2 may be provided on a same layer or different layers. Although in the foregoing embodiment the second power line PL2 has been described as being provided and/or formed on the passivation layer PSV, the disclosure is not limited thereto. In an embodiment, the second power line PL2 may be provided on an insulating layer on which any of the conductive layers provided on the pixel circuit layer PCL is disposed. In other words, the location of the second power line PL2 in the pixel circuit layer PCL may be changed in various ways.

Each of the first power line PL1 and the second power line PL2 may include a conductive material (or substance). For example, each of the first power line PL1 and the second power line PL2 may have a single-layer (or single-film) structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer (or double-film) or multi-layer (or multi-film) structure formed of molybdenum (Mo), titanium (Ti), copper (Cu), aluminum (Al), or silver (Ag), which is a low-resistance material, to reduce line resistance. For instance, each of the first power line PL1 and the second power line PL2 may be formed of a double-layer (or double-film) structure formed by stacking layers in a sequence of titanium (Ti) and copper (Cu).

The first power line PL1 may be electrically connected with some components of the display element layer DPL. The second power line PL2 may be electrically connected with other components of the display element layer DPL.

The via layer VIA may be provided and/or formed on the bridge pattern BRP and the second power line PL2.

The via layer VIA may be provided and/or formed on the overall surfaces of the bridge pattern BRP, the second power line PL2, and the passivation layer PSV. The via layer VIA may have a single-layer structure including an organic layer, or a multi-layer structure having two or more layers. In an embodiment, the via layer VIA may include an inorganic layer and an organic layer disposed on the inorganic layer. In case that the via layer VIA has a multi-layer structure, the organic layer included in the via layer VIA may be located on the uppermost layer of the via layer VIA. The via layer VIA may include at least one of polyacrylates resin, epoxy resin, phenolic resin, polyamides resin, polyimides rein, unsaturated polyesters resin, polyphenylene ethers resin, polyphenylene sulfides resin, and benzocyclobutene resin.

The via layer VIA may include a first contact portion CNT1 which corresponds to the first contact portion CNT1 of the passivation layer PSV that exposes the second connector TE2 electrically connected with the first transistor T1, and a second contact portion CNT2 which exposes the second power line PL2. In an embodiment, the via layer VIA may be used as a planarization layer which mitigates a step difference caused by the components (e.g., the transistors T, the power lines, the bridge pattern BRP, etc.) disposed under the via layer VIA in the pixel circuit layer PCL.

The display element layer DPL may be provided and/or formed on the via layer VIA.

The display element layer DPL may include the alignment electrodes ALE, the bank patterns BNKP, the bank BNK, the light emitting elements LD, and the pixel electrodes PE. Furthermore, the display element layer DPL may include at least one or more insulating layers disposed between the foregoing components. For example, the display element layer DPL may include first, second, third, fourth, and fifth insulating layer INS1, INS2, INS3, INS4, and INS5.

The alignment electrodes ALE may be provided and/or formed on the via layer VIA. The alignment electrodes ALE may be disposed on an identical plane and have an identical thickness in the third direction DR3. The alignment electrodes ALE may be simultaneously formed by an identical process.

The alignment electrodes ALE may be formed of material having a predetermined (or uniform) reflectivity to allow light emitted from the light emitting elements LD to travel in an image display direction (or a frontal direction) of the display device. For example, the alignment electrodes ALE may be formed of conductive material (or substance). The conductive material may include opaque metal that has an advantage in reflecting, in the image display direction of the display device, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the foregoing embodiment. In an embodiment, the alignment electrodes ALE may include transparent conductive material (or substance). The transparent conductive material (or substance) may include transparent conductive oxides such as indium tin oxide (ITO), indium zinc oxide (IZO), zinc oxide ($ZnO_x$), indium gallium zinc oxide (IGZO), and indium tin zinc oxide (ITZO), and a conductive polymer such as poly(3,4-ethylenedioxythiophene) (PEDOT). In case that the alignment electrodes ALE include transparent conductive material (or substance), a separate conductive layer formed of opaque metal for reflecting light emitted from the light emitting elements LD in the image display direction of the display device may be added. However, the material of the alignment electrodes ALE is not limited to the foregoing materials.

Each of the alignment electrodes ALE may be provided and/or formed to have a single-layer structure, but the disclosure is not limited thereto. In an embodiment, each of the alignment electrodes ALE may be provided and/or formed in a multilayer structure formed by stacking at least two materials among metals, alloys, conductive oxides, and conductive polymers. Each of the alignment electrodes ALE may be formed of a multi-layer structure including at least two layers to minimize distortion resulting from a signal delay in case that signals (or voltages) are transmitted to the opposite ends EP1 and EP2 of the respective light emitting elements LD. For example, each of the alignment electrodes ALE may have a multi-layer structure which selectively further includes at least one among at least one reflective electrode layer, at least one transparent electrode layer disposed over and/or under the reflective electrode layer, and/or at least one conductive capping layer configured to cover (or overlap) an upper portion of the transparent electrode layer.

As described above, in case that the alignment electrodes ALE are formed of conductive material having a constant reflectivity, light emitted from the opposite ends of each of the light emitting elements LD, for example, the first and second ends EP1 and EP2, may more reliably travel in the image display direction of the display device.

The first alignment electrode ALE1 may be electrically connected with the first transistor T1 of the pixel circuit layer PCL through the first contact portion CNT1. The second alignment electrode ALE2 may be electrically connected with the second power line PL2 of the pixel circuit layer PCL through the second contact portion CNT2.

The first insulating layer INS1 may be provided and/or formed on the alignment electrodes ALE.

The first insulating layer INS1 may be provided and/or formed on the overall surfaces of the alignment electrodes ALE and the via layer VIA. The first insulating layer INS1 may be partially open in at least the non-emission area NEMA so that components disposed thereunder can be exposed. For example, as illustrated in FIG. 13A, the first insulating layer INS1 may be partially open to include a first contact hole CH1 which is formed by removing an area of the first insulating layer INS1 in at least the non-emission area NEMA and exposes a portion of the first alignment electrode ALE1, and a second contact hole CH2 which is formed by removing another area of the first insulating layer INS1 in at least the non-emission area NEMA and exposes a portion of the second alignment electrode ALE2. The at least non-emission area NEMA may be the second opening OP2 of the bank BNK that is the electrode separation area, but the disclosure is not limited thereto.

The first insulating layer INS1 may be an organic layer including organic material. For example, the first insulating layer INS1 may be formed of an organic layer which has an advantage in mitigating a step difference caused by components, e.g., the first and second alignment electrodes ALE1 and ALE2, disposed thereunder, and planarizing a support surface of the light emitting elements LD. Since the first insulating layer INS1 is formed of an organic layer, a surface (or an upper surface) of the first insulating layer INS1 may have a planar profile (or surface).

As described above, the first insulating layer INS1 formed of an organic layer may be provided on the via layer VIA formed of an organic layer and contact the via layer VIA.

In an embodiment, the first insulating layer INS1 may be selectively provided in at least a portion of the non-emission area NEMA, e.g., the second opening OP2 of the bank BNK (or the electrode separation area). For example, as illustrated in FIGS. 13A, the first insulating layer INS1 may be disposed on the first and second alignment electrodes ALE1 and ALE2 in the second opening OP2 of the bank BNK, and may include the first contact hole CH1 that exposes a portion of the first alignment electrode ALE1, and the second contact hole CH2 that exposes a portion of the second alignment electrode ALE2. For instance, the first insulating layer INS1 may not be provided in the second opening OP2 of the bank BNK (or may be omitted). In this case, as illustrated in FIG. 13B, the second insulating layer INS2 may be provided and/or formed on the first and second alignment electrodes ALE1 and ALE2. The second insulating layer INS2 in the second opening OP2 of the bank BNK may be partially open to include the first contact hole CH1 that exposes a portion of the first alignment electrode ALE1, and the second contact hole CH2 that exposes a portion of the second alignment electrode ALE2. The first pixel electrode PE1 may be electrically connected with the first alignment electrode ALE1 through the first contact hole CH1 of the second insulating layer INS2. The second pixel electrode PE2 may be electrically connected with the second alignment electrode ALE2 through the second contact hole CH2 of the second insulating layer INS2.

Since the first insulating layer INS1 formed of an organic layer is disposed on the alignment electrode ALE, it is problematic in that the display quality varies depending on a thickness d2 of the first insulating layer INS1. For example, if the thickness d2 of the first insulating layer INS1 is increased to a predetermined level or higher, the support surface of the light emitting elements LD in the emission area EMA may be planarized so that the light emitting elements LD can be prevented from being removed from the aligned positions, but the first and second contact holes CH1 and CH2 may not be correctly or properly formed because of the first insulating layer INS1 having the increased thickness d2 in the second opening OP2 (or the electrode separation area) of the bank BNK, whereby contact failure between the alignment electrode ALE and the pixel electrode PE may occur. If the thickness d2 of the first insulating layer INS1 is less than the predetermined level, the degree to which the alignment electrode ALE is exposed to a developing solution which is used during a process for forming the first and second contact holes CH1 and CH2 (e.g., a patterning process or the like of the first insulating layer INS1) is increased in the second opening OP2 of the bank BNK, so that failure (e.g., galvanic corrosion) of the alignment electrode ALE may occur, and the support surface of the light emitting elements LD may not be planarized in the emission area EMA, whereby the light emitting elements LD may be removed from the aligned positions.

In an embodiment, the first insulating layer INS1 having an optimized thickness d2 (or a second thickness) capable of preventing the foregoing problems may be designed. In detail, the first insulating layer INS1 may be designed to have a thickness d2 equal to or greater than three times a thickness d1 (or a first thickness) of the first and second alignment electrodes ALE1 and ALE2 disposed thereunder. For example, a ratio of the thickness d1 (or the first thickness) of the alignment electrode ALE and the thickness d2 (or the second thickness) of the first insulating layer INS1 may be about 1:3 or more. For example, in case that the thickness d1 of the alignment electrode ALE is about 2000 Å, the thickness d2 of the first insulating layer INS1 may be about 6000 Å or more.

In case that the first insulating layer INS1 is designed to satisfy the foregoing conditions, the support surface of the light emitting elements LD may be planarized in the emission area EMA so that the light emitting elements LD can be prevented from being removed from the aligned positions. Furthermore, in the second opening OP2 (or the electrode separation area) of the bank BNK, contact failure between the alignment electrode ALE and the pixel electrode PE may be prevented from occurring, and the time for which the alignment electrode ALE is exposed to the developing solution that is used during the process of forming the first and second contact holes CH1 and CH2 may be reduced, so that a failure in the alignment electrode ALE can be prevented from occurring.

The bank BNK and the bank pattern BNKP may be provided and/or formed on the first insulating layer INS1.

The bank BNK may be provided and/or formed on the first insulating layer INS1 in at least the non-emission area NEMA. The bank BNK may be formed between other pixels PXL to enclose the emission area EMA of the pixel PXL, so that a pixel defining layer for defining the emission area EMA of the corresponding pixel PXL may be formed. At the step of supplying the light emitting elements LD to the emission area EMA, the bank BNK may be a dam structure configured to prevent a solution (or ink) mixed with the light emitting elements LD from being drawn or introduced into the emission area EMA of an adjacent pixel PXL or control the amount of solution such that a constant amount of solution is supplied to each emission area EMA.

The bank pattern BNKP may be provided and/or formed on the first insulating layer INS1 on the alignment electrodes ALE. The bank pattern BNKP may include a first bank pattern BNKP1 and a second bank pattern BNKP2. The first bank pattern BNKP1 may be provided and/or formed on the first insulating layer INS1 and correspond to the first alignment electrode ALE1. The second bank pattern BNKP2 may be provided and/or formed on the first insulating layer INS1 and correspond to the second alignment electrode ALE2.

The bank pattern BNKP may be formed of an organic layer (or an organic insulating layer) including organic material. The bank pattern BNKP may be provided on the first insulating layer INS1 formed of an organic layer and contact the first insulating layer INS1. Furthermore, the bank pattern BNKP may be electrically connected with the bank BNK formed of an organic layer through the first insulating layer INS1. In an embodiment, the bank pattern BNKP and the bank BNK may be formed by a same process and provided on a same layer, but the disclosure is not limited thereto. In an embodiment, the bank pattern BNKP and the bank BNK may be formed different processes.

The bank pattern BNKP may have a trapezoidal cross-section a width of which is reduced upward from a surface (e.g., an upper surface) of the first insulating layer INS1 in the third direction DR3, but the disclosure is not limited thereto. In an embodiment, as illustrated in FIG. 11, the bank pattern BNKP may include a curved surface having a cross-sectional shape such as a semi-elliptical shape or a semi-circular shape (or a hemispherical shape) a width of which is reduced upward from a surface of the first insulating layer INS1 in the third direction DR3. In a sectional view, the shape of the bank pattern BNKP may be changed in various ways rather than being limited to that of the foregoing embodiments.

As described above, the via layer VIA, the first insulating layer INS1, the bank pattern BNKP that are formed of an organic layer may contact each other, thus forming an organic stacked structure ORS. The organic stacked structure ORS may be directly electrically connected to (contact) the bank BNK formed of an organic layer. Hence, outgas generated from the organic stacked structure ORS may be discharged (or emitted) to the bank BNK. In an embodiment, the bank BNK may discharge the outgas generated from the organic layers included in the pixel PXL so that the components of the pixel PXL (e.g., the display element layer DPL) can be prevented from deteriorating due to the outgas that remains in the organic layer.

The second insulating layer INS2 may be provided and/or formed on the bank pattern BNKP.

The second insulating layer INS2 may be provided and/or formed on the bank pattern BNKP and the first insulating layer INS1 in the emission area EMA.

The second insulating layer INS2 may be formed of an inorganic layer (or an inorganic insulating layer) made of inorganic material. For example, the second insulating layer INS2 may be formed of an inorganic insulating layer having an advantage in protecting the light emitting elements LD from the pixel circuit layer PCL. For example, the second insulating layer INS2 may include at least one of metal oxides such as silicon nitride (SiN$_x$), silicon oxide (SiO$_x$), silicon oxynitride (SiO$_x$N$_y$), and aluminum oxide (AlO$_x$).

In an embodiment, the second insulating layer INS2 may be provided to have a single-layer or multi-layer structure. In case that the second insulating layer INS2 has a multi-layer structure, the second insulating layer INS2 may have a distributed Bragg reflector (DBR) structure formed by alternately stacking first layers and second layers which are formed of inorganic layers and have different refractive indexes. In an embodiment, since the second insulating layer INS2 is provided on the bank pattern BNKP, the second insulating layer INS2 may have a surface profile corresponding to the shape of the bank pattern BNKP. As described above, in case that the second insulating layer INS2 has a DBR structure, the second insulating layer INS2 may be used as a reflector configured to guide light emitted from the light emitting elements LD in a desired direction so that the light efficiency of the pixel PXL can be enhanced.

In an embodiment, the ends (or the edges) ED1 and ED2 of the second insulating layer INS2 may contact the sidewalls of the bank BNK. For example, one end ED1 of the second insulating layer INS2 may contact a sidewall of the bank BNK that is adjacent to the first bank pattern BNKP1, and another end ED2 of the second insulating layer INS2 may contact another sidewall of the bank BNK that is adjacent to the second bank pattern BNKP2. In this case, the second insulating layer INS2 may correspond to the first opening OP1 of the bank BNK.

However, the disclosure is not limited thereto. In an embodiment, the second insulating layer INS2 may be disposed on the bank BNK, so that the ends ED1 and ED2 of the second insulating layer INS2 may be disposed in at least non-emission area NEMA. In this case, as illustrated in FIG. 9B, the second insulating layer INS2 may be partially disposed on the bank BNK so that the bank BNK and the second insulating layer INS2 may partially overlap each other.

In an embodiment, the ends ED1 and ED2 of the second insulating layer INS2 may be disposed between the bank BNK and the bank pattern BNKP and be spaced apart from the bank BNK. For example, as illustrated in FIG. 10, the end ED1 of the second insulating layer INS2 may be disposed between a sidewall of the bank BNK and the first bank pattern BNKP1, and the another end ED2 of the second insulating layer INS2 may be disposed between another sidewall of the bank BNK and the second bank pattern BNKP2. In this case, the second insulating layer INS2 may be disposed in the first opening OP1 of the bank BNK.

The second insulating layer INS2 may not overlap the bank BNK, or may partially overlap the bank BNK rather than completely overlapping the bank BNK. The second insulating layer INS2 may be disposed in at least the emission area EMA such that the second insulating layer INS2 does not completely overlap the bank BNK, and may be disposed in a portion of the non-emission area NEMA. Since the second insulating layer INS2 formed of an inorganic layer is disposed in only the emission area EMA without completely overlapping the bank BNK or is disposed in only a portion of the non-emission area NEMA, the organic stacked structure ORS and the bank BNK may be extended to each other, so that outgas generated from the organic stacked structure ORS can be discharged to the bank BNK without being blocked by the second insulating layer INS2.

The light emitting elements LD may be supplied to and aligned in the emission area EMA of the pixel PXL in which the second insulating layer INS2 is formed. For example, the light emitting elements LD may be supplied (or input) to the emission area EMA by an inkjet printing method or the like. The light emitting elements LD may be aligned between the alignment electrodes ALE by an electric field formed by a signal (or an alignment signal) applied to each of the alignment electrodes ALE. For example, the light emitting elements LD may be aligned on the second insulating layer INS2 between the first bank pattern BNKP1 on the first alignment electrode ALE1 and the second bank pattern BNKP2 on the second alignment electrode ALE2.

In the emission area EMA, the third insulating layer INS3 may be provided and/or formed on each of the light emitting elements LD. The third insulating layer INS3 may be provided and/or formed on the light emitting elements LD to partially cover the outer circumferential surface (or the surface) of each of the light emitting elements LD such that the first end EP1 and the second end EP2 of each of the light emitting elements LD are exposed to the outside.

The third insulating layer INS3 may have a single-layer or multi-layer structure and include an inorganic layer (an inorganic insulating layer) including at least one inorganic material or an organic layer (or an organic insulating layer) including at least one organic material. The third insulating layer INS3 may include an inorganic layer that has an advantage in protecting the active layer 12 (see FIG. 1) of each of the light emitting elements LD from external oxygen, water, etc. However, the disclosure is not limited thereto. The third insulating layer INS3 may be formed of an organic layer including organic material, depending on design conditions, etc., of the display device to which the light emitting elements LD are applied. Since the third insulating layer INS3 is formed on the light emitting elements LD after the alignment of the light emitting elements LD in the pixel area PXA (or the emission area EMA) of the pixel PXL has been completed, the light emitting elements LD may be prevented from being removed from the aligned positions.

The pixel electrodes PE may be disposed, in at least the emission area EMA, on the light emitting elements LD, the third insulating layer INS3 provided on the light emitting elements LD, and the second insulating layer INS2 provided on the bank patterns BNKP.

In at least the emission area EMA, the first pixel electrode PE1 may be disposed on the first end EP1 of the light emitting element LD, the third insulating layer INS3 provided on the light emitting element LD, and the second insulating layer INS2 provided on the first bank pattern BNKP1. The first pixel electrode PE1 may contact the first alignment electrode ALE1 through the first contact hole CH1.

In at least the emission area EMA, the second pixel electrode PE2 may be disposed on the second end EP2 of the light emitting element LD, the third insulating layer INS3 provided on the light emitting element LD, and the second insulating layer INS2 provided on the second bank pattern BNKP2. The second pixel electrode PE2 may contact the second alignment electrode ALE2 through the second contact hole CH2.

The first pixel electrode PE1 and the second pixel electrode PE2 may be disposed on the third insulating layer INS3 on the light emitting elements LD and spaced apart from each other.

The first pixel electrode PE1 and the second pixel electrode PE2 may be formed of various transparent conductive materials to allow light emitted from each of the light emitting elements LD to travel in the image display direction of the display device without optical loss. For example, the first pixel electrode PE1 and the second pixel electrode PE2 may include at least one of various transparent conductive materials (or substances) including indium tin oxide (ITO), indium zinc oxide (IZO), zinc oxide (ZnO$_x$), indium gallium zinc oxide (IGZO), and indium tin zinc oxide (ITZO), and may be substantially transparent or translucent to satisfy a predetermined transmittancy (or transmittance). The materials of the first pixel electrode PE1 and the second pixel electrode PE2 are not limited to those of the foregoing embodiments. In an embodiment, the first pixel electrode PE1 and the second pixel electrode PE2 may also be formed of various opaque conductive materials (substances). The first pixel electrode PE1 and the second pixel electrode PE2 each may have a single-layer structure or a multi-layer structure.

In an embodiment, the first pixel electrode PE1 and the second pixel electrode PE2 may be provided on different layers. In this case, the fourth insulating layer INS4 may be provided and/or formed between the first pixel electrode PE1 and the second pixel electrode PE2. The fourth insulating layer INS4 may be provided on the first pixel electrode PE1 and cover (or overlap) the first pixel electrode PE1 (or prevent the first pixel electrode PE1 from being exposed to the outside), thus preventing corrosion or the like of the first pixel electrode PE1 from being caused. The fourth insulating layer INS4 may include an inorganic insulating layer made of inorganic material, or an organic insulating layer made of organic material. For example, the fourth insulating layer INS4 may include at least one of silicon nitride (SiN$_x$), silicon oxide (SiO$_x$), silicon oxynitride (Si-O$_x$N$_y$), and metal oxide such as aluminum oxide (AlO$_x$), but the disclosure is not limited thereto. The fourth insulating layer INS4 may have a single-layer or multi-layer structure.

The fourth insulating layer INS4 may be selectively provided. For example, as illustrated in FIG. 12, in case that the first pixel electrode PE1 and the second pixel electrode PE2 are formed by an identical process and provided on an identical layer, the fourth insulating layer INS4 may be omitted. In other words, in case that the first pixel electrode PE1 and the second pixel electrode PE2 are formed by an identical process and disposed on the third insulating layer INS3 at positions spaced apart from each other, the fourth insulating layer INS4 configured to cover the first pixel electrode PE1 may be omitted, and the fifth insulating layer INS5 may be disposed on the first and second pixel electrodes PE1 and PE2 to cover the first and second pixel electrodes PE1 and PE2.

The second pixel electrode PE2 may be disposed on an area of the fourth insulating layer INS4, the third insulating layer INS3, the second end EP2 of each of the light emitting elements LD, and the second insulating layer INS2.

The fifth insulating layer INS5 may be provided and/or formed on the first pixel electrode PE1 and the second pixel electrode PE2. The fifth insulating layer INS5 may be an inorganic layer (an inorganic insulating layer) including inorganic material or an organic layer (an organic insulating layer) including organic material. For example, the fifth insulating layer INS5 may have a structure formed by alternately stacking at least one inorganic layer and at least one organic layer. The fifth insulating layer INS5 may cover the entirety of the display element layer DPL and prevent water or moisture from being drawn or introduced into the display element layer DPL including the light emitting elements LD from the outside.

In an embodiment, at least one overcoat layer (e.g., a layer for planarizing the upper surface of the display element layer DPL) may be further disposed over the fifth insulating layer INS5. In an embodiment, an upper substrate may be further disposed on the fifth insulating layer INS5. An embodiment in which the upper substrate is disposed on the fifth insulating layer INS5 will be described below with reference to FIGS. 17 and 18.

In the foregoing embodiment, the first insulating layer INS1 formed of an organic layer is disposed on the alignment electrodes ALE to prevent a gap from being formed due to a step difference between the alignment electrodes ALE, thus mitigating short-circuit failure of the pixel electrodes PE.

In the foregoing embodiment, the first insulating layer INS1 formed of an organic layer and having a planar surface is disposed on the alignment electrodes ALE so that the pixel electrodes PE disposed on the first insulating layer INS1 can be prevented from being affected by a step difference between the alignment electrodes ALE, whereby each of the pixel electrodes PE can be prevented from short-circuiting due to the step difference between the alignment electrodes ALE.

Furthermore, in the foregoing embodiment, the organic stacked structure ORS formed of an organic layer and the bank BNK formed of an organic layer are connected or extended to each other so that outgas generated from the organic stacked structure ORS is discharged to the bank BNK. Hence, a process of forming a separate passage for discharging outgas may be omitted. In other words, in the foregoing embodiment, outgas generated from the organic stacked structure ORS can be discharged to the bank BNK without a separate outgas discharge passage.

Moreover, in the foregoing embodiment, during the printing process using an inkjet printing method, the light emitting elements LD are supplied (or input) onto the second insulating layer INS2 formed of a hydrophilic inorganic layer, so that ink including the light emitting elements LD may be supplied to the end of the second insulating layer INS2, and ink capacity in the pixel PXL (or the pixel area PXA) can be increased. Therefore, the number of light emitting elements LD which may be aligned in the pixel PXL can be increased, so that the number of valid light sources of the pixel PXL can be further increased, whereby the light output efficiency of the pixel PXL can be enhanced.

Furthermore, the ink capacity in the pixel PXL may be increased, so that the efficiency of the printing process can be enhanced.

In the display device described above, a structure in which the first insulating layer INS1 formed of an organic layer and the second insulating layer INS2 formed of an inorganic layer are stacked may be disposed under the light emitting elements LD. Hence, the flow rate (or the magnitude) of an electric field formed between the alignment electrodes ALE may be relatively increased only in an area between the first bank pattern BNKP1 and the second bank pattern BNKP2 while being reduced in the other areas. Therefore, the light emitting elements LD input to the pixel PXL by the above-mentioned printing process may be aligned only in the area between the first bank pattern BNKP1 and the second bank pattern BNKP2 and prevented from being aligned in the other areas, so that removal of the light emitting elements LD can be reduced. In other words, the light emitting elements LD may be aligned with each other only in a target area (the area between the first bank pattern BNKP1 and the second bank pattern BNKP2) so that abnormal alignment that the light emitting elements LD are aligned in an undesired area can be prevented from occurring.

Furthermore, according to the above-mentioned embodiment, the light emitting elements LD are aligned intensively in the area between the first bank pattern BNKP1 and the second bank pattern BNKP2, so that contact failure between each of the light emitting elements LD and the pixel electrodes PE electrically connected to the light emitting elements LD may be mitigated or minimized.

Furthermore, according to the embodiment described above, the first insulating layer INS1 formed of an organic layer is disposed on the alignment electrodes ALE to cover (or overlap) the alignment electrodes ALE, so that during an etching process (e.g., a dry etching process) which is performed when the second and third insulating layers INS2 and INS3 are formed, damage to the alignment electrodes ALE may be minimized, and the reliability of the alignment electrodes ALE may be enhanced.

Hereinafter, an embodiment and comparative examples pertaining to the flow rate of an electric field formed by the alignment electrodes ALE in the pixel PXL will be described with reference to FIGS. 14 and 15.

Figure 14:
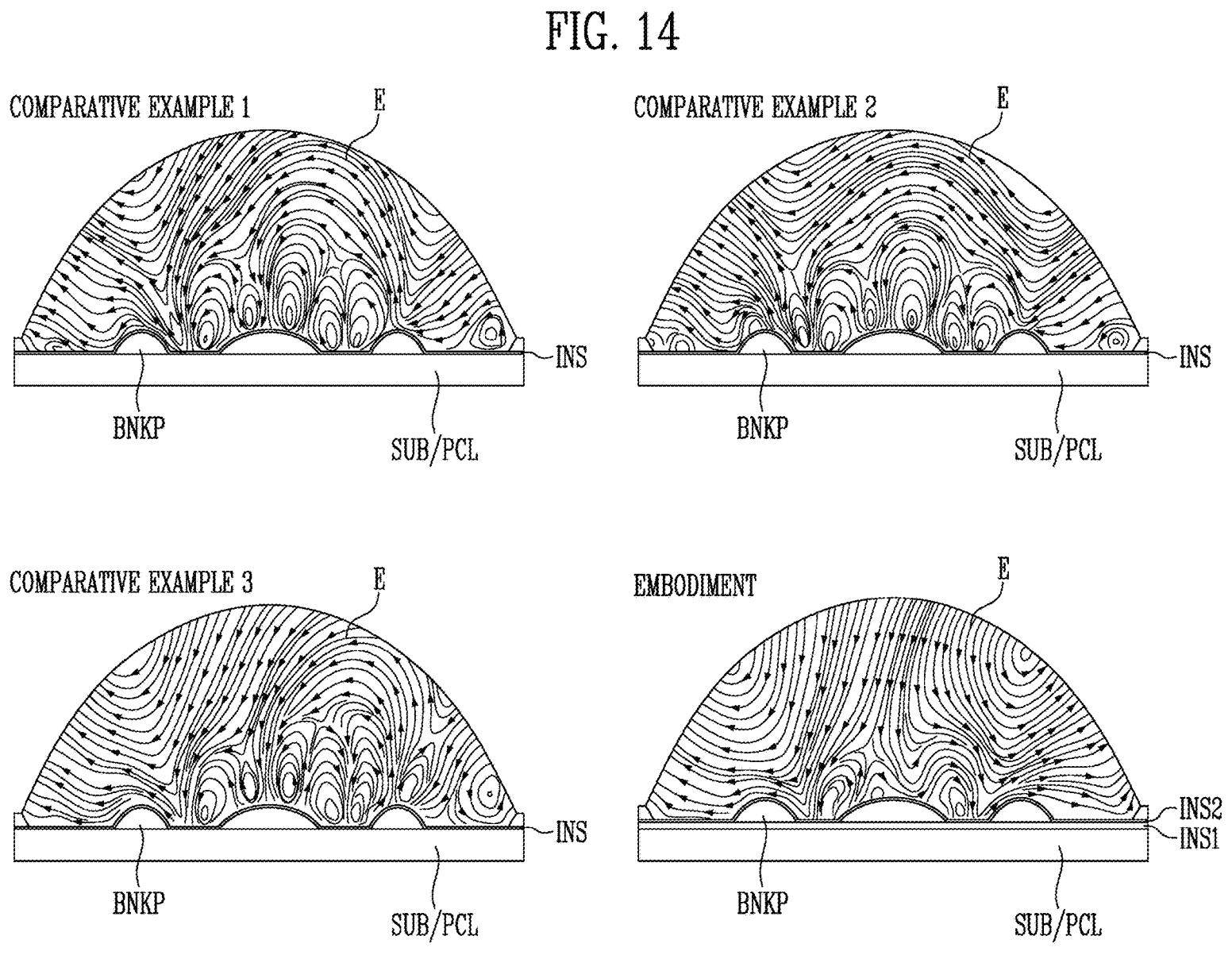
Figure 15:
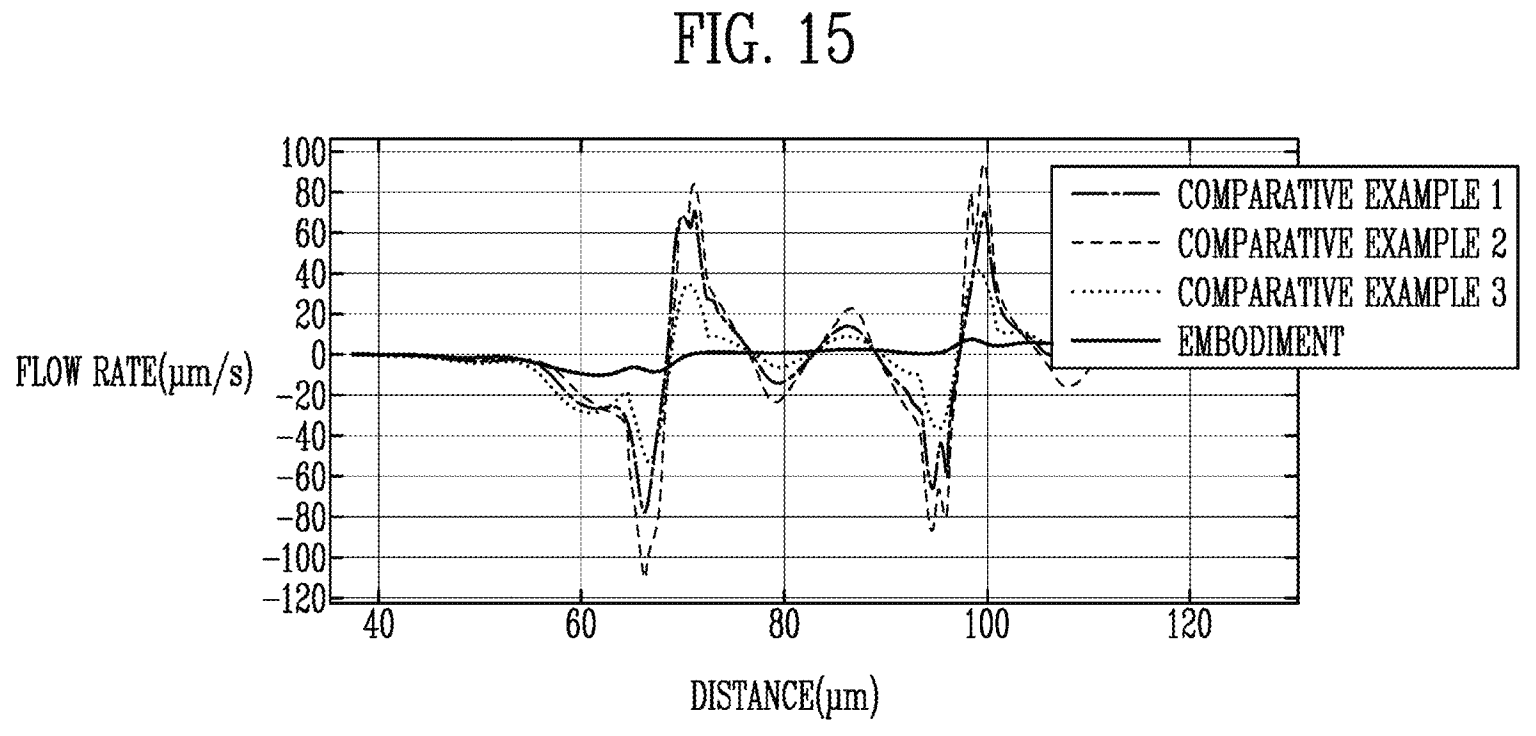

FIGS. 14 and 15 are schematic views illustrating results of a simulation of comparing electric field flow rates of comparative example 1, comparative example 2, comparative example 3, and an embodiment.

Referring to FIGS. 14 and 15, comparative example 1 refers to the case where an insulating layer INS formed of silicon oxide ($SiO_x$) and having a thickness of about 3000 Å is formed on the bank pattern BNKP formed on the substrate SUB (or the pixel circuit layer PCL). Comparative example 2 refers to the case where an insulating layer INS formed of silicon nitride ($SiN_x$) and having a thickness of about 3000 Å is formed on the bank pattern BNKP formed on the substrate SUB (or the pixel circuit layer PCL). Comparative example 3 refers to the case where an insulating layer INS, formed by alternately stacking four times first layers each formed of silicon nitride ($SiN_x$) and having a thickness of about 580 Å and second layers each formed of silicon oxide ($SiO_x$) and having a thickness of about 760 Å, is formed on the bank pattern BNKP formed on the substrate SUB (or the pixel circuit layer PCL). The embodiment refers to the case where a first insulating layer INS1 formed of polyacrylate and having a thickness of about 15000 Å is formed on the bank pattern BNKP formed on the substrate SUB (or the pixel circuit layer PCL), and a second insulating layer INS2 formed of silicon oxide ($SiO_x$) and having a thickness of about 3000 Å is formed on the first insulating layer INS1.

For the sake of explanation, illustration of the alignment electrodes disposed between the substrate SUB (or the pixel circuit layer PCL) and the bank pattern BNKP is omitted.

In a graph shown in FIG. 15, an X-axis refers to a distance from a left end of the substrate SUB (or the pixel circuit layer PCL) to a right end thereof in each of the comparative examples and the embodiment illustrated in FIG. 14, and a Y-axis refers to the flow rate (μm/s) of an electric field E formed by the alignment electrodes in each of the comparative examples and the embodiment. Among numerals written on the X-axis of the graph of FIG. 15, 80 (μm/s) refers to a point at which a second bank pattern BNKP from the left of the substrate SUB is located in each of the comparative examples and the embodiment.

Referring to FIGS. 14 and 15, it can be checked that, in the case of the embodiment, an electric field E having a relatively low flow rate compared to that of comparative examples 1 to 3 is formed not only in the area between the bank patterns BNKP but also in the other areas. In the case of the embodiment, it can be checked that an electric field E having a relatively high flow rate is formed in the area between the bank patterns BNKP, and an electric field E having a relatively low flow rate is formed in areas other than the area between the bank patterns BNKP.

Furthermore, an overall average flow rate (μm/s) of the electric field E formed in comparative example 1 is measured as being about 6.285. An overall average flow rate (μm/s) of the electric field E formed in comparative example 2 is measured as being about 7.489. An overall average flow rate (μm/s) of the electric field E formed in comparative example 3 is measured as being about 5.342. An overall average flow rate (μm/s) of the electric field E formed in the embodiment is measured as being about 2.048. As described above, in the embodiment, in case that the light emitting elements LD (see FIG. 7) are aligned on the structure formed by stacking the second insulating layer INS2 made of an inorganic layer (e.g., silicon oxide ($SiO_x$)) on the first insulating layer INS1 made of an organic layer (e.g., polyacrylate), the light emitting elements LD may be disposed in only the area formed between the bank patterns BNKP and having a relatively high flow rate in the electric field E without being disposed in the other areas having a relatively low flow rate in the electric field E. Therefore, in the case of the embodiment, the light emitting elements LD can be aligned intensively in only the target area, and abnormal alignment failure in which light emitting elements LD are aligned in an undesired area can be prevented from occurring, so that material loss resulting from removal of light emitting elements LD from the aligned positions can be reduced.

FIGS. 16A to 16I are cross-sectional views schematically illustrating a method of fabricating the pixel illustrated in FIG. 9A.

Hereinafter, the method of fabricating the pixel PXL in accordance with an embodiment shown in FIG. 9A will be sequentially described with reference to FIGS. 16A to 16I.

Herein, there is illustrated the case where the steps of fabricating the pixel PXL are sequentially performed according to the sectional views, but without changing the spirit of the disclosure, some steps illustrated as being successively performed may be simultaneously performed, the sequence of the steps may be changed, some steps may be skipped, or another step may be further included between the steps.

The description with reference to FIGS. 16A to 16I will be focused on differences from the above-mentioned embodiments so as to avoid repetitive descriptions.

Referring to FIGS. 7 to 9A and 16A, the pixel circuit layer PCL is formed on the substrate SUB. The pixel circuit layer PCL may include the buffer layer BFL, at least one transistor T, the passivation layer PSV, and the via layer VIA.

The first alignment electrode ALE1 and the second alignment electrode ALE2 spaced apart from each other may be formed on the via layer VIA of the pixel circuit layer PCL.

Referring to FIGS. 7 to 9A, 16A, and 16B, the first insulating layer INS1 having a planar surface is formed on the first and second alignment electrodes ALE1 and ALE2.

The first insulating layer INS1 may be an organic layer including organic material. The first insulating layer INS1 may be partially open to allow each of the first alignment electrode ALE1 and the second alignment electrode ALE2 to be exposed in at least the non-emission area NEMA. For example, the first insulating layer INS1 may be partially open in at least the non-emission area NEMA to include the first contact hole CH1 that exposes a portion of the first alignment electrode ALE1, and the second contact hole CH2 that exposes a portion of the second alignment electrode ALE2.

The first insulating layer INS1 formed of an organic layer may have a planar surface and mitigate a step difference formed by the first and second alignment electrodes ALE1 and ALE2 disposed thereunder.

Referring to FIGS. 7 to 9A and 16A to 16C, the first and second bank patterns BNKP1 and BNKP2 and the bank BNK are formed on the first insulating layer INS1.

The first and second bank patterns BNKP1 and BNKP2 may be disposed on the first insulating layer INS1 of at least the emission area EMA to be spaced apart from each other. The bank BNK may be disposed on the first insulating layer INS1 in the non-emission area NEMA.

In an embodiment, the first bank pattern BNKP1, the second bank pattern BNKP2, and the bank BNK may be formed of an organic layer including organic material and contact the first insulating layer INS1 formed of an organic layer.

The bank BNK may contact the via layer VIA, the first insulating layer INS1, and the first and second bank patterns BNKP1 and BNKP2 that are formed of organic layers, and may be used as an outlet for discharging outgas generated from the organic layers.

Referring to FIGS. 7 to 9A and 16A to 16D, the second insulating layer INS2 is formed on the first and second bank patterns BNKP1 and BNKP2 and the first insulating layer INS1.

The second insulating layer INS2 may be formed of an inorganic layer including inorganic material. In an embodiment, the ends ED1 and ED2 of the second insulating layer INS2 may contact the sidewalls of the bank BNK and may not overlap the bank BNK, but the disclosure is not limited thereto. In an embodiment, the second insulating layer INS2 may be disposed on a portion of the bank BNK and partially overlap the bank BNK.

Referring to FIGS. 7 to 9A and 16A to 16E, an electric field is formed between the first alignment electrode ALE1 and the second alignment electrode ALE2 by respectively applying corresponding alignment signals to the first and second alignment electrodes ALE1 and ALE2.

Thereafter, with the electric field formed, ink including light emitting elements LD is input to the pixel area PXA of the pixel PXL by an inkjet printing method or the like. For example, at least one inkjet nozzle may be disposed on the second insulating layer INS2, and ink mixed with light emitting elements LD may be input to the pixel area PXA of the pixel PXL through the inkjet nozzle. The method of supplying the light emitting elements LD to the pixel area PXA is not limited to the foregoing embodiment. The method of supplying the light emitting elements LD may be changed in various ways.

In case that the second insulating layer INS2 formed as an inorganic layer contacts the sidewall of the bank BNK or partially overlap the bank BNK, the ink capacity of the pixel area PXA may increase due to hydrophilic properties of the inorganic layer. Hence, the amount of ink supplied to the pixel area PXA may be increased.

In the structure in which the first insulating layer INS1 formed of an organic layer and the second insulating layer INS2 formed of an inorganic layer are stacked, if the first and second alignment electrodes ALE1 and ALE2 are respectively supplied with corresponding alignment signals, an electric filed having a relatively high flow rate may be formed only between the first bank pattern BNKP1 and the second bank pattern BNKP2.

In case that the light emitting elements LD are input to the pixel area PXA, self-alignment of the light emitting elements LD on the second insulating layer INS2 between the first bank pattern BNKP1 and the second bank pattern BNKP2 may be induced.

After the light emitting elements LD are self-aligned, a solvent included in the ink may be removed by a volatilization method or other methods.

Referring to FIGS. 7 to 9A and 16A to 16F, after the light emitting elements LD are aligned in the pixel area PXA (or the emission area EMA), the third insulating layer INS3 may be formed on the light emitting elements LD. The third insulating layer INS3 may cover at least a portion of a surface (e.g., an upper surface in the third direction 3) of each of the light emitting elements LD and allow the opposite ends EP1 and EP2 of each of the light emitting elements LD other than the active layer 12 (see FIG. 1) from being exposed to the outside. The third insulating layer INS3 may fix the light emitting elements LD and prevent the light emitting elements LD from being removed from the aligned positions.

During the process of forming the third insulating layer INS3 such that each pixel PXL can be driven independently or individually from pixels PXL adjacent thereto, a portion of the first alignment electrode ALE1 may be removed from the second opening OP2 of the bank BNK that is an electrode separation area. Hence, each first alignment electrode ALE1 may be electrically and/or physically separated from the first alignment electrodes ALE1 provided in the adjacent pixels PXL disposed on a same pixel column. In an embodiment, during the above-mentioned process, a portion of the second alignment electrode ALE2 may also be removed from the second opening OP2 of the bank BNK and electrically and/or physically separated (or disconnected) from the second alignment electrodes ALE2 provided in the adjacent pixels PXL.

Referring to FIGS. 7 to 9A and 16A to 16G, the first pixel electrode PE1 is formed on the third insulating layer INS3, the respective first ends EP1 of the light emitting elements LD, and the second insulating layer INS2 on the first bank pattern BNKP1.

The first pixel electrode PE1 may be electrically and/or physically connected with the first alignment electrode ALE1 through the first contact hole CH1 of the first insulating layer INS1 in the non-emission area NEMA.

Referring to FIGS. 7 to 9A and 16A to 16H, the fourth insulating layer INS4 is formed on the first pixel electrode PE1. In an embodiment, the fourth insulating layer INS4 may be an inorganic layer including inorganic material. The fourth insulating layer INS4 may cover the first pixel electrode PE1 and allow the respective second end EP2 of the light emitting elements LD and the second insulating layer INS2 on the second bank pattern BNKP2 to be exposed.

Referring to FIGS. 7 to 9A and 16A to 16I, the second pixel electrode PE2 is formed on the exposed second insulating layer INS2.

The second pixel electrode PE2 may be electrically and/or physically connected with the second alignment electrode ALE2 through the second contact hole CH2 of the first insulating layer INS1 in the non-emission area NEMA.

The fifth insulating layer INS5 is formed on the second pixel electrode PE2. The fifth insulating layer INS5 may entirely cover the second pixel electrode PE2 and components disposed thereunder and protect the second pixel electrode PE2 and the components.

Figure 17:
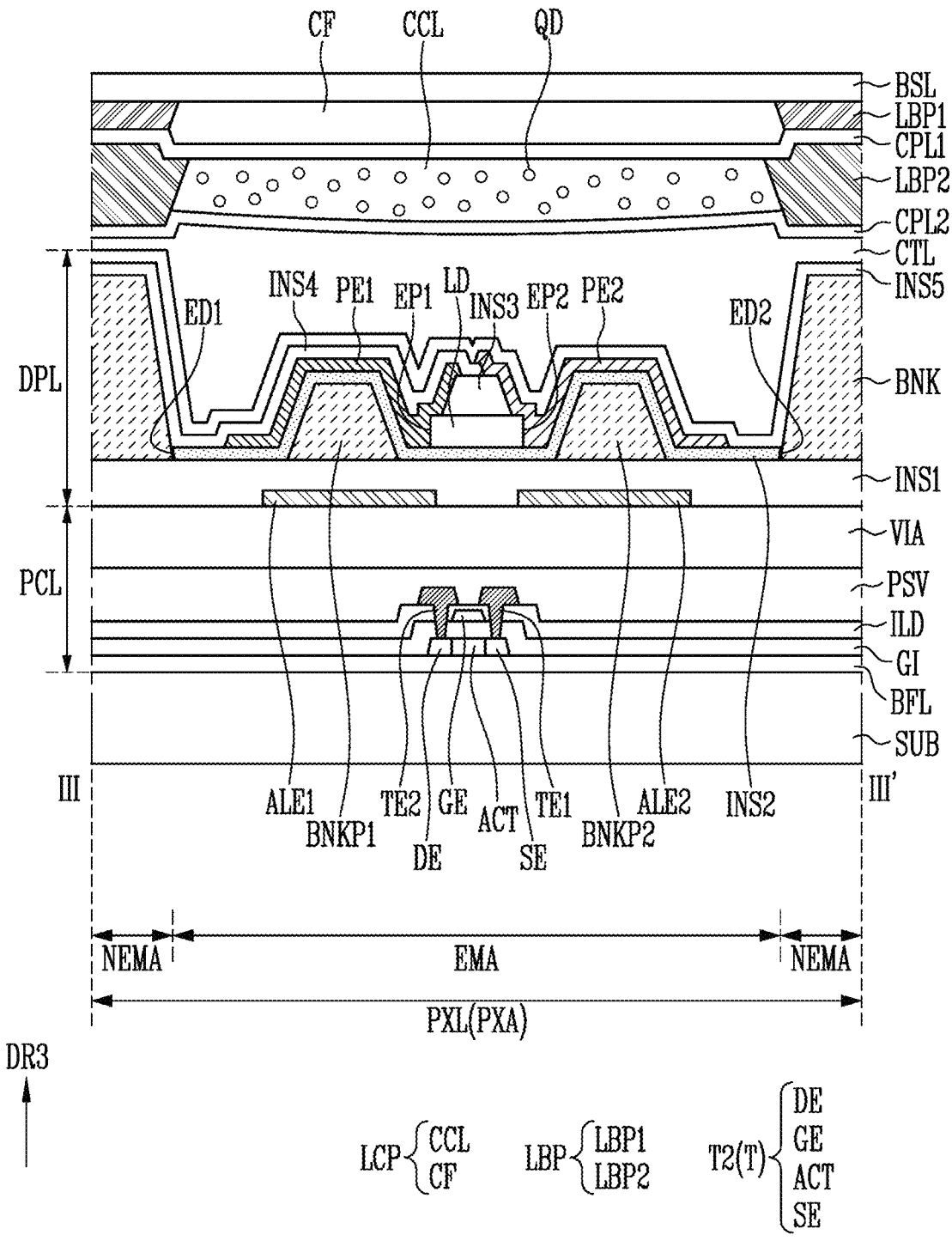
FIGS. 17 and 18 illustrate schematically a pixel in accordance with an embodiment, and are cross-sectional views corresponding to line III-III' of FIG. 7.
Figure 18:
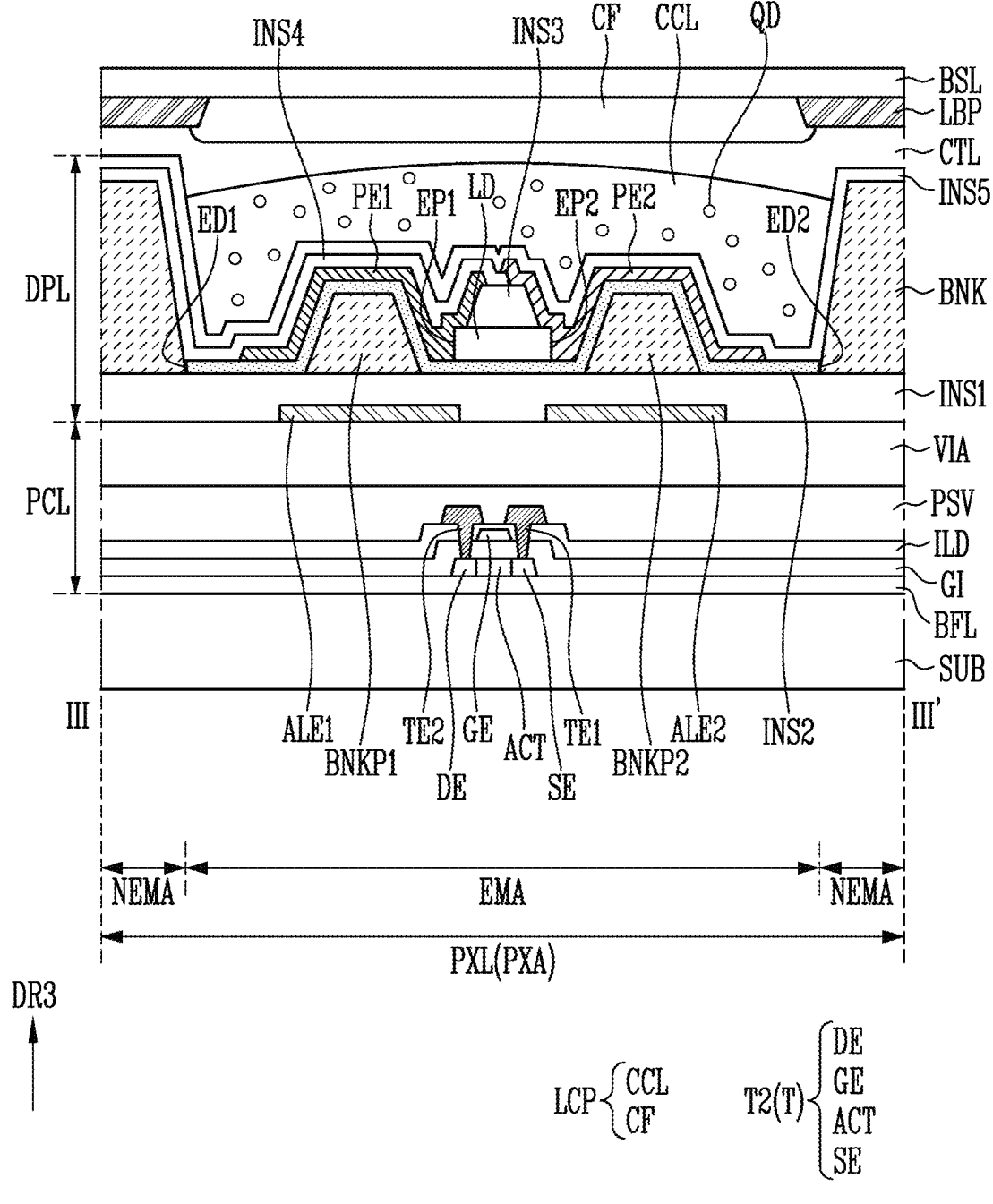

FIGS. 17 and 18 illustrate schematically the pixel PXL in accordance with an embodiment, and are schematic cross-sectional views corresponding to line III-III' of FIG. 7.

The pixel PXL illustrated in each of FIGS. 17 and 18 may have a configuration different from that of the pixel PXL of FIG. 9A at least in that a light conversion pattern layer LCP is disposed on the display element layer DPL.

The embodiments of FIGS. 17 and 18 refer to different embodiments pertaining to the position of the light conversion pattern layer LCP. For example, FIG. 17 illustrates an embodiment in which an upper substrate including the light conversion pattern layer LCP is disposed on the display element layer DPL by an adhesive process using an adhesive layer. FIG. 18 illustrates an embodiment in which some components of the light conversion pattern layer LCP are formed on the display element layer DPL by successive processes.

Therefore, the following description with reference to FIGS. 17 and 18 will be focused on differences from that of the foregoing embodiments, to avoid repetitive descriptions.

Referring to FIGS. 7 and 17, the upper substrate may be provided on the display element layer DPL of the pixel PXL.

The upper substrate may be provided on the display element layer DPL to cover the pixel area PXA. The upper substrate may be used as a window component and/or an encapsulation substrate of the display device.

An intermediate layer CTL may be provided and/or formed between the upper substrate and the display element layer DPL.

The intermediate layer CTL may be a transparent adhesive layer (or a transparent bonding layer), e.g., an optically clear adhesive layer, for enhancing the adhesive force between the display element layer DPL and the upper substrate, but the disclosure is not limited thereto. In an embodiment, the intermediate layer CTL may be a refractive index conversion layer configured to change the refractive index of light emitted from the light emitting elements LD toward the upper substrate and enhance light output luminance of each pixel PXL.

The upper substrate may include a base layer BSL, a light conversion pattern layer LCP, and a light block pattern LBP. Furthermore, the upper substrate may include a first capping layer CPL1 and a second capping layer CPL2.

The base layer BSL may be a rigid or flexible substrate, and the material or properties thereof are not particularly limited. The base layer BSL and the substrate SUB may be formed of a same material, or different materials.

The light conversion pattern layer LCP may be disposed on a surface of the base layer BSL and correspond to the emission area EMA of the pixel PXL. The light conversion pattern layer LCP may include a color conversion layer CCL and a color filter CF which correspond to a predetermined color.

The color conversion layer CCL may include color conversion particles QD corresponding to a predetermined color. The color filter CF may allow a predetermined color of light to selectively pass therethrough.

The color conversion layer CCL may be disposed on one surface of the first capping layer CPL1 to face the light emitting element LD, and may include color conversion particles QD which convert a first color of light emitted from the light emitting element LD to a second color of light. For example, in case that the pixel PXL is a red pixel (or a red sub-pixel), the color conversion layer CCL may include color conversion particles QD formed of red quantum dots which convert a first color of light emitted from the light emitting elements LD to a second color of light, e.g., red light. For example, in case that the pixel PXL is a green pixel (or a green sub-pixel), the color conversion layer CCL of the corresponding pixel PXL may include color conversion particles QD formed of green quantum dots which convert a first color of light emitted from the light emitting elements LD to a second color of light, e.g., green light. For example, in case that the pixel PXL is a blue pixel (or a blue sub-pixel), the color conversion layer CCL of the corresponding pixel PXL may include color conversion particles QD formed of blue quantum dots which convert a first color of light emitted from the light emitting elements LD to a second color of light, e.g., blue light. In an embodiment, in case that the pixel PXL is a blue pixel (or a blue sub-pixel), there may be provided a light scattering layer having light scattering particles, in place of the color conversion layer CCL having the color conversion particles QD. For example, in case that the light emitting elements LD emit blue-based light, the pixel PXL may include a light scattering layer including light scattering particles. The light scattering layer may be omitted depending on embodiments. In an embodiment, in case that the pixel PXL is a blue pixel (or a blue sub-pixel), a transparent polymer may be provided in place of the color conversion layer CCL.

The color filter CF may be disposed on a surface of the base layer BSL to face the light emitting element LD. The color filter CF may allow a specific color of light to selectively pass therethrough. The color filter CF along with the color conversion layer CCL may form the light conversion pattern layer LCP and include color filter material which allows a specific color of light converted by the color conversion layer CCL to selectively pass therethrough. The color filter CF may include one of a red color filter, a green color filter, and a blue color filter.

The light conversion pattern layer LCP including the color conversion layer CCL and the color filter CF may be disposed in the emission area EMA of the pixel PXL and correspond to the light emitting element LD.

The first capping layer CPL1 may be provided and/or formed between the color filter CF and the color conversion layer CCL.

The first capping layer CPL1 may be disposed on the color filter CF and cover the color filter CF, thus protecting the color filter CF. The first capping layer CPL1 may be an inorganic insulating layer including inorganic material or an organic insulating layer including organic material.

The light block pattern LBP may be disposed adjacent to the light conversion pattern layer LCP. In an embodiment, the light block pattern LBP may be disposed on one surface of the base layer BSL and correspond to the non-emission area NEMA of the pixel PXL. The light block pattern LBP may correspond to the bank BNK of the display element layer DPL.

The light block pattern LBP may include a first light block pattern LBP1 and a second light block pattern LBP2.

The first light block pattern LBP1 may be disposed on one surface of the base layer BSL and located adjacent to the color filter CF. The first light block pattern LBP1 may include at least one black matrix material (e.g., at least one light shielding material) among different kinds of black matrix materials, and/or a color filter material having a specific color.

In an embodiment, the first light block pattern LBP1 may be provided in the form of a multi-layer structure formed by overlapping at least two color filters allowing different colors of light to selectively pass therethrough, among a red color filter, a green color filter, and a blue color filter. For example, the first light block pattern LBP1 may be provided in the form of a structure including a red color filter, a green color filter disposed on the red color filter and overlapping the red color filter, and a blue color filter disposed on the green color filter and overlapping the green color filter. In other words, the first light block pattern LBP1 may be provided in the form of a structure formed by successively stacking the red color filter, the green color filter, and the blue color filter. In this case, in the non-emission area NEMA of the pixel area PXA, the red color filter, the green color filter, and the blue color filter may be used as the first light block pattern LBP1 for blocking transmission of light.

The first capping layer CPL1 may be provided and/or formed on the first light block pattern LBP1. The first capping layer CPL1 may be disposed on overall surfaces of the first light block pattern LBP1 and the color filter CF.

The second light block pattern LBP2 may be provided and/or formed on one surface of the first capping layer CPL1 and correspond to the first light block pattern LBP1. The second block pattern LBP2 may be a black matrix. The first light block pattern LBP1 and the second light block pattern LBP2 may include a same material. In an embodiment, the second light block pattern LBP2 may be a structure for ultimately defining the emission area EMA of the pixel PXL. For example, at the step of supplying the color conversion layer CCL including color conversion particles QD, the second light block pattern LBP2 may be a dam structure which ultimately defines the emission area EMA to which the color conversion layer CCL is to be supplied.

The upper substrate may further include the second capping layer CPL2 which is formed on overall surfaces of the color conversion layer CCL and the second light block pattern LBP2.

The second capping layer CPL2 may include at least one of silicon nitride ($SiN_x$), silicon oxide ($SiO_x$), silicon oxynitride ($SiO_xN_y$), and metal oxide such as aluminum oxide ($AlO_x$), but the disclosure is not limited thereto. In an embodiment, the second capping layer CPL2 may be formed of an organic layer (or an organic insulating layer) including organic material. The second capping layer CPL2 may be disposed on the color conversion layer CCL and protect the color conversion layer CCL from external water or moisture so that the reliability of the color conversion layer CCL can be enhanced.

The upper substrate may be disposed on the intermediate layer CTL and electrically connected with the display element layer DPL. To this end, the intermediate layer CTL may include a transparent adhesive layer (or a transparent bonding layer) for enhancing adhesive force between the display element layer DPL and the upper substrate.

As described above, in the display device in accordance with an embodiment, the light conversion pattern layer LCP may be disposed on the light emitting element LD so that light having excellent color reproducibility can be emitted through the light conversion pattern layer LCP, whereby the light output efficiency of the display device can be enhanced.

Although in the foregoing embodiment there has been described that the upper substrate including the light conversion pattern layer LCP is formed on the display element layer DPL, the disclosure is not limited thereto.

In an embodiment, some components (e.g., the color conversion layer CCL) of the light conversion pattern layer LCP may be formed on the one surface of the substrate SUB on which the pixel PXL is provided, and another component (e.g., the color filter CF) of the light conversion pattern layer LCP may be provided to face some components with the intermediate layer CTL interposed therebetween. In detail, as illustrated in FIG. 18, the color conversion layer CCL may be formed on the substrate SUB on which the pixel PXL is provided. The color filter CF may be formed on one surface of the base layer BSL with the intermediate layer CTL interposed therebetween.

In the case of the foregoing embodiment, the color conversion layer CCL may be provided and/or formed on the fifth insulating layer INS5 in a shape such that an area enclosed by the bank BNK is filled with the color conversion layer CCL.

An intermediate layer CTL may be disposed on the color conversion layer CCL. The intermediate layer CTL may be at least one insulating layer, but the disclosure is not limited thereto. In an embodiment, the intermediate layer CTL may be the intermediate layer CTL described with reference to FIG. 17.

A base layer BSL including a color filter CF and a light block pattern LBP may be provided and/or formed on the intermediate layer CTL.

The color filter CF and the light block pattern LBP may be disposed on one surface of the base layer BSL and face the color conversion layer CCL and the bank BNK with the intermediate layer CTL interposed therebetween. For example, the color filter CF may face the color conversion layer CCL with the intermediate layer CTL interposed therebetween. The light block pattern LBP may face the bank BNK with the intermediate layer CTL interposed therebetween.

The light block pattern LBP may correspond to the non-emission area NEMA of the pixel PXL. The color filter CF may correspond to the emission area EMA of the pixel PXL.

The light block pattern LBP may include light block material for preventing light leakage failure in which light (or rays) leaks between the pixel PXL and pixels PXL adjacent thereto. In this case, the light block pattern LBP may have a black matrix. The light block pattern LBP may prevent different colors of light emitted from respective adjacent pixels PXL from being mixed. The light block pattern LBP may be a component corresponding to the first light block pattern LBP1 described with reference to FIG. 17.

Although in the foregoing embodiment there has been described that the color conversion layer CCL and the color filter CF are formed to face each other with the intermediate layer CTL interposed therebetween, the disclosure is not limited thereto. In an embodiment, the light conversion pattern layer LCP including the color conversion layer CCL and the color filter CF may be formed on one surface of the substrate SUB on which the pixel PXL is provided.

Figure 19:
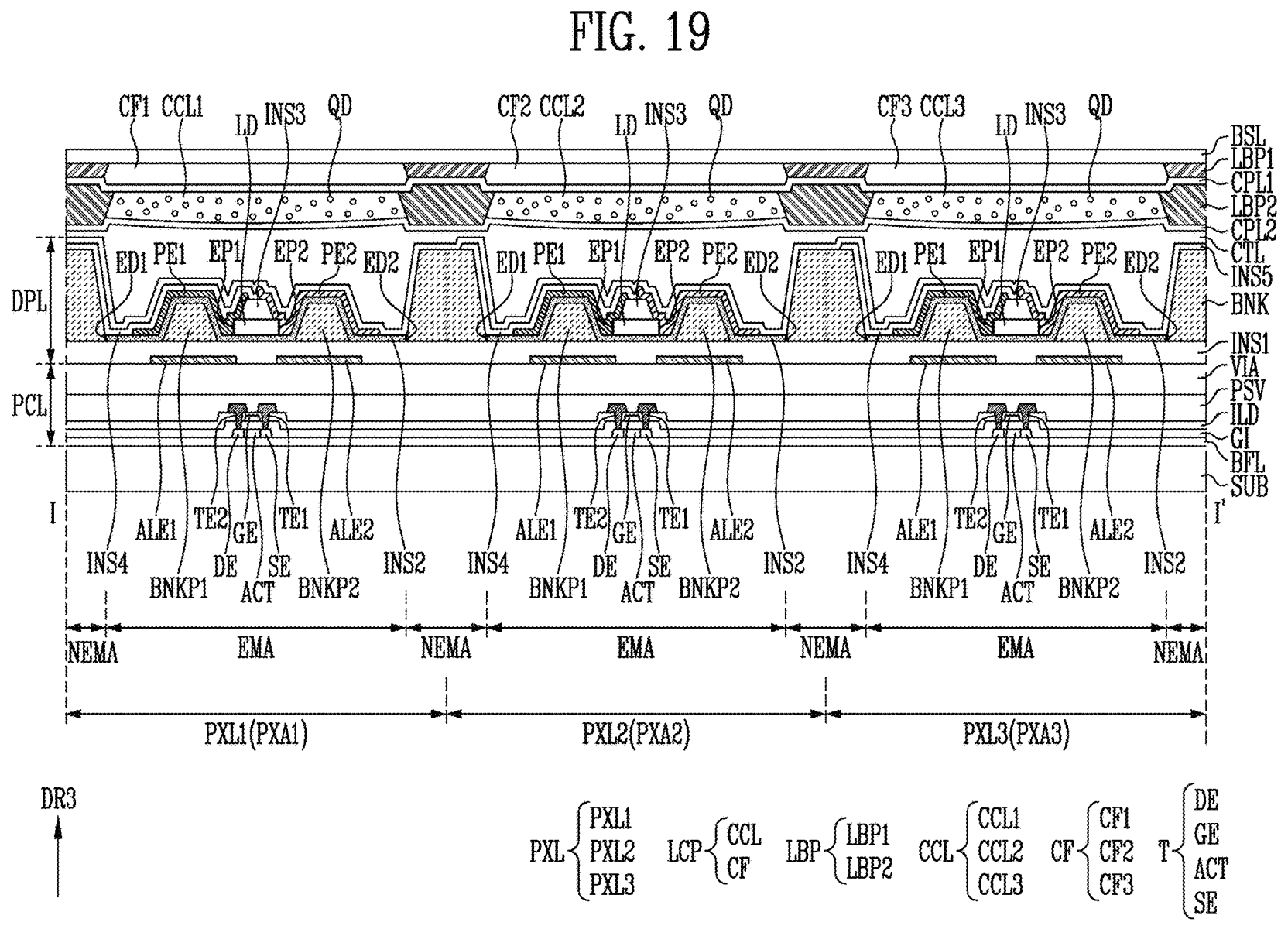

FIG. 19 is a schematic cross-sectional view taken along line I-I' of FIG. 4.

To avoid repetitive descriptions, the description of the first to third pixels PXL1 to PXL3 of FIG. 19 will be focused on differences from those of the foregoing embodiments. Components which are not separately explained in an embodiment may comply with those of the foregoing embodiments. The same reference numeral will be used to designate the same component, and a similar reference numeral will be used to designate a similar component.

For the sake of explanation, FIG. 19 illustrates only some components of each of the first to third pixels PXL1 to PXL3.

Referring to FIGS. 4 and 19, a first pixel PXL1 (or a first sub-pixel), a second pixel PXL2 (or a second sub-pixel), and a third pixel PXL3 (or a third sub-pixel) may be arranged in a direction. Each of the first to third pixels PXL1, PXL2, and PXL3 and the pixel PXL described with reference to FIGS. 7 to 13B may have a same configuration.

The display area DA of the substrate SUB may include a first pixel area PXA1 in which the first pixel PXL1 is provided, a second pixel area PXA2 in which the second pixel PXL2 is provided, and a third pixel area PXA3 in which the third pixel PXL3 is provided. In an embodiment, the first pixel PXL1 may be a red pixel, the second pixel PXL2 may be a green pixel, and the third pixel PXL3 may be a blue pixel. However, the disclosure is not limited thereto. In an embodiment, the second pixel PXL2 may be a red pixel, the first pixel PXL1 may be a green pixel, and the third pixel PXL3 may be a blue pixel. As another example, the third pixel PXL3 may be a red pixel, the first pixel PXL1 may be a green pixel, and the second pixel PXL2 may be a blue pixel.

Each of the first, second, and third pixels PXL1, PXL2, and PXL3 may include an emission area EMA. Furthermore, each of the first, second, and third pixels PXL1, PXL2, and PXL3 may include a non-emission area NEMA adjacent to the emission area EMA of the corresponding pixel PXL. A bank BNK may be disposed in the non-emission area NEMA.

Each of the first, second, and third pixels PXL1, PXL2, and PXL3 may include the substrate SUB, a pixel circuit layer PCL, and a display element layer DPL.

The pixel circuit layer PCL of each of the first, second, and third pixels PXL1, PXL2, and PXL3 may include a buffer layer BFL, at least one transistor T provided on the buffer layer BFL, a passivation layer PSV provided on the transistor T, and a via layer VIA provided on the passivation layer PSV. The via layer VIA may be formed of an organic layer.

The display element layer DPL of each of the first, second, and third pixels PXL1, PXL2, and PXL3 may include first and second alignment electrodes ALE1 and ALE2, a first insulating layer INS1, first and second bank patterns BNKP1 and BNKP2, a bank BNK, a second insulating layer INS2, at least one light emitting element LD, a third insulating layer INS3, first and second pixel electrodes PE1 and PE2, and fourth and fifth insulating layers INS4 and INS5.

An upper substrate including a light conversion pattern layer LCP and a light block pattern LBP may be disposed on the display element layer DPL of the first pixel PXL1. The light conversion pattern layer LCP of the first pixel PXL1 may include a first color conversion layer CCL1 and a first color filter CF1. The first color conversion layer CCL1 may include color conversion particles QD including red quantum dots for converting light emitted from the light emitting element LD into red light. The first color filter CF1 may be a red color filter.

An upper substrate including a light conversion pattern layer LCP and a light block pattern LBP may be disposed on the display element layer DPL of the second pixel PXL2. The light conversion pattern layer LCP of the second pixel PXL2 may include a second color conversion layer CCL2 and a second color filter CF2. The second color conversion layer CCL2 may include color conversion particles QD including green quantum dots for converting light emitted from the light emitting element LD into green light. The second color filter CF2 may be a green color filter.

An upper substrate including a light conversion pattern layer LCP and a light block pattern LBP may be disposed on the display element layer DPL of the third pixel PXL3. The light conversion pattern layer LCP of the third pixel PXL3 may include a third color conversion layer CCL3 and a third color filter CF3. The third color conversion layer CCL3 may include color conversion particles QD including blue quantum dots for converting light emitted from the light emitting element LD into blue light. In an embodiment, the third pixel PXL3 may include a light scattering layer including light scattering particles, in lieu of the third color conversion layer CCL3.

In the foregoing embodiment, in each of the first, second, and third pixels PXL1, PXL2, and PXL3, the first insulating layer INS1 formed of an organic layer is disposed on the first and second alignment electrodes ALE1 and ALE2, so that a failure attributable to a step difference (or height difference) between the first and second alignment electrodes ALE1 and ALE2 can be prevented from occurring. Furthermore, in the foregoing embodiment, each of the first, second, and third pixels PXL1, PXL2, and PXL3 may be designed such that the via layer VIA, the first insulating layer INS1, and the first and second bank patterns BNKP1 and BNKP2 that are formed of organic layers are electrically connected to the bank BNK, and the second insulating layer INS2 formed of an inorganic layer does not completely overlap the bank BNK. Accordingly, outgas generated from the organic layers can be discharged to the bank BNK without using a separate outgas discharge passage.

An embodiment of the disclosure may provide a display device and a method of fabricating the display device, in which a first insulating layer formed of an organic layer is disposed on alignment electrodes so that a failure attributable to a step difference between the alignment electrodes can be mitigated, and the reliability of the display device can be enhanced.

Furthermore, an embodiment of the disclosure may provide a display device and a method of fabricating the display device, in which a second insulating layer formed of an inorganic layer is disposed on the first insulating layer so that in each pixel, the capacity of ink in which light emitting elements are dispersed can be enhanced.

Furthermore, in an embodiment of the disclosure, because of a structure in which the first insulating layer formed of an organic layer and the second insulating layer formed of an inorganic layer are stacked in a display element layer, the light emitting elements may be prevented from being aligned in areas other than a target area, so that removal of the light emitting elements can be reduced.

In addition, an embodiment of the disclosure may provide a display device and a method of fabricating the display device, in which a via layer of a pixel circuit layer including an organic layer, and the first insulating layer, bank patterns, and a bank of the display element layer each may be designed to be electrically connected to (or contact) a component disposed thereover and/or thereunder and including an organic layer, so that outgas generated from the organic layers can be discharged to the bank, whereby a process for forming a separate outgas discharge (or emitting) passage (or path) can be omitted.

The effects of an embodiment of the disclosure are not limited by the foregoing, and other various effects are anticipated herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the disclosure must be defined by the accompanying claims.

What is claimed is:

1. A display device comprising:
a plurality of pixels disposed on a substrate, wherein each of the plurality of pixels comprises:
   a via layer disposed on the substrate and formed of an organic layer;
   first and second alignment electrodes disposed on the via layer and spaced apart from each other;
   a first insulating layer disposed on the first and the second alignment electrodes, overlapping the first and the second alignment electrodes in a plan view, and having a planar surface;
   a first bank pattern disposed on the first insulating layer on the first alignment electrode;
   a second bank pattern disposed on the first insulating layer on the second alignment electrode;
   a second insulating layer disposed on and directly contacting the first and the second bank patterns;
   at least one light emitting element disposed on the second insulating layer between the first bank pattern and the second bank pattern;
   a first electrode disposed on the first bank pattern, and electrically connected to a first end of the at least one light emitting element and the first alignment electrode; and
   a second electrode disposed on the second bank pattern, and electrically connected to a second end of the at least one light emitting element and the second alignment electrode, wherein
the first insulating layer comprises an organic layer,
the second insulating layer comprises an inorganic layer,
the second insulating layer is spaced apart from the first and second alignment electrodes in a thickness direction of the substrate, and continuously covers the first bank pattern, the second bank pattern, and a portion of the first insulating layer exposed by the first bank pattern and the second bank pattern.

2. The display device according to claim 1, wherein each of the plurality of pixels comprises:
   an emission area in which the at least one light emitting element is disposed;
   a non-emission area disposed adjacent to the emission area; and
   a bank disposed on the first insulating layer in the non-emission area, and including:
      a first opening corresponding to the emission area;

46 a second opening spaced apart from the first opening; and
      an organic layer.

3. The display device according to claim 2, wherein each of the first and the second bank patterns comprises an organic layer, and
the via layer, the first insulating layer, the first and the second bank patterns, and the bank are connected to each other.

4. The display device according to claim 3, wherein the second insulating layer partially overlap the bank in a plan view.

5. The display device according to claim 3, wherein in the non-emission area, the bank is disposed directly on the first insulating layer.

6. The display device according to claim 5, wherein the second insulating layer corresponds to the first opening of the bank.

7. The display device according to claim 6, wherein an end of the second insulating layer contacts a sidewall of the bank.

8. The display device according to claim 6, wherein in a cross-sectional view,
   a first end of the second insulating layer is disposed between a first sidewall of the bank and the first bank pattern, and
   a second end of the second insulating layer is disposed between a second sidewall of the bank and the second bank pattern.

9. The display device according to claim 3, wherein the second insulating layer does not completely overlap the bank in a plan view.

10. The display device according to claim 9, wherein the first electrode and the second electrode are disposed on different layers.

11. The display device according to claim 10, wherein each of the plurality of pixels comprises:
   a third insulating layer disposed on the at least one light emitting element and exposing the first end and the second end of the at least one light emitting element;
   a fourth insulating layer disposed on the first electrode and comprising an inorganic layer; and
   a fifth insulating layer disposed on overall surfaces of the fourth insulating layer and the second electrode, and comprising an inorganic layer.

12. The display device according to claim 11, wherein each of the plurality of pixels comprises:
   a light conversion pattern disposed on the fifth insulating layer and corresponding to the emission area; and
   a light block pattern disposed on the fifth insulating layer and corresponding to the non-emission area.

13. The display device according to claim 9, wherein the first electrode and the second electrode are disposed on a same layer.

14. The display device according to claim 9, wherein
the first insulating layer includes:
   a first contact hole through which a portion of the first alignment electrode is exposed; and
   a second contact hole through which a portion of the second alignment electrode is exposed,
the first electrode is electrically connected with the first alignment electrode through the first contact hole, and
the second electrode is electrically connected with the second alignment electrode through the second contact hole.

15. The display device according to claim 14, wherein the first and the second contact holes are located in the non-emission area.

16. The display device according to claim 1, wherein each of the plurality of pixels comprises at least one transistor disposed between the substrate and the via layer and electrically connected to the at least one light emitting element.

17. The display device according to claim 1, wherein a ratio of a thickness of the first and the second alignment electrodes and a thickness of the first insulating layer is 1:3 or greater.

18. The display device according to claim 1, wherein each of the first bank pattern and the second bank pattern includes a bottom surface facing the substrate, a top surface opposing the bottom surface so as to face away from the substrate, as a side surface connecting the bottom and top surfaces, and a portion of the second insulation layer is on and above the top surface of at least one of the first bank pattern and the second bank pattern.

19. The display device according to claim 1, wherein a portion of the second insulation layer directly contacts at least one of the first bank pattern and the second bank pattern.

20. An electronic device comprising the display device according to claim 1.

21. A display device comprising:

a plurality of pixels disposed on a substrate, and each including an emission area and a non-emission area, wherein each of the plurality of pixels comprises:

a via layer disposed on the substrate and formed of an organic layer;

first and second alignment electrodes disposed on the via layer and spaced apart from each other, and each having a first thickness;

a first insulating layer disposed on the first and the second alignment electrodes, overlapping the first and the second alignment electrodes in a plan view, formed of an organic layer, and having a second thickness different from the first thickness;

a first bank pattern disposed on the first insulating layer on the first alignment electrode;

a second bank pattern disposed on the first insulating layer on the second alignment electrode;

a bank disposed on the first insulating layer in the non-emission area;

a second insulating layer disposed on and directly contacting the first and the second bank patterns and the first insulating layer, the second insulating layer formed of an inorganic layer; and at least one light emitting element disposed on the second insulating layer in the emission area, wherein the second insulating layer is spaced apart from the first and second alignment electrodes in a thickness direction of the substrate, and continuously covers the first bank pattern, the second bank pattern, and a portion of the first insulating layer exposed by the first bank pattern and the second bank pattern, and a ratio of the first thickness and the second thickness is 1:3 or greater.

* * * * *